(12) United States Patent
Jikutani et al.

(10) Patent No.: US 6,959,025 B2
(45) Date of Patent: Oct. 25, 2005

(54) SURFACE-EMITTING LASER DIODE HAVING REDUCED DEVICE RESISTANCE AND CAPABLE OF PERFORMING HIGH OUTPUT OPERATION, SURFACE-EMITTING LASER DIODE ARRAY, ELECTROPHOTOGRAPHIC SYSTEM, SURFACE-EMITTING LASER DIODE MODULE, OPTICAL TELECOMMUNICATION SYSTEM, OPTICAL INTERCONNECTION SYSTEM USING THE SURFACE-EMITTING LASER DIODE, AND METHOD OF FABRICATING THE SURFACE-EMITTING LASER DIODE

(75) Inventors: Naoto Jikutani, Miyagi (JP); Shunichi Sato, Miyagi (JP); Takashi Takahashi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 343 days.

(21) Appl. No.: 10/368,488

(22) Filed: Feb. 20, 2003

(65) Prior Publication Data

US 2005/0100068 A1 May 12, 2005

(30) Foreign Application Priority Data

Feb. 22, 2002 (JP) .............................. 2002-046373
Aug. 6, 2002 (JP) .............................. 2002-228702
Dec. 25, 2002 (JP) .............................. 2002-373863
Feb. 10, 2003 (JP) .............................. 2003-032758

(51) Int. Cl.$^7$ ................................................ H01S 5/00
(52) U.S. Cl. ............................ 372/46; 372/92; 372/96
(58) Field of Search ........................... 372/46–50, 92, 372/96, 99

(56) References Cited

U.S. PATENT DOCUMENTS

| 5,923,691 A | 7/1999 | Sato |
| 5,939,733 A | 8/1999 | Sato |
| 6,002,700 A | 12/1999 | Sato |
| 6,049,556 A | 4/2000 | Sato |
| 6,072,196 A | 6/2000 | Sato |
| 6,207,973 B1 | 3/2001 | Sato et al. |
| 6,281,518 B1 | 8/2001 | Sato |
| 6,300,650 B1 | 10/2001 | Sato |

(Continued)

OTHER PUBLICATIONS

"Record low-threshold index-guided InGaAs/GaAlAs vertical-cavity surface-emitting laser with a native oxide confinement structure" by Y. Hayashi et al., Electronics Letters, Mar. 30, 1995, vol. 31. No. 7, pp. 560-562.

(Continued)

Primary Examiner—Min Sun Harvey
Assistant Examiner—Delma R. Flores-Ruiz
(74) Attorney, Agent, or Firm—Dickstein Shapiro Morin & Oshinsky LLP

(57) ABSTRACT

A surface-emitting laser diode device that oscillates in a direction perpendicular to the substrate is provided. This surface-emitting laser diode device includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element. In this surface-emitting laser diode, the area of the non-oxide region is smaller than the area of the hole restricting structure.

18 Claims, 23 Drawing Sheets

U.S. PATENT DOCUMENTS

| | | | |
|---|---|---|---|
| 6,348,698 B1 | 2/2002 | Sato | |
| 6,382,800 B2 | 5/2002 | Sato | |
| 6,449,299 B1 | 9/2002 | Sato | |
| 6,452,215 B1 | 9/2002 | Sato | |
| 6,650,683 B2 * | 11/2003 | Ueki et al. | 372/96 |
| 6,678,307 B2 * | 1/2004 | Ezaki et al. | 372/96 |
| 6,816,527 B2 * | 11/2004 | Ueki | 372/46 |

OTHER PUBLICATIONS

"Multiwavelength, Densely-Packed 2×2 Vertical-Cavity Surface-Emitting Laser Array Fabricated Using Selective Oxidation" by D.L. Huffaker et al., IEEE Photonics Technology Letters, vol. 8, No. 7, Jul. 1996, pp. 858-860.

Transverse Mode Control of VCSEL by AlAs Multi Oxide Layers (MOX) Structure by N. Nishiyama et al., 47th Spring Meeting of Japan Society of Applied Physics, Abstract 29-N-2, p. 1150.

AlAs multiple oxidized Layer Structure in GaAs-based VCSEL for High-Speed Modulation by N. Nishityama et al., 60th Annual Meeting of Japan Society of Applied Physics, Abstract 3a-ZE-11, p. 970.

* cited by examiner

ND DEVICE RESISTANCE
AND CAPABLE OF PERFORMING HIGH
OUTPUT OPERATION, SURFACE-EMITTING
LASER DIODE ARRAY,
ELECTROPHOTOGRAPHIC SYSTEM,
SURFACE-EMITTING LASER DIODE
MODULE, OPTICAL
TELECOMMUNICATION SYSTEM,
OPTICAL INTERCONNECTION SYSTEM
USING THE SURFACE-EMITTING LASER
DIODE, AND METHOD OF FABRICATING
THE SURFACE-EMITTING LASER DIODE

CROSS-REFERENCE TO RELATED APPLICATIONS

The present invention is based on Japanese Laid-Open Patent Application Nos. 2002-46373, 2002-373863, 2002-228702, and 2003-32758, filed on Feb. 22, 2002, Dec. 25, 2002, Aug. 6, 2002, and Feb. 10, 2003, respectively, the entire contents of which are hereby incorporated by reference.

BACKGROUND OF THE INVENTION

The present invention relates to a surface-emitting laser diode, a surface-emitting laser diode array, an electrophotographic system, a surface-emitting laser diode module, an optical communication system, an optical interconnection system using the surface-emitting laser diode, and a method of fabricating the surface-emitting laser diode.

A surface-emitting laser (a surface-emitting laser diode) has an active layer that is smaller in volume than that of an edge-emitting laser, and can perform high-speed modulation. For this reason, surface-emitting lasers are attracting more attention as light sources for communication such as Gigabit Ethernet (a trademark name). As a surface-emitting laser can have laser outputs in the direction perpendicular to the substrate, it is easy to form a two-dimensional array with surface-emitting lasers. Also, as such a two-dimensional array consumes less electricity, surface-emitting lasers are also expected to serve as light sources for parallel optical interconnection.

Conventionally, to achieve low threshold current in a surface-emitting laser, a current restricting structure has been employed. This current restricting structure is formed by an oxide of an Al mixed crystal in the following manner. For example, Non-Patent Document 1 discloses a current restricting structure formed by a selective oxidation structure in a device that includes an InGaAs/GaAs quantum well active layer formed through crystal growth by a metal organic chemical vapor deposition (MOCVD) technique, and AlAs/GaAs distributed Bragg reflectors that sandwich the quantum well active layer.

In accordance with this conventional technique, after the crystal growth of the device, etching is cylindrically performed on an area of 20 $\mu$m in diameter on the surfaces of the device and the substrate. Annealing is then performed, at 400° C., in a steam atmosphere that is formed by frothing water, heated at 80° C., with nitrogen gas. By doing so, only the AlAs layers that extend from the side of the cylindrical portion to the center of the mesa are selectively oxidized, so that an AlxOy current restricting structure is formed in the region surrounding the cylindrical portion, with a current passage having a diameter of 5 $\mu$m being maintained at the center of the cylindrical portion. As the AlxOy current restricting structure exhibits high insulation, current can be efficiently restricted to the region that has not been oxidized. With this structure, the device realizes an extremely low threshold value of 70 $\mu$A.

Further, the refractive index of AlxOy is approximately 1.6, which is lower than the refractive index of the other semiconductor layers. Because of this, a transverse-direction refraction difference is caused in the resonator structure, and oscillating light is confined in the center region of the mesa. Accordingly, diffraction loss is reduced, and the device efficiency is increased. However, the amount of confined light increases at the same time. To suppress high-order transverse-mode oscillation, the size of the oxidation confinement structure needs to be small.

In a structure having an oxidation confinement structure formed through selective oxidation performed on the low refraction layer of the distributed Bragg reflectors, the amount of confined light becomes extremely large, as the oxidation confinement structure occupies most of the area of the distributed Bragg reflectors. It is therefore necessary to form a very small oxidation confinement structure, so as to suppress high-order transverse-mode oscillation. However, a very small oxidation confinement structure causes various problems, such as an increase of resistance, as will be described later in detail. For this reason, the low refraction layers of the distributed Bragg reflectors are not oxidized in a conventional surface-emitting laser diode device that employs an oxidation confinement structure. Instead, a single selectively oxidized layer for oxidation confinement is provided in a p-type distributed Bragg reflector, in addition to the low refraction layers of the distributed Bragg reflectors, so that the amount of light confined in the transverse direction is reduced, and that the oxidation confinement structure for suppressing high-order transverse-mode oscillation has a size large enough for practical use. This structure for confining current and confining light in is commonly employed in conventional devices.

A conventional surface-emitting laser diode device that employs a single oxidation confinement structure can achieve single fundamental mode oscillation, with the diameter of the oxidation confinement structure being limited to three to four times as long as the oscillation wavelength, which might vary with wavelength band that is being used though. In this manner, decreases of the oscillation threshold and diffraction loss and single fundamental mode control are realized with an oxidation confinement structure.

As a conventional technique of performing single fundamental transverse-mode control with an oxidation structure with higher efficiency, Non-Patent Document 2 discloses transverse-mode control using an MOX (multiple oxide) structure. In accordance with this conventional technique, a p-type distributed Bragg reflector includes an oxidation structure for confining current (confining holes) and an MOX structure that is formed on the oxidation structure and has two or more oxidation structures having larger oxidation sizes. Here, the two or more oxidation structures having larger oxidation sizes are employed mainly to reduce the parasitic capacitance of the device, but also have an effect of suppressing high-order transverse-mode oscillation.

While the fundamental transverse mode exhibits great electric field amplitude at the center of the mesa, the high-order transverse mode normally exhibits great electric field amplitude in a peripheral region at a distance from the center of the mesa. If a low refraction structure is formed through oxidation in the region surrounding the mesa in this structure, high-order transverse-mode diffraction (leakage) loss is caused, and, as a result, oscillation is suppressed.

Since the fundamental transverse mode exhibits great electric field amplitude at the center of the mesa that is not oxidized, the diffraction loss due to an oxidation structure having a large size is small with the fundamental transverse mode. Accordingly, the oscillation mode can be more efficiently switched to the fundamental transverse mode. In this example, a three-layer oxidation structure is employed, separately from a current restricting structure, to perform single fundamental transverse-mode control with high efficiency.

[Non-Patent Document 1]
Electronics Letters 31 (1995), pp. 560–562

[Non-Patent Document 2]
Collection of Preliminary Lecture Manuscripts for the 47th Associated Lecture Meeting on Applied Physics, p. 29, N-2.

As described above, to achieve single transverse-mode oscillation with a current restricting structure, the size of the oxidation structure needs to be small, and the loss with the high-order mode needs to be increased. By reducing the size of the oxidation confinement structure, the threshold current can be lowered, but the area that contributes to oscillation is reduced. As a result, it becomes difficult to achieve high outputs.

In addition to the above problem, the device resistance increases with the decrease of the area of the conductive region, and high-output oscillation becomes difficult due to output saturation caused by device heat generation. Especially with a p-type semiconductor material, the effective mass of holes is great, and the mobility is low. Even if a buffer layer such as a heterospike buffer layer is inserted in the interface, the resistance of the distributed Bragg reflector is high. Because of these factors, the device resistance greatly increases with a decrease of the size of the oxidation confinement structure.

On the other hand, if a large oxidation confinement structure is formed, the oscillation region becomes broader, and accordingly, relatively high outputs can be obtained. However, such a large oxidation confinement structure cannot effectively suppress high-order transverse-mode oscillation, resulting in frequent occurrence of high-order transverse-mode oscillation.

For the above reasons, single fundamental transverse-mode oscillation cannot be achieved with high outputs. Conventionally, to achieve single fundamental transverse-mode oscillation with a single oxidation confinement structure, each side or the diameter of the oxidation confinement structure needs to be three to four times as long as the oscillation wavelength, which might vary with the wavelength band that is being used. Even with the oxidation confinement structure of such a size, the highest possible output that can be expected is only 2 mW or so.

In many cases where a surface-emitting laser is employed as a light source or a WRITE light source, such as in an electrophotographic system, an optical disk write system, and a long-distance communication using optical fibers, it is strongly desired to obtain single-peaked beams or single fundamental transverse-mode oscillation. In view of this, single fundamental transverse-mode control with a selective oxidation structure having a very small non-oxide region is essential for a surface-emitting laser diode.

As described so far, a conventional surface-emitting laser diode of an oxidation confining type simultaneously performs current restricting and single fundamental transverse-mode control with one selective oxidation structure having a very small non-oxide region. Although such a surface-emitting laser diode can achieve very low threshold current and signal fundamental transverse-mode oscillation, the device resistance is very high. Furthermore, it is difficult to have high outputs, because of the smaller oscillation region and an increase of heat generation due to the higher resistance. As the device resistance is very high, it is also difficult to perform high-speed modulation.

In the structure disclosed in the Non-Patent Document 1, which employs an oxidation confinement structure formed through selective oxidation performed on the low refraction layers of the distributed Bragg reflectors, the amount of confinement is too large, and the size of the oxidation confinement structure needs to be reduced to suppress high-order transverse-mode oscillation. Further, as the oxidation confinement structure that confines holes occupies most of the area of the p-type distributed Bragg reflector, the device resistance becomes very high, and it is very difficult to perform high-output operations.

With the MOX structure disclosed in Non-Patent Document 2, on the other hand, high-order transverse-mode oscillation can be suppressed, and the parasitic capacitance can be reduced. However, since a number of oxidation confinement structures are provided in one p-type Bragg reflector, the device resistance becomes very high. Also, as an oxidation confinement structure of a small size is employed as the hole restricting structure, the device resistance is still very high, and it is difficult to have high outputs.

SUMMARY OF THE INVENTION

Therefore, it is a general object of the present invention to provide a surface-emitting laser diode, a surface-emitting laser diode array that includes the surface-emitting laser diode, an electrophotographic system, a surface-emitting laser diode module, an optical communication system, an optical interconnection system, and a method of fabricating the surface-emitting laser diode in which the above disadvantages are eliminated.

A more specific object of the present invention is to provide a surface-emitting laser diode that has a low device resistance and can perform high-output operations while maintaining single fundamental transverse-mode oscillation with high outputs, a surface-emitting laser diode array that includes the surface-emitting laser diode, an electrophotographic system, a surface-emitting laser diode module, an optical communication system, an optical interconnection system, and a method of fabricating the surface-emitting laser diode.

The above objects of the present invention are achieved by a surface-emitting laser diode device that includes: an active layer; a resonator structure that includes a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region formed in the resonator structure, and an oxide region surrounding the non-oxide region, each region containing Al as a constituent element. In this optical mode control structure, the area of the non-oxide region is smaller than the area of the hole restricting structure. Accordingly, this surface-emitting laser diode device has a low device resistance, and can perform high-output operations, while maintaining single fundamental transverse-mode oscillation. Here, the hole restricting structure typically includes a non-oxide region and an oxide region surrounding the non-oxide region, and each of the regions contains Al as a constituent element. The oxide region and the non-oxide region of each of the hole restricting structure and the optical mode control structure are typically formed by performing selective oxidation on a part of a semiconductor layer that contains Al as a constituent element.

In this surface-emitting laser diode device, each structure that include the oxide region and the non-oxide region formed through selective oxidation performed on a semiconductor layer containing Al as a constituent element is referred to as a selective oxidation structure. Each semiconductor layer that forms such a selective oxidation structure through partial selective oxidation is referred to as a selectively oxidized layer.

Conventionally, a surface-emitting laser diode device has a structure in which one oxidation structure performs both single fundamental transverse-mode control and current restricting. Such an oxidation structure is provided on the hole confining side having a higher carrier restricting efficiency. Between the two types of carriers, holes have lower mobility than electrons. After restriction, holes rarely scatter, and can maintain great confining effects. Also, the diameter or each side of the non-oxide region of the hole restricting structure is only three to five times as long as the oscillation wavelength, so as to suppress high-order transverse-mode oscillation and to achieve single fundamental transverse-mode oscillation. However, as the mobility of holes is low, the confining part of the hole restricting structure is likely to have high resistance. Even if the area of the non-oxide (conductive) region is reduced so as to achieve single fundamental transverse-mode oscillation, the device resistance becomes very high.

In accordance with the present invention, on the other hand, two selective oxidation structures including non-oxide (conductive) regions having different areas from each other are respectively provided in the p-type and n-type semiconductor layers that are located in the hole and electron passages. Furthermore, the area of the non-oxide (conductive) region that is located in the electron passage is smaller than the area of the non-oxide (conductive) region that is located in the hole passage.

The selective oxidation structure having the smaller non-oxide region in the electron passage functions as an optical mode control structure to suppress high-order transverse-mode oscillation, while the selective oxidation structure having the larger non-oxide region in the hole passage functions as a hole restricting structure. In this manner, a hole restricting structure and an optical mode control structure are provided separately from each other, and the optical mode control structure that requires a very small non-oxide region is provided in the electron passage (in an n-type semiconductor) that does not increase resistance. Thus, increases of device resistance are prevented.

To achieve the same objective as the above, the present invention also provides a structure in which two selective oxidation structures including non-oxide regions having different areas from each other are respectively provided in the hole passage (in a p-type semiconductor) and in a region that does not meet the carrier passages (the electron passage and the hole passage). In this structure, the area of the non-oxide region located outside the carrier passages is smaller than the area of the non-oxide region located in the hole passage.

Here, the selective oxidation structure including the smaller non-oxide region located outside the carrier passages serves as an optical mode control structure, while the selective oxidation structure having the larger non-oxide region located in the hole passage serves as a hole restricting structure. In this manner, the hole restricting structure and the optical mode control structure are provided separately from each other, and the optical mode control structure requiring a very small non-oxide region is located in a region that does not meet the carrier passages and does not affect the device resistance. Thus, increases of device resistance can be prevented.

The above and other objects, features, and advantages of the present invention will become more apparent from the following detailed description taken in conjunction with the accompanying drawings.

Figure 1:
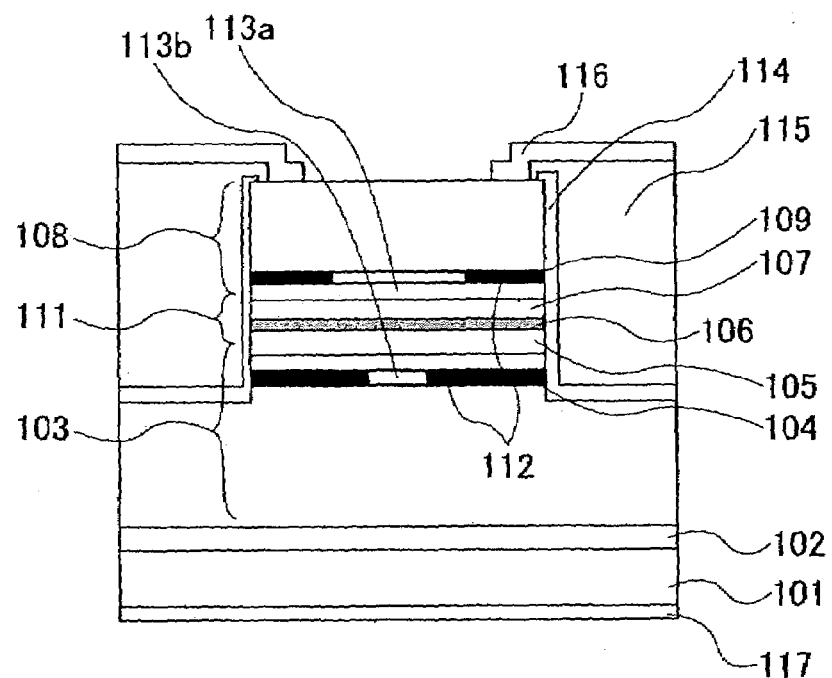
FIG. 1 illustrates the structure of a surface-emitting laser diode of Example 1 of the present invention.

DESCRIPTION OF THE PREFERRED EMBODIMENTS (Principles of the Present Invention)

The following is the summary of the structures and the functions/effects of the present invention.

The first advantageous feature of the present invention is to provide a surface-emitting laser diode device that oscillates in a direction perpendicular to a substrate. This surface-emitting laser diode device includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element. In this surface-emitting laser diode device, the area of the non-oxide region is smaller than the area of the hole restricting structure.

Also, in this surface-emitting laser diode device, the hole restricting structure includes a non-oxide region and an oxide region surrounding the non-oxide region, both regions being formed out of a semiconductor layer containing Al as a constituent element.

Further, in this surface-emitting laser diode device, the hole restricting structure and the optical mode control structure each includes an oxide region and a non-oxide region that are formed through selective oxidation performed on a part of a semiconductor layer, each region containing Al as a constituent element.

Also, in this surface-emitting laser diode device, to prevent increases of the device resistance, a selective oxidation structure (an optical mode control structure) to suppress high-order transverse-mode oscillation is provided separately from the hole restricting structure, and the area of the non-oxide region in the optical mode control structure is smaller than the area of the non-oxide region in the hole restricting structure.

With this structure in which the hole restricting structure and the optical mode control structure are employed separately, it is possible to design each layer optimally and independently. Here, the optical mode control structure is located in such a position that adverse influence on the device resistance can be minimized even if the non-oxide region is very small. In this manner, increases of the device resistance can be prevented.

As the separately provided optical mode control structure suppresses high-order transverse-mode oscillation, the hole restricting structure does not need to suppress the high-order transverse-mode oscillation. Accordingly, the area of the non-oxide region of the hole restricting structure does not need to be so small as to increase the resistance. Thus, a low-resistance device can be obtained. Even if the non-oxide region of the hole restricting structure has a large area, holes can concentrate at the center of the mesa in the active layer region, as holes have great confinement effects. Accordingly, it is possible to prevent non-emitting re-coupling on the side surfaces of the mesa, and to maintain high internal quantum efficiency. Also, the oscillation region can be enlarged, and the outputs can be increased, by increasing the area of the non-oxide region of the hole restricting structure. Further, as heat generation is reduced with the lower resistance, high-output operations can be performed. As the resistance becomes lower, it is also possible to perform high-speed modulation.

The second advantageous feature of the present invention is to provide a surface-emitting laser diode device in which the optical mode control structure is located in the electron passage in the surface-emitting laser diode device.

As described above, holes have lower mobility and greater restriction effects than electrons. However, holes often increase the resistance due to the low mobility and restriction. On the other hand, electrons easily scatter after restriction, and therefore, are not suitable for restriction, though electrons do not increase the device resistance along with the restriction.

Therefore, in the surface-emitting laser diode device having the second advantageous feature of the present invention, the optical mode control structure that is provided separately from the hole restricting structure and has a small non-oxide region is located in the electron passage, so as to prevent increases of resistance.

As the optical mode control structure having a small non-oxide region is located in the electron passage, a rapid increase of the device resistance can be prevented, and high-order transverse-mode oscillation can be effectively suppressed.

The third advantageous feature of the present invention is to provide a surface-emitting laser diode device in which the optical mode control structure is provided in a region that does not meet the electron passage and the hole passage in the surface-emitting laser diode device.

In this surface-emitting laser diode device having the third advantageous feature of the present invention, the optical mode control structure that is formed by a selective oxidation structure having a smaller non-oxide region is located in a region that does not meet the carrier passages (the electron passage and the hole passage).

As the optical mode control structure is located in a region that does not meet the carrier passages, the device resistance does not depend on the area of the non-oxide region of the optical mode control structure. Also, as the optical mode control structure is provided separately from the hole restricting structure, the area of the non-oxide layer of the hole restricting structure does not need to be small. With a non-oxide region that has a larger area than a conventional non-oxide region, increases of the device resistance can be prevented.

In a case where the optical mode control structure is provided in a carrier passage, the device resistance automatically increases with a decrease of the area of the non-oxide region. However, the optical mode control structure that is located outside the carrier passages does not affect the device resistance. Therefore, this structure is suitable especially for a short-wavelength surface-emitting laser to which a very small non-oxide region is essential.

The fourth advantageous feature of the present invention is to provide a surface-emitting laser diode device in which the part of the hole restricting structure that defines the region for confining holes is formed by a p-type semiconductor layer.

In this surface-emitting laser diode device having the fourth advantageous feature of the present invention, the semiconductor layer that is provided in the hole passage and contains Al as a constituent element is a p-type layer. As already mentioned, the resistance in the surface-emitting laser diode having an oxidation confinement structure is mostly the resistance of the non-oxide conductive regions that are the carrier confining parts. To reduce the device resistance, it is essential to reduce the resistance of the non-oxide regions.

The location of the selectively oxidized layer in the hole passage can be in a semiconductor distributed Bragg reflector or a resonator spacer layer. However, a resonance region (or a resonator spacer layer) is normally a non-doped region (layer). If a non-doped selectively oxidized layer is provided in such a resonance region, the resistance becomes very high due to oxidation confinement. Therefore, a p-type layer is used as a selectively oxidized layer that forms the hole restricting structure in the hole passage. With this structure, the resistance can be effectively reduced. Thus, a surface-emitting laser diode with low resistance can be obtained.

The fifth advantageous feature of the present invention is to provide a surface-emitting laser diode device in which the part of the hole restricting structure that defines the region for confining holes is formed by a p-type semiconductor layer, while the non-oxide region in the optical mode control structure is formed by an n-type semiconductor layer.

In this surface-emitting laser diode device having the fifth advantageous feature of the present invention, the semiconductor layer that is provided in the hole passage and contains Al as a constituent element is a p-type layer, and the semiconductor layer that is provided in the electron passage and contains Al as a constituent element is an n-type layer. As already mentioned, the resistance in the surface-emitting laser diode having an oxidation confinement structure is mostly the resistance of the non-oxide conductive regions that are the carrier confining parts. To reduce the device resistance, it is essential to reduce the resistance of the non-oxide regions.

The selectively oxide layers in the electron and hole passages can be in a semiconductor distributed Bragg reflector or a resonator spacer layer. However, a resonance region (or a resonator spacer layer) is normally a non-doped region (layer). If a non-doped selectively oxidized layer is provided in such a resonance region, the resistance becomes very high due to oxidation confinement. Therefore, a p-type layer is used as a selectively oxidized layer that forms the hole restricting structure in the hole passage, and an n-type layer is used as a selectively oxidized layer that forms the optical mode control structure in the electron passage. With this structure, the resistance of the respective carriers can be effectively reduced. Thus, a surface-emitting laser diode with low resistance can be obtained.

The sixth advantageous feature of the present invention is to provide a surface-emitting laser diode device in which the first distributed Bragg reflector and the second distributed Bragg reflector are formed by laminated structures of semiconductor layers.

In this surface-emitting laser diode device having the sixth advantageous feature of the present invention, distributed Bragg reflectors that are made of semiconductor materials are employed. With the distributed Bragg reflectors made of semiconductor materials, all the layers that constitute the device can be formed by a one-time crystal growth process. Also, the layers that require high thickness precision, such as the resonance region and the distributed Bragg reflectors, can be formed with high controllability by the same single apparatus.

Furthermore, it is possible to employ a semiconductor processing technique with high controllability. Thus, highly reliable devices with uniform characteristics can be obtained.

The seventh advantageous feature of the present invention is to provide a surface-emitting laser diode device in which one of the first distributed Bragg reflector and the second distributed Bragg reflector is formed by a laminated structure of semiconductor layers, while the other one is formed by a laminated structure of semiconductor or dielectric layers.

In this surface-emitting laser diode device having the seventh advantageous feature of the present invention, the distributed Bragg reflectors are made of semiconductor and dielectric materials. A dielectric material generally has a lower light absorptivity than a semiconductor material, and a high reflection rate can be obtained with a small number of dielectric layers. Absorption loss causes problems such as increases of the oscillation threshold current and decreases of the slope efficiency and output. As the doping concentration increases in a semiconductor material, absorptivity among free carriers and valence electrons becomes higher, resulting in an increase of light absorption loss. Also, light absorptivity becomes higher with a longer wavelength. Because of these facts, it is difficult to obtain a long-wave device with excellent characteristics. On the other hand, with a distributed Bragg reflector made of a dielectric material, the absorption loss of oscillating light can be reduced, and a device with excellent characteristics can be obtained. More specifically, a surface-emitting laser diode that exhibits excellent characteristics especially in long wavelength bands can be obtained. Accordingly, a surface-emitting laser diode of the present invention has low resistance and can achieve fundamental single transverse-mode oscillation with high outputs. As the resistance is low, it is also possible to perform high-speed modulation. Especially with the seventh advantageous feature of the present invention, a surface-emitting laser diode that is suitable for optical fiber communication can be provided. In short, with the seventh advantageous feature of the present invention, a surface-emitting laser diode device that has low device resistance, low absorptivity, and high operation efficiency, is provided. This surface-emitting laser diode device can perform high-output operations, and achieve fundamental single transverse-mode oscillation even with high outputs.

Here, the distributed Bragg reflector that is formed by dielectric and semiconductor materials may have the low refraction layer and the high refraction layer made of dielectric materials, or dielectric and semiconductor materials. Also, one of the distributed Bragg reflectors that sandwich the active layer may be made only of semiconductor materials.

The eighth advantageous feature of the present invention is to provide a surface-emitting laser diode device in which at least one of the first distributed Bragg reflector and the second distributed Bragg reflector is a semiconductor Bragg reflector having a laminated structure of n-type semiconductor layers, and that a tunnel junction is interposed between the n-type semiconductor Bragg reflector and the active layer.

In this surface-emitting laser diode device having the eighth advantageous feature of the present invention, at least one of the distributed Bragg reflectors is an n-type semiconductor Bragg reflector, and a tunnel junction is provided between the n-type semiconductor Bragg reflector and the active layer. As already mentioned, a semiconductor Bragg reflector tends to have greater absorption loss with doping, and this tendency is greater with a p-type semiconductor Bragg reflector. On the other hand, with low-concentration doping, there is the problem of higher device resistance. Therefore, with a p-type semiconductor Bragg reflector, it is difficult to obtain a device that excels in both optical characteristics (low absorptivity) and electric characteristics. However, a tunnel junction can generate and guide holes into the active region through the p-n junction of thin films that are doped with high concentration and are counter-biased through the tunneling between bands. Accordingly, with a tunnel junction, it is possible to guide electrons and holes into the active region, without a p-type semiconductor Bragg reflector.

With the eighth advantageous feature of the present invention, it is possible to reduce the absorption loss due to the semiconductor Bragg reflectors, and thereby to obtain a surface-emitting laser diode that has low oscillation threshold current, high slope efficiency, and high outputs. Accordingly, the surface-emitting laser diode device having the eighth advantageous feature of the present invention has low resistance, and can achieve fundamental single transverse-mode oscillation with high outputs. As the device resistance is low, it is also possible to perform high-speed modulation. Furthermore, with the eighth advantageous feature of the present invention, it is possible to obtain a surface-emitting laser diode that exhibits excellent characteristics in long wavelength bands in which light absorptivity by semiconductors becomes higher. Accordingly, a surface-emitting laser diode that is suitable especially for communication can be obtained. In short, with the eighth advantageous feature of the present invention, a surface-emitting laser diode device that has low device resistance, low absorptivity, and high operation efficiency, is provided. This surface-emitting laser diode can perform high-output operations, and achieve fundamental single transverse-mode oscillation even with high outputs.

The ninth advantageous feature of the present invention is to provide a surface-emitting laser diode device in which at least one of the first distributed Bragg reflector and the second distributed Bragg reflector includes a laminated structure of non-doped semiconductor layers, and one of the first electrode and the second electrode is provided on a semiconductor layer interposed between the active layer and the distributed Bragg reflector that includes the laminated structure of the non-doped semiconductor layer.

In this surface-emitting laser diode device having the ninth advantageous feature of the present invention, at least one of the distributed Bragg reflectors is a non-doped semiconductor Bragg reflector or a Bragg reflector that includes a region that is partially formed by a non-doped semiconductor Bragg reflector. Furthermore, an electrode for confining carriers is provided on a semiconductor layer between the active layer and the non-doped semiconductor Bragg reflector or the region that is partially formed by a non-doped semiconductor Bragg reflector.

As already mentioned, a semiconductor Bragg reflector tends to have higher light absorptivity with higher-concentration doping. Because of this tendency, a surface-emitting laser diode that employs a p-type semiconductor distributed Bragg reflector does not excel in both optical characteristics (low absorptivity) and electric characteristics. However, a partially non-doped or totally non-doped semiconductor distributed Bragg reflector can be employed in a surface-emitting laser diode of an intra-cavity contact type that has an electrode for confining carriers on a semiconductor layer in the device. With this structure, light absorption by the distributed Bragg reflector in the non-doped region can be reduced.

In an n-type semiconductor, free carrier absorptivity also increases, though slightly, with high-concentration doping, resulting in higher light absorptivity. With a partially or totally non-doped distributed Bragg reflector, regardless of the conductivity type, the absorption loss of oscillation light can be reduced. It is thus possible to obtain a device that has low oscillation threshold current, high slope efficiency, and high outputs. In this manner, the surface-emitting laser diode of the present invention has low resistance, and can achieve fundamental single transverse-mode oscillation even with high outputs. As the device resistance is low, it is also possible to perform high-speed modulation. Furthermore, with the ninth advantageous feature of the present invention, it is possible to obtain a surface-emitting laser diode that exhibits excellent characteristics in long wavelength bands in which the light absorption by semiconductors becomes greater. Therefore, a surface-emitting laser diode that is suitable especially for communication can be obtained. In short, with the ninth advantageous feature of the present invention, a surface-emitting laser diode device that has low device resistance, low absorptivity, and high operation efficiency, can be provided. This surface-emitting laser diode can perform high-output operations, and achieve fundamental single transverse-mode oscillation even with high outputs.

The tenth advantageous feature of the present invention is to provide a surface-emitting laser diode device in which the hole restricting structure is provided at a location corresponding to an antinode of the standing wave of oscillating light in the resonator structure.

In this surface-emitting laser diode device having the tenth advantageous feature of the present invention, the selective oxidation structure (the hole restricting structure) including an oxide insulating region and a non-oxide conductive region formed through selective oxidation performed on a selectively oxidized semiconductor layer that is provided in the hole passage and contains Al as a constituent element is provided at a location corresponding to an antinode of the standing wave of oscillating light.

Conventionally, the size of the oxidation confinement structure is so small as to suppress high-order transverse-mode light that has high electric field intensity in the region surrounding the mesa. However, this also causes loss in the fundamental transverse-mode light. In a conventional device that reduces the threshold and suppresses the high-order transverse-mode light with a single oxidation confinement structure, an oxidation confinement structure is normally provided at a location corresponding to a joint of the standing wave that has low electric field intensity, so as to maintain the diffraction loss of oscillating light at a low level.

In a device of the present invention, on the other hand, the suppressing of the high-order transverse-mode light is performed mainly by an oxidation confinement structure located in the electron passage. Therefore, the oxidation confinement structure located in the hole passage should be only as large as to restrict the hole confinement region to the center of the mesa without a rapid increase of the device resistance. Accordingly, it is possible to have a larger area for confinement than a conventional one, and to reduce loss in the fundamental transverse-mode light. Further, with the oxidation confinement structure provided at a location corresponding to an antinode of the standing wave, the high-order transverse-mode light that has high electric field intensity in the region surrounding the mesa can be suppressed. Thus, high-order mode oscillation can be effectively suppressed. In this manner, a surface-emitting laser diode that has low device resistance and can achieve single transverse-mode oscillation with high outputs can be obtained. In short, with the tenth advantageous feature of the present invention, it is possible to provide a surface-emitting laser diode that has low device resistance, and can perform high-output operations and achieve single fundamental transverse-mode oscillation even with higher outputs.

The eleventh advantageous feature of the present invention is to provide a surface-emitting laser diode device in which two or more optical mode control structures are provided in the electron passage.

The eleventh advantageous feature of the present invention is also to provide a surface-emitting laser diode device in which two or more optical mode control structures are provided in a region that does not meet the electron passage and the hole passage.

In this surface-emitting laser diode device having the eleventh advantageous feature of the present invention, two or more selective oxidation structures (optical mode control structures) having relatively small non-oxide regions are provided in the electron passage or in a region that does not meet the electron passage and the hole passage. With the two or more oxide layers, the effect of suppressing high-order transverse-mode oscillation can be made greater. If a multi-layer structure is employed as a selective oxidation structure having a small non-oxide region in a conventional device, the device resistance increases rapidly. In the present invention, however, a multi-layer structure does not increase the resistance, because the optical mode control structures are provided in the electron passage (an n-type semiconductor layer) having low electric resistance. Accordingly, single fundamental transverse-mode selectivity can be increased, without a rapid increase of the resistance. In short, with the eleventh advantageous feature of the present invention, it is possible to provide a surface-emitting laser diode device that has low device resistance, and can perform high-output operations and achieve single fundamental transverse-mode oscillation even with higher outputs.

The twelfth advantageous feature of the present invention is to provide a surface-emitting laser diode device in which the semiconductor layer that forms the optical mode control structure through selective oxidation and contains Al as a constituent element is thicker than the semiconductor layer that forms the hole restricting structure through selective oxidation and contains Al as a constituent element.

In this surface-emitting laser diode device having the twelfth advantageous feature of the present invention, the selectively oxidized layer formed by the semiconductor layer that forms the smaller non-oxide region through selective oxidation and contains Al as a constituent element is thicker than the selectively oxidized layer formed by the semiconductor layer that forms the larger non-oxide region through selective oxidation and contains Al as a constituent element.

A semiconductor mixed crystal such as an AlGaAs mixed crystal containing Al in its composition can be oxidized in a heated steam atmosphere. In doing so, the oxidation speed depends on the Al composition and the thickness of the semiconductor layer containing Al in its composition. Oxidation progresses more rapidly, if the semiconductor layer has a greater Al content and a greater thickness. Between two semiconductor layers having the same compositions, it is possible to control the sizes of the oxidation confinement structures by adjusting the thicknesses of the selectively oxidized layers to be grown. In this manner, oxidation confinement structures having different sizes can be obtained through a one-time oxidation process. As the thicknesses of the semiconductor layers containing Al in the compositions are adjusted in this manner, a surface-emitting laser diode that has low device resistance and can achieve single transverse-mode oscillation with high outputs can be easily obtained. In short, with the twelfth advantageous feature of the present invention, a surface-emitting laser diode that has low device resistance, and can perform high-output operations and achieve single fundamental transverse-mode oscillation with high outputs, can be easily obtained with high controllability.

The thirteenth advantageous feature of the present invention is to provide a surface-emitting laser diode device in which the Al content of the semiconductor layer that forms the optical mode control structure through selective oxidation and contains Al as a constituent element is greater than the Al content of the semiconductor layer that forms the hole restricting structure through selective oxidation and contains Al as a constituent element.

In this surface-emitting laser diode device having the thirteenth advantageous feature of the present invention, the Al content of the selectively oxidized layer formed by the semiconductor layer that forms the smaller non-oxide region through selective oxidation and contains Al in its composition is greater than the Al content of the selectively oxidized layer formed by the semiconductor layer that forms the larger non-oxide region through selective oxidation and contains Al in its composition.

A semiconductor mixed crystal such as an AlGaAs mixed crystal containing Al in its composition can be oxidized in a heated steam atmosphere. In doing so, the oxidation speed depends on the Al composition and the thickness of the semiconductor layer containing Al in its composition. Oxidation progresses more rapidly, if the semiconductor layer has a greater Al content and a greater thickness. In a case of an AlGaAs mixed crystal, oxidation can progress with an Al content ratio of 0.9 or so.

Accordingly, it is possible to control the sizes of the oxidation confinement structures by adjusting the Al content ratios. In this manner, oxidation confinement structures having different sizes can be obtained in one device through a one-time oxidation process. As the Al contents of the semiconductor layers containing Al as a constituent element are adjusted in this manner, a surface-emitting laser diode that has low device resistance and can achieve single transverse-mode oscillation with high outputs can be easily obtained. In short, with the thirteenth advantageous feature of the present invention, a surface-emitting laser diode that has low device resistance, and can perform high-output operations and achieve single fundamental transverse-mode oscillation with high outputs, can be easily obtained with high controllability.

The fourteenth advantageous feature of the present invention is to provide a surface-emitting laser diode device in which the active layer is formed by a III–V semiconductor material that includes at least one III-group element selected from the group of Al, Ga, and In, and at least one V-group element selected from the group of As and P. Here, the active layer has an oscillation wavelength shorter than 1.1 $\mu$m.

In this surface-emitting laser diode device having the fourteenth advantageous feature of the present invention, the III–V semiconductor material that forms the active layer contains at least one III-group element selected from the group of Al, Ga, and In, and at least one V-group element selected from the group of As and P. With this structure, the oscillation wavelength becomes shorter than 1.1 $\mu$m, and therefore it is possible to obtain a surface-emitting laser diode that exhibits low device resistance in short-wave band areas, and can perform high-output operations and achieve single fundamental transverse-mode oscillation with high outputs. To perform single fundamental transverse-mode control in a surface-emitting laser diode having an oscillation wavelength shorter than 1.1 $\mu$m, each side of the non-oxide region needs to be 5 $\mu$m or shorter, which results in a rapid increase of the device resistance. In accordance with the fourteenth advantageous feature of the present invention, however, the device resistance can be very effectively reduced.

This can be achieved with high efficiency especially with a visible-band surface-emitting laser. For example, with an AlGaInP-based material used as the active layer, a red surface-emitting laser diode having an oscillation wavelength band of 660 nm can be obtained. To achieve single fundamental transverse-mode oscillation in such a surface-emitting laser diode, each side of the smaller non-oxide region needs to be 3 $\mu$m or shorter, which results in a rapid increase of the resistance due to confinement.

In the device of the present invention, however, the high-order transverse-mode suppressing layer that requires a very small non-oxide region is provided in the electron passage (in an n-type semiconductor) that does not increase the resistance, or in a region that does not meet the carrier passages and does not affect the resistance. With this structure, single fundamental transverse-mode control can be performed, without a rapid increase of the device resistance.

In this manner, a surface-emitting laser diode that has an oscillation wavelength shorter than 1.1 $\mu$m can have low device resistance and perform high-output operations, while maintaining single fundamental transverse-mode oscillation.

The fifteenth advantageous feature of the present invention is to provide a surface-emitting laser diode device in which the active layer is formed by a III–V semiconductor material that includes at least one III-group element selected from the group of Ga and In, and at least one V-group element selected from the group of As, P, N, and Sb. Here, the active layer has an oscillation wavelength longer than 1.1 $\mu$m.

In this surface-emitting laser diode device having the fifteenth advantageous feature of the present invention, the III–V semiconductor material that forms the active layer contains at least one III-group element selected from the group of Ga and In, and at least one V-group element selected from the group of As, P, N, and Sb. With this structure, the oscillation wavelength becomes longer than 1.1 $\mu$m, and therefore it is possible to obtain a surface-emitting laser diode that exhibits low device resistance in long-wave band areas, and can perform high-output operations and achieve single fundamental transverse-mode oscillation with high outputs. A surface-emitting laser diode having an oscillation wavelength longer than 1.1 $\mu$m is essential as a light source for communication using quartz fibers. Particularly, a 1.3 $\mu$m band is a band in which quartz fibers are minutely scattered, and therefore, long-distance, high-speed communication can be performed. Also, a 1.5 $\mu$m band is essential as a multi-wave communication band area.

As the device of the present invention has low device resistance, high-speed modulation can be performed. The device of the present invention is very suitable as a light source used in high-speed modulation. As the device of the present invention can also have high outputs while maintaining single fundamental transverse-mode oscillation, long-distance communication can be performed with high efficiency especially in a 1.3 $\mu$m band. Thus, a surface-emitting laser diode that is suitable as a light source for optical communication can be obtained.

In this manner, with the fifteenth advantageous feature of the present invention, a surface-emitting laser diode having an oscillation wavelength of 1.1 $\mu$m to 1.6 $\mu$m can be obtained on a GaAs substrate. On a GaAs substrate, it is possible to employ a distributed Bragg reflector made of an AlGaAs mixed crystal with excellent characteristics, and to thereby obtain a device with excellent characteristics. Furthermore, a GaInNAs material in which a very small amount of nitrogen is added to GaInAs by several percents has a great conductive band discontinuity with respect to a GaAs barrier layer or the like, and exhibits better temperature characteristics than a conventional device of the same wavelength band formed on an InP substrate. While a surface-emitting laser diode device having any of the first through eleventh features of the present invention has low device resistance and can achieve single transverse-mode oscillation with high outputs, a surface-emitting laser diode device having the fifteenth advantageous feature of the present invention can further have a constantly high connecting rate with optical fibers or the likes. Thus, a surface-emitting laser diode that is suitable for optical fiber communication can be obtained.

The sixteenth advantageous feature of the present invention is to provide a surface-emitting laser diode array that is monolithically formed on a substrate. Each of the devices that form this surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

In this surface-emitting laser diode array having the sixteenth advantageous feature of the present invention is formed by surface-emitting laser diodes having one of the first through fifteenth advantageous features of the present invention. As a result, a surface-emitting laser diode array that has low device resistance, and can perform high-output operations and achieve single fundamental transverse-mode oscillation with high outputs, can be provided. In accordance with the sixteenth advantageous feature of the present invention, a monolithic laser diode array is formed by surface-emitting laser diodes having any of the first through fifteenth advantageous features of the present invention. It is thus possible to provide a surface-emitting laser diode array that has low device resistance and can achieve fundamental transverse-mode oscillation even with high outputs. This surface-emitting laser diode array is suitable as a light source in a multi-beam write system in an electrophotographic system or in a long-distance optical communication system.

The seventeenth advantageous feature of the present invention is to provide a surface-emitting laser diode array that is monolithically formed on a substrate. Each of the devices that form this surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure. Here, the areas of the non-oxide regions of the optical mode control structures are different from one another among the devices that form the surface-emitting laser diode array. Also, oscillation wavelengths are different from one another among the devices.

This surface-emitting laser diode array having the seventeenth advantageous feature of the present invention is formed by surface-emitting laser diodes of two or more types among the surface-emitting laser diodes having the first through fifteenth advantageous features. These surface-emitting laser diodes have different oscillation wavelengths resulted from the non-oxide regions of the optical mode control structures having different areas. It is thus possible to provide a multi-wave surface-emitting laser diode array that has low device resistance, can perform high-output operation and achieve single fundamental mode oscillation with high outputs, and exhibits uniform device characteristics within the array.

In this multi-wave surface-emitting laser diode array having the seventeenth advantageous feature of the present invention, the in-plane oscillation wavelengths in the array are varied with the area differences among the non-oxide regions of the optical mode control structures of the surface-emitting laser diodes. In each surface-emitting laser diode of the present invention, the hole confinign structure and the optical mode control structure are provided separately from each other. Furthermore, the optical mode control structure is provided in an n-type semiconductor layer that does not increase the resistance, or in a region outside the passages of carriers (electrons and holes) that does not affect the electric resistance. Accordingly, a decrease of the area of the non-oxide region in the optical mode control structure does not increase the resistance as much as in a conventional device or does not increase the resistance at all in the case of the optical mode control structure being provided in a region outside the carrier passages.

As the influence of heat generation due to an increase of resistance can be suppressed, it is possible to have high outputs, while maintaining fundamental transverse-mode oscillation, with a device having an optical mode control structure including a small non-oxide region. Also, optical outputs can be made uniform among devices. Further, the areas of the non-oxide regions of the hole restricting structures are made uniform, so that the characteristics such as oscillation threshold current and operation voltage can be made uniform among the devices. In this manner, a multi-wave surface-emitting laser diode array that exhibits uniform characteristics and can perform high-output operations can be obtained.

Since the influence of device heat generation (an increase of the device resistance) can be reduced, it is possible to produce devices having very small non-oxide regions that have conventionally resulted in insufficient characteristics. It is thus possible to produce devices having shorter oscillation wavelengths. With these devices, a multi-wave surface-emitting laser diode array that has a broader band area can be obtained.

The eighteenth advantageous feature of the present invention is to provide a surface-emitting laser diode array in which each of the devices that form the surface-emitting laser diode array includes two or more optical mode control structures.

In this multi-wave surface-emitting laser diode array having the eighteenth advantageous feature of the present invention, the number of layers of optical mode control structures is two or greater in the same structure as the multi-wave surface-emitting laser diode array having the seventeenth advantageous feature of the present invention.

A change of the oscillation wavelength (resonance wavelength) with a decrease of the area of the non-oxide region is caused by a change of the transverse-mode extent with an increase of the area of the oxide region. By reducing the transverse-mode extent, a greater wavelength change can be obtained. In accordance with the eighteenth advantageous feature, two or more optical mode control structures are employed, so as to increase the transverse-mode light confining effect. Thus, a multi-wave surface-emitting laser diode array that has a broader band area can be obtained.

Furthermore, in accordance with the eighteenth advantageous feature of the present invention, each of the surface-emitting laser diodes that form the surface-emitting laser diode array having the seventeenth advantageous feature includes two or more layers of optical mode control structures. Accordingly, it is possible to provide a multi-wave surface-emitting laser diode array that has low device resistance, can perform high-output operations and achieve single fundamental mode oscillation with high outputs, and exhibits uniform device characteristics within the array.

Like the functions and effects in accordance with the seventeenth advantageous feature of the present invention, it is possible to obtain a multi-wave surface-emitting laser diode array that has low device resistance, can perform high-output operations, and exhibits uniform characteristics among the surface-emitting laser diodes that form the array, with the eighteenth advantageous feature of the present invention.

The nineteenth advantageous feature of the present invention is to provide a surface-emitting laser diode module that includes an optical fiber and a surface-emitting laser diode device that is optically connected to the optical fiber. In this surface-emitting laser diode module, the surface-emitting laser diode device includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

The nineteenth advantageous feature of the present invention is also to provide a surface-emitting laser diode array module that includes a plurality of optical fibers and a surface-emitting laser diode array that is optically connected to each of the optical fibers. In this surface-emitting laser diode array module, the surface-emitting laser diode array being monolithically formed on a substrate, and each device of the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

In short, the nineteenth advantageous feature of the present invention is to provide a surface-emitting laser diode module that employs a surface-emitting laser diode having one of the first through fifteenth advantageous features or a surface-emitting laser diode array having the sixteenth advantageous feature. The surface-emitting laser diode module of the present invention is highly reliable, because the surface-emitting laser diode employed therein has low device resistance, and can perform high-output operations and achieve single fundamental transverse-mode oscillation even with high outputs. A surface-emitting laser diode or a surface-emitting laser diode array of the present invention has a high connecting rate with optical fibers, because of the high-output fundamental transverse-mode oscillation. Also, since high-order transverse-mode oscillation is suppressed, it is unlikely that the optical input to fibers varies with a change of the connecting rate, even if there is a change in the device operation conditions such as output conditions. Thus, a highly reliable surface-emitting laser diode module can be provided.

The twentieth advantageous feature of the present invention is to provide an electrophotographic apparatus that includes a light source, an optical scan system that deflects optical beams emitted from the optical source, and a photosensor on which optical write is performed with the optical beams deflected by the optical scan system. In this electrophotographic apparatus, the light source includes a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

The twentieth advantageous feature of the present invention is also to provide an electrophotographic apparatus-that includes a light source, an optical scan system that deflects optical beams emitted from the optical source, and a photosensor on which optical write is performed with the optical beams deflected by the optical scan system. In this electrophotographic apparatus, the light source includes a surface-emitting laser diode array that is monolithically formed on a substrate. Each of the devices that form the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

In short, the twentieth advantageous feature of the present invention is to provide an electrophotographic system that employs, as a WRITE light source, a surface-emitting laser diode having one of the first through fifteenth advantageous features or a surface-emitting laser diode array having the sixteenth advantageous feature. With the surface-emitting laser diode that has low device resistance and can perform high-output operations and achieve single fundamental transverse-mode oscillation even with high outputs, a high-definition full-color electrophotographic system can be provided. Although a conventional surface-emitting laser diode has low outputs and is not suitable as a WRITE light source in an electrophotographic system, a surface-emitting laser diode or a surface-emitting laser diode array of the present invention can achieve fundamental transverse-mode oscillation with high outputs, and accordingly, is suitable as a WRITE light source in an electrophotographic system. With a surface-emitting laser diode employed as a WRITE light source in an electrophotographic system, it is easy to perform beam shaping, as the outgoing beams each has a circular section. Further, as the positioning accuracy is high in the array, a single lens can easily concentrate beams with high reproducibility. Accordingly, the optical system can be simplified, and a high-definition full-color system can be produced at low costs. Also, as a surface-emitting laser diode of the present invention has high outputs, high-speed write can be performed with a surface-emitting laser diode array of the present invention. Thus, a high-definition full-color electrophotographic system can be provided at low costs.

The twenty-first advantageous feature of the present invention is to provide an optical interconnection system that includes a light source, a light receiving element, and an optical fiber that optically connects the light source and the light receiving element. In this optical interconnection system, the light source includes a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

The twenty-first advantageous feature of the present invention is also to provide an optical interconnection system that includes a light source, a light receiving element, and an optical fiber that optically connects the light source and the light receiving element. In this optical interconnection system, the light source includes a surface-emitting laser diode array that is monolithically formed on a substrate. Each of the devices that form the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

The twenty-first advantageous feature of the present invention is also to provide an optical interconnection system that includes a light source, a light receiving element, and an optical fiber that optically connects the light source and the light receiving element. In this optical interconnection system, the light source includes a surface-emitting laser diode array that is monolithically formed on a substrate. Each of the devices that form the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure. Here, the areas of the non-oxide regions of the optical mode control structures are different from one another among the devices that form the surface-emitting laser diode array, and oscillation wavelengths are also different from one another among the devices.

In short, the twenty-first advantageous feature of the present invention is to provide an optical interconnection system that employs a surface-emitting laser diode having one of the first through fifteenth advantageous features or a surface-emitting laser diode array having the sixteenth or seventeenth advantageous feature. As a surface-emitting laser diode of the present invention has low device resistance and can perform high-output operations while maintaining single fundamental transverse-mode oscillation, it is possible to provide a highly reliable optical interconnection system. A surface-emitting laser diode or a surface-emitting laser diode array of the present invention has a high connecting rate with optical fibers, because of the high-output fundamental transverse-mode oscillation. Also, since high-order transverse-mode oscillation is suppressed, it is unlikely that the optical input to fibers varies with a change of the connecting rate, even if there is a change in the device operation conditions such as output conditions. Thus, a highly reliable optical interconnection system can be provided.

The twenty-second advantageous feature of the present invention is to provide an optical communication system that includes a light source unit, a light receiving unit, and an optical fiber that optically connects the light source unit and the light receiving unit. In this optical communication system, the light source unit includes a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

The twenty-second advantageous feature of the present invention is also to provide an optical communication system that includes a light source unit, a light receiving unit, and an optical fiber that optically connects the light source unit and the light receiving unit. In this optical communication system, the light source unit includes a surface-emitting laser diode array that is monolithically formed on a substrate. Each of the devices that form the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure.

In short, the twenty-second advantageous feature of the present invention is to provide an optical communication system that employs a surface-emitting laser diode having one of the first through fifteenth advantageous features or a surface-emitting laser diode array having the sixteenth advantageous feature. As a surface-emitting laser diode of the present invention has low device resistance and can perform high-output operations while maintaining single fundamental transverse-mode oscillation, it is possible to provide a highly reliable optical communication system. A surface-emitting laser diode or a surface-emitting laser diode array of the present invention has a high connecting rate with optical fibers, because of the high-output fundamental transverse-mode oscillation. Also, since high-order transverse-mode oscillation is suppressed, it is unlikely that the optical input to fibers varies with a change of the connecting rate, even if there is a change in the device operation conditions such as output conditions. Furthermore, long-distance communication can be performed, as higher outputs can be achieved with a surface-emitting laser diode or a surface-emitting laser diode array of the present invention. Thus, a highly reliable optical communication system can be provided.

The twenty-third advantageous feature of the present invention is to provide an optical communication system that includes a light source unit, a light receiving unit, and an optical fiber that optically connects the light source unit and the light receiving unit. In this optical communication system, the light source unit includes a surface-emitting laser diode array that is monolithically formed on a substrate. Each of the devices that form the surface-emitting laser diode array includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and defines a region for confining holes to the active layer; and an optical mode control structure that includes a non-oxide region provided in the resonator structure and an oxide region surrounding the non-oxide region, each region containing Al as a constituent element, and the area of the non-oxide region being smaller than the area of the hole restricting structure. Here, the areas of the non-oxide regions of the optical mode control structures are different from one another among the devices that form the surface-emitting laser diode array, and oscillation wavelengths are also different from one another among the devices.

In accordance with the twenty-third advantageous feature of the present invention, a highly reliable multi-wave optical communication system in which devices can be easily driven can be provided. This optical communication system employs a surface-emitting laser diode array that has low device resistance, can perform high-output operations in multi-wave bands, can achieve single fundamental transverse-mode oscillation with high output, and exhibits uniform device characteristics among the devices in the array.

In short, the optical communication system in accordance with the twenty-third advantageous feature of the present invention employs, as a light source, a multi-wave surface-emitting laser diode array in accordance with the seventeenth or eighteenth advantageous feature. In such a multi-wave surface-emitting laser diode array, the surface-emitting laser diodes in the array exhibits uniform characteristics, and accordingly, high outputs can be achieved. As the multi-wave surface-emitting laser diode array in accordance with the seventeenth or eighteenth advantageous feature exhibits uniform characteristics among the surface-emitting laser diodes in the array, high operation reliability can be achieved. Also, as the drive circuit is simple with such a surface-emitting laser diode array, the production costs can be lowered. Further, as the device resistance is lower than a conventional device, high-speed modulation can be performed.

The surface-emitting laser diode array in accordance with the seventeenth or eighteenth advantageous feature is suitable especially as a light source in a wavelength division multiplexing communication system, as the wavelengths of the surface-emitting laser diodes in the array are different from one another. In wavelength division multiplexing communication, optical signals of different wavelengths are transmitted through a single fiber, so as to realize high-speed large-capacity communication.

In view of the above facts, an optical communication system that employs a multi-wave surface-emitting laser diode array of the present invention is highly reliable and can perform high-speed communication.

The twenty-fourth advantageous feature of the present invention is to provide a method of fabricating a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and includes a non-oxide region that defines a region for confining holes to the active layer, and an oxide region surrounding the non-oxide region, each region containing Al as a constituent element; and an optical mode control structure that includes a non-oxide region provided in the resonator structure and an oxide region surrounding the non-oxide region, each region containing Al as a constituent element, and the area of the non-oxide region being smaller than the area of the hole restricting structure. This method includes the steps of: forming the hole restricting structure including the oxide region and the non-oxide region by selectively oxidizing a semiconductor layer that contains Al as a constituent element; and forming the optical mode control structure including the oxide region and the non-oxide region by selectively oxidizing a semiconductor layer that contains Al as a constituent element. In this method, the step of forming the hole restricting structure and the step of forming the optical mode control structure are performed simultaneously, and the thickness of the semiconductor layer that is to form the hole restricting structure and contains Al as a constituent element is different from the thickness of the semiconductor layer that is to form the optical mode control structure and contains Al as a constituent element.

In accordance with the twenty-fourth advantageous feature of the present invention, a hole restricting structure and an optical mode control structure including non-oxide regions having different areas are formed out of a selectively oxidized semiconductor layer having a first thickness and a selectively oxidized semiconductor layer having a second thickness, respectively, in a method of fabricating a surface-emitting laser diode having one of the first through eleventh advantageous features.

By this method, a surface-emitting laser diode that has low device resistance and can perform high-output operations while maintaining single fundamental transverse-mode oscillation can be easily produced with high controllability. In a surface-emitting laser diode produced in accordance with the twenty-fourth advantageous feature of the present invention, selective oxidation structures including non-oxide regions having different areas can be formed in the device through a one-time oxidation process, by virtue of the difference in the oxidation speed caused by the thickness difference between the semiconductor mixed crystals each containing Al.

Accordingly, a surface-emitting laser diode of the present invention can be produced, without any special step added to the conventional production procedures. Thus, a high-performance device that can achieve single transverse-mode oscillation with high outputs can be produced at the same costs as the conventional production costs.

The twenty-fifth advantageous feature of the present invention is to provide a method of fabricating a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and includes a non-oxide region that defines a region for confining holes to the active layer, and an oxide region surrounding the non-oxide region, each region containing Al as a constituent element; and an optical mode control structure that includes a non-oxide region provided in the resonator structure and an oxide region surrounding the non-oxide region, each region containing Al as a constituent element, and the area of the non-oxide region being smaller than the area of the hole restricting structure. This method includes the steps of: forming the hole restricting structure including the oxide region and the non-oxide region by selectively oxidizing a semiconductor layer that contains Al as a constituent element; and forming the optical mode control structure including the oxide region and the non-oxide region by selectively oxidizing a semiconductor layer that contains Al as a constituent element. In this method, the step of forming the hole restricting structure and the step of forming the optical mode control structure are performed simultaneously, and the Al composition of the semiconductor layer that is to form the hole restricting structure and contains Al as a constituent element is different from the Al composition of the semiconductor layer that is to form the optical mode control structure and contains Al as a constituent element.

In accordance with the twenty-fifth advantageous feature of the present invention, a hole restricting structure and a high-order transverse-mode suppressing layer including non-oxide regions having different areas are formed out of a selectively oxidized semiconductor layer having a first Al composition and a selectively oxidized semiconductor layer having a second Al composition, respectively, in a method of fabricating a surface-emitting laser diode having one of the first through eleventh advantageous features. By this method, a surface-emitting laser diode that has low device resistance and can perform high-output operations while maintaining single fundamental transverse-mode oscillation can be easily produced with high controllability. In a surface-emitting laser diode produced in accordance with the twenty-fifth advantageous feature of the present invention, oxidation confinement structures of different sizes can be formed in the device through a one-time oxidation process, by virtue of the difference in the oxidation speed caused by the Al composition difference between the semiconductor mixed crystals each containing Al.

Accordingly, a surface-emitting laser diode of the present invention can be produced, without any special step added to the conventional production procedures. Thus, a high-performance device that can achieve single transverse-mode oscillation with high outputs can be produced at the same costs as the conventional production costs.

The twenty-sixth advantageous feature of the present invention is to provide a method of fabricating a surface-emitting laser diode device that includes: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and includes a non-oxide region that defines a region for confining holes to the active layer, and an oxide region surrounding the non-oxide region, each region containing Al as a constituent element; and an optical mode control structure that includes a non-oxide region provided in the resonator structure and an oxide region surrounding the non-oxide region, each region containing Al as a constituent element, and the area of the non-oxide region being smaller than the area of the hole restricting structure. This method includes the steps of: forming a first mesa that includes a semiconductor layer that contains Al as a constituent element and is to form, through selective oxidation, the hole restricting structure including the oxide region and the non-oxide region; forming a second mesa that includes a semiconductor layer that contains Al as a constituent element and is to form, through selective oxidation, the optical mode control structure including the oxide region and the non-oxide region; forming the hole restricting structure including the oxide region and the non-oxide region by selectively oxidizing the semiconductor layer that contains Al as a constituent element; and forming the optical mode control structure including the oxide region and the non-oxide region by selectively oxidizing the semiconductor layer that contains Al as a constituent element. In this method, the step of forming the hole restricting structure and the step of forming the optical mode control structure are performed simultaneously, and the size of the first mesa is different from the size of the second mesa.

In accordance with the twenty-sixth advantageous feature of the present invention, a hole restricting layer and an optical mode control structure including non-oxide regions having different areas are formed by a first mesa that has a first mesa size and includes a high-order transverse-mode suppressing layer, and a second mesa that has a second mesa size, different from the first mesa size, and includes a hole restricting structure, respectively, in a method of fabricating a surface-emitting laser diode having one of the first through eleventh advantageous features. By this method, a surface-emitting laser diode that has low device resistance and can perform high-output operations while maintaining single fundamental transverse-mode oscillation can be easily produced with high controllability at low costs.

In the method in accordance with the twenty-sixth advantageous feature of the present invention, the size of the mesa that includes the optical mode control structure differs from the size of the mesa that includes the hole restricting structure. More specifically, the size of the mesa that includes the hole restricting structure is made greater than the size of the mesa that includes the optical mode control structure, so that the non-oxide region of the hole restricting structure has a larger area than the non-oxide region of the optical mode control structure after oxidation of the selectively oxidized layers at the same oxidation rates.

Accordingly, a surface-emitting laser diode of the present invention can be produced, without any special step added to the conventional production procedures. Thus, a high-performance device that can achieve single transverse-mode oscillation with high outputs can be produced at the same costs as the conventional production costs. This method in accordance with the twenty-sixth advantageous feature of the present invention is suitable especially for fabricating a surface-emitting laser diode of an intra-cavity contact type.

The twenty-seventh advantageous feature of the present invention is to provide a method of fabricating a surface-emitting laser diode array that is formed with devices each including: an active layer; a resonator structure including a first distributed Bragg reflector and a second distributed Bragg reflector that face each other and sandwich the active layer; a hole passage that extends from a first electrode to the active layer; an electron passage that extends from a second electrode to the active layer; a hole restricting structure that is located in the hole passage and includes a non-oxide region that defines a region for confining holes to the active layer, and an oxide region surrounding the non-oxide region, each region containing Al as a constituent element; and an optical mode control structure that includes a non-oxide region provided in the resonator structure and an oxide region surrounding the non-oxide region, each region containing Al as a constituent element, the area of the non-oxide region being smaller than the area of the hole restricting structure, the areas of the non-oxide regions of the optical mode control structures being different from one another among the devices that form the surface-emitting laser diode array, and oscillation wavelengths being also different from one another among the devices. This method includes the steps of: forming a first mesa that includes a semiconductor layer that contains Al as a constituent element and is to form, through selective oxidation, the hole restricting structure including the oxide region and the non-oxide region; forming a second mesa that includes a semiconductor layer that contains Al as a constituent element and is to form, through selective oxidation, the optical mode control structure including the oxide region and the non-oxide region; forming the hole restricting structure including the oxide region and the non-oxide region by selectively oxidizing the semiconductor layer that contains Al as a constituent element; and forming the optical mode control structure including the oxide region and the non-oxide region by selectively oxidizing the semiconductor layer that contains Al as a constituent element. In this method, the step of forming the hole restricting structure and the step of forming the optical mode control structure are performed simultaneously, and the sizes of the second mesas are different from one another among the devices that have different wavelengths from one another.

In accordance with the twenty-seventh advantageous feature of the present invention, the sizes of the mesas each including an optical mode control structure are varied so as to form non-oxide regions having different areas in a method of fabricating a multi-wave surface laser diode array having the seventeenth advantageous feature. Thus, a surface-emitting laser diode array that has low device resistance, can perform high-output operations while maintaining single fundamental mode oscillation, and exhibits uniform device characteristics, can be easily produced with high controllability at low costs.

In short, in the method in accordance with the twenty-seventh advantageous feature of the present invention, the sizes of the mesas each including an optical mode control structure are varied in a multi-wave surface-emitting laser diode array having the seventeenth advantageous feature.

As the in-plane oxidation speeds of the optical mode control structures are uniform, the sizes of the non-oxide regions each remaining at the center of each corresponding mesa can be varied by varying the sizes of the mesas. Also, in the method in accordance with the twenty-seventh feature of the present invention, surface-emitting laser diodes including non-oxide regions having different areas can be produced by a one-time oxidation process. Thus, a multi-wave surface-emitting laser diode array of the present invention can be easily produced at the same costs as the conventional production costs.

The following is a description of embodiments of the present invention.

(First Embodiment)

A first embodiment of the present invention is a surface-emitting laser diode device that includes an active layer, a pair of distributed Bragg reflectors between which the active layer is interposed, a hole passage that extends from a first electrode to the active layer, and an electron passage that extends from a second electrode to the active layer.

This surface-emitting laser diode device is characterized by including: a hole restricting structure that includes a non-oxide region and an oxide region formed by selectively oxidizing a semiconductor layer (selectively oxidized layer) containing Al as a constituent element in the hole passage, and defines the region for confining holes to the active layer: and an optical mode control structure that includes a non-oxide region and an oxide region formed by selectively oxidizing a semiconductor layer (selectively oxidized layer) containing Al as a constituent element. In this surface-emitting laser diode device, the non-oxide region of the optical mode control structure has a smaller area than the non-oxide region (the hole restricting area) of the hole restricting structure.

With this structure, it is possible to perform hole restriction and single fundamental transverse-mode control, which are conventionally performed by a single selective oxidation structure, with different selective oxidation structures. Thus, an optimum structure can be achieved for the hole restriction and the single fundamental transverse-mode control. In this device, the hole restricting structure does not need to suppress the high-order transverse mode, and can have a large-area non-oxide region to prevent a rapid increase of the device resistance. Also, since the restricting rate of holes is high, the area of the non-oxide region of the hole restricting structure can be made large. Thus, the holes can be restricted to the center of the mesa in the active layer region, and a high internal quantum efficiency can be achieved.

Also, the optical mode control structure that is provided as well as the hole restricting structure and has the selective oxidation structure including a relatively small-area non-oxide region is optimally designed, being provided in a region having less influence on the resistance. This surface-emitting laser diode device thus can effectively suppress high-order transverse-mode oscillation, without a rapid increase of the device resistance.

(Second Embodiment)

A second embodiment of the present invention is a surface-emitting laser diode having the same structure as the surface-emitting laser diode of the first embodiment, except that the surface-emitting laser diode of this embodiment has the optical mode control structure in the electron passage. The optical mode control structure has a non-oxide region smaller than the area of the non-oxide region of the hole restricting structure.

With this structure of the second embodiment, the optical mode control structure that is located in the electron passage and is formed by a selective oxidation structure including the smaller non-oxide region can effectively suppress high-order transverse-mode oscillation, without a rapid increase of device resistance.

Also, the hole restricting structure that is located in the hole passage and is formed by the selective oxidation structure including the larger non-oxide region can restrict holes to the center of the mesa in the active layer region and achieve a high internal quantum efficiency, without a rapid increase of device resistance.

(Third Embodiment)

A third embodiment of the present invention is a surface-emitting laser diode having the same structure as the surface-emitting laser diode of the first embodiment, except that the surface-emitting laser diode of this embodiment has the optical mode control structure in a region that does not meet both the electron passage and the hole passage. The optical mode control structure has a non-oxide region that is smaller than the area of the non-oxide region in the hole restricting structure.

With this structure of the third embodiment, the optical mode control structure that is provided in a region that does not meet the electron and hole passages and is formed by a selective oxidation structure including the smaller non-oxide region can effectively suppress high-order transverse-mode oscillation, without a rapid increase of device resistance.

Also, the hole restricting structure that is located in the hole passage and is formed by the selective oxidation structure including the larger non-oxide region can restrict holes to the center of the mesa in the active layer region and achieve a high internal quantum efficiency, without a rapid increase of device resistance.

(Fourth Embodiment)

A fourth embodiment of the present invention is a surface-emitting laser diode having the same structure as the surface-emitting laser diode of the third embodiment, except that the semiconductor layer (a selectively oxidized layer) that contains Al as a constituent element and forms the hole restricting structure through selective oxidation is a p-type layer. The hole restricting structure is located in the hole passage.

Like the structure of the third embodiment, the location of the hole restricting structure in the hole passage can be in a semiconductor distributed Bragg reflector or a resonator spacer layer. However, a resonance region (or a resonator spacer layer) is normally a non-doped region (layer). If a non-doped selectively oxidized layer is provided in such a resonance region, the resistance becomes very high due to oxidation restriction. Therefore, a p-type layer is used as a selectively oxidized layer that forms the hole restricting structure in the hole passage. With this structure, holes in the active layer region can be restricted to the center of the mesa, and a high internal quantum efficiency can be achieved.

Also, the optical mode control structure that is provided in a region outside the electron passage and the hole passage and is formed by the selective oxidation structure including the smaller non-oxidized area can effectively suppress high-order transverse-mode oscillation, without an increase of device resistance.

(Fifth Embodiment)

A fifth embodiment of the present invention is a surface-emitting laser diode having the same structure as the surface-emitting laser diode of the second embodiment, except that the semiconductor layer (a selectively oxidized layer) that forms the hole restricting structure in the hole passage through selective oxidation and contains Al as a constituent element is a p-type layer, and that the semiconductor layer (a selectively oxidized layer) that forms the optical mode control structure in the electron passage through selective oxidation is an n-type layer.

The locations of the hole restricting structure and the optical mode control structure can be in a semiconductor distributed Bragg reflector or a resonator spacer layer. However, a resonance region (or a resonator spacer layer) is normally a non-doped region (layer). If a non-doped selectively oxidized layer is provided in such a resonance region, the resistance becomes very high due to oxidation restriction. Therefore, a p-type layer is used as a selectively oxidized layer that forms the hole restricting structure in the hole passage, and an n-type layer is used as a selectively oxidized layer that forms the optical mode control structure in the electron passage. With this structure, the resistance of the respective carriers can be effectively reduced.

In the structure of the fifth embodiment, the selective oxidation structure that is provided in the hole passage and has the larger non-oxide region can restrict holes to the center of the mesa in the active region, and achieve a high internal quantum efficiency, while maintaining the device resistance very low.

Also, the optical mode control structure that is provided in the electron passage and is formed by the selective oxidation structure including the smaller non-oxidized area can effectively suppress high-order transverse-mode oscillation, while maintaining the device resistance very low.

(Sixth Embodiment)

A sixth embodiment of the present invention is a surface-emitting laser diode that has the same structure as one of the surface-emitting laser diodes of the first through fifth embodiments, except that the pair of distributed Bragg reflectors is made of semiconductor materials.

With this structure of the sixth embodiment, any of the devices of the first through fifth embodiments can be obtained through a one-time crystal growth process with high precision. Furthermore, each device can be manufactured through a semiconductor process with high controllability, at a high yield rate.

(Seventh Embodiment)

A seventh embodiment of the present invention is a surface-emitting laser diode that has the same structure as one of the surface-emitting laser diodes of the first through fifth embodiments, except that one of the distributed Bragg reflectors is made of a semiconductor material while the other one is made of a dielectric material.

With this structure of the seventh embodiment that employs a dielectric reflector with a small absorption loss, a highly efficient surface-emitting laser diode can be obtained.

(Eighth Embodiment)

An eighth embodiment of the present invention is a surface-emitting laser diode that has the same structure as one of the surface-emitting laser diodes of the first through seventh embodiments, except that at least one of the distributed Bragg reflectors is a n-type semiconductor distributed Bragg reflector, and that a tunnel junction is provided between the n-type semiconductor distributed Bragg reflector and the active layer.

With this structure of the eighth embodiment that employs an n-type semiconductor distributed Bragg reflector with a small absorption loss, instead of a p-type semiconductor distributed Bragg reflector, a highly efficient surface-emitting laser diode can be obtained.

(Ninth Embodiment)

A ninth embodiment of the present invention is a surface-emitting laser diode that has the same structure as one of the surface-emitting laser diodes of the first through eighth embodiments, except that at least one of the distributed Bragg reflectors is a non-doped semiconductor distributed Bragg reflector or a Bragg reflector partially including a region formed by a non-doped semiconductor distributed Bragg reflector, and that an electrode for confining carriers is provided on a semiconductor layer between the active layer and the non-doped semiconductor distributed Bragg reflector or the region formed by a non-doped semiconductor Bragg reflector.

With this structure of the ninth embodiment that employs a non-doped semiconductor distributed Bragg reflector with a small absorption loss, a highly efficient surface-emitting laser diode can be obtained.

(Tenth Embodiment)

A tenth embodiment of the present invention is a surface-emitting laser diode having the same structure as one of the surface-emitting laser diodes of the first through ninth embodiments, except that the hole restricting structure in the hole passage is provided at a location corresponding to an antinode of the standing wave of oscillating light.

With this structure of the tenth embodiment, the optical mode control structure formed by the selective oxidation structure provided at a location corresponding to an antinode of the standing wave of oscillating light can retrain high-order transverse-mode oscillation with greater effect.

(Eleventh Embodiment)

An eleventh embodiment of the present invention is a surface-emitting laser diode having the same structure as one of the surface-emitting laser diodes of the first through tenth embodiments, except that two or more optical mode control structures are provided in the electron passage or in a region that does not meet the electron and hole passages.

With this structure of the eleventh embodiment, the optical mode control structures that are provided in the electron passage or in a region outside the electron and hole passages and are formed by selective oxidation structures each having a smaller non-oxide region can retrain high-order transverse-mode oscillation with greater effect.

(Twelfth Embodiment)

A twelfth embodiment of the present invention is a surface-emitting laser diode having the same structure as one of the surface-emitting laser diodes of the first through eleventh embodiments, except that the semiconductor layer (a selectively oxidized layer) that contains Al as a constituent element and forms the optical mode control structure through selective oxidation in the electron passage or in a region outside the electron and hole passages is thicker than the semiconductor layer (a selectively oxidized layer) that contains Al as a constituent element and forms the hole restricting structure through selective oxidation in the hole passage.

This structure of the twelfth embodiment readily realizes a surface-emitting laser diode of the present invention with high controllability.

(Thirteenth Embodiment)

A thirteenth embodiment of the present invention is a surface-emitting laser diode having the same structure as one of the surface-emitting laser diodes of the first through eleventh embodiments, except that the Al content of the semiconductor layer (a selectively oxidized layer) that contains Al as a constituent element and forms the optical mode control structure through selective oxidation in the electron passage or in a region outside the electron and hole passages is greater than the Al content of the semiconductor layer (a selectively oxidized layer) that contains Al as a constituent element and forms the hole restricting structure through selective oxidation in the hole passage.

This structure of the thirteenth embodiment readily realizes a surface-emitting laser diode of the present invention with high controllability.

(Fourteenth Embodiment)

A fourteenth embodiment of the present invention is a surface-emitting laser diode having the same structure as one of the surface-emitting laser diodes of the first through eleventh embodiments, except that the active layer contains at least one III-group element selected from the group of Al, Ga, and In, and at least one V-group element selected from the group of As and P, and that the oscillation wavelength is shorter than 1.1 $\mu$m.

This structure of the fourteenth embodiment realizes a device that has the oscillation wavelength in a short-wave band area and can effectively achieve single fundamental transverse-mode oscillation with high outputs.

(Fifteenth Embodiment)

A fifteenth embodiment of the present invention is a surface-emitting laser diode having the same structure as one of the surface-emitting laser diodes of the first through eleventh embodiments, except that the active layer contains at least one III-group element selected from the group of Ga and In, and at least one V-group element selected from the group of As, P, N, and Sb, and that the oscillation wavelength is longer than 1.1 $\mu$m.

This structure of the fifteenth embodiment realizes a device that has the oscillation wavelength in a long-wave band area and exhibits high efficiency.

The device of the fifteenth embodiment has excellent temperature characteristics, and is suitable for a light source in optical communication.

(Sixteenth Embodiment)

A sixteenth embodiment of the present invention is a surface-emitting laser diode array that is formed by surface-emitting laser diodes of one of the first through fifteenth embodiments of the present invention.

As the surface-emitting laser diode array of the sixteenth embodiment is formed by surface-emitting laser diodes of one of the first through fifteenth embodiments, the resistance can remain very low. Thus, a surface-emitting laser diode array that can achieve single fundamental transverse-mode oscillation while having high outputs can be provided.

(Seventeenth Embodiment)

A seventeenth embodiment of the present invention is a surface-emitting laser diode array having the same structure as the surface-emitting laser diode array of the sixteenth embodiment, except that two or more types of surface-emitting laser diodes are employed. The surface-emitting laser diodes that form the surface-emitting laser diode array of this embodiment have different oscillation wavelengths, as the areas of the non-oxide regions of the optical mode control structures are different from one another among the surface-emitting laser diodes.

It is known that the resonance wavelength of the resonator varies with the area of the non-oxide region of the selective oxidation structure in an oxidation-restricting surface-emitting laser diode. Accordingly, the oscillation wavelength (the resonance wavelength) becomes shorter, as the area of a non-oxide region becomes smaller. The reason that a change of the wavelength is caused by a change of the area of the non-oxide region is that, since the oxide region has a confining effect on the transverse-mode oscillation, the transverse-mode extent changes with a change of the area of the non-oxide region, and the resonance conditions of the resonator in the vertical direction change.

For instance, a change of the oscillation wavelength (resonance wavelength) to a shorter wavelength with respect to the area of the non-oxide region of each device in a 0.98 $\mu$m band was estimated by a numerical calculation in "IEEE Journal of Selected Topics in Quantum Electronics Vol. 3, No. 2, page 344, 1997" and "IEEE Journal of Quantum Electronics Vol. 34, No. 10, p. 1890, 1998". The results in these references show that the oscillation wavelength started shifting to a shorter wavelength when the diameter of the non-oxide region was 5 $\mu$m, and the shifting became rapid when the diameter of the non-oxide region was 2 $\mu$m or shorter.

Also, "IEEE Photonics Technology Letter Vol. 8, No. 7, p. 858, 1996" reports a case in which devices including non-oxide regions having different areas were produced to actually form a 2×2 surface-emitting laser diode array having 1 nm wavelength intervals in a 0.98 $\mu$m. The smallest size of the restricting region here was 2.0 $\mu$m, and the largest size was 3.5 $\mu$m.

However, with conventional surface-emitting laser diodes each performing hole restriction and high-order transverse-mode control with one selective oxidation structure, there is a problem that the threshold current and optical outputs greatly vary within the array, due to the varied sizes of the oxidation confinement structures. Furthermore, a decrease of the size of an oxidation confinement structure drastically increases the resistance in the restricting region, and accordingly, it becomes difficult to have high outputs due to heat generation. Actually, the above document discloses that even the device with the largest oxidation restriction structure of 3.5 $\mu$m had the highest optical output of only 0.38 mW due to heat generation of the device. It can be considered that the devices with the smaller oxidation confinement structures had even lower optical outputs due to heat generation caused by increases of resistance. In view of these facts, conventional devices cannot form a multi-wave surface-emitting laser diode array that performs high-output operations.

Also, to obtain a multi-wave surface-emitting laser diode array that has a broader band area, it is necessary to form even smaller non-oxide regions. If the diameter of a non-oxide region is 1 $\mu$m or shorter in practice, light loss caused by the selective oxidation structure should be very large. Therefore, it should be considered that a diameter of 1 $\mu$m is the smallest possible size for non-oxide regions that can be actually used. If the non-oxide regions of conventional devices are made as small as this, the heat generation (the device resistance) rapidly increases, and it becomes very difficult to achieve oscillation.

On the other hand, a multi-wave surface-emitting laser diode array that employs surface-emitting laser diodes of the present invention can easily solve the above problems. First of all, a hole restricting structure and an optical mode control structure are provided separately from each other in each surface-emitting laser diode of the present invention. Furthermore, the optical mode control structure is provided in an n-type semiconductor layer that rarely increases the resistance, or in a region that does not meet the carrier (electron and hole) passages and does not affect the electric resistance. Accordingly, a resistance increase caused by a decrease of the area of the non-oxide region of the optical mode control structure is smaller than in a conventional device. In the case of the optical mode control structure located outside the carrier passages, there are no resistance increases at all. With this structure, heat generation due to a resistance increase can have only a very limited influence. Accordingly, devices that include optical mode control structures having small non-oxide regions can achieve fundamental transverse-mode oscillation with high outputs. Also, optical outputs can be made uniform among devices. Further, the non-oxide regions of the hole restricting structures of the devices in the array have the same areas, so that the device characteristics such as the oscillation threshold current and the operation voltage can be made uniform in the array.

As described above, the surface-emitting laser diode array of the seventeenth embodiment functions as a multi-wave surface-emitting laser diode array that exhibits uniform device characteristics and can perform high-output operations.

(Eighteenth Embodiment)

An eighteenth embodiment of the present invention is a surface-emitting laser diode array having the same structure as the surface-emitting laser diode array of the seventeenth embodiment, except that each of the surface-emitting laser diodes that form the surface-emitting laser diode array includes two or more optical mode control structures.

With the two or more optical mode control structures, the transverse-mode light confining effect is increased. Thus, oscillation wavelengths (resonance wavelengths) can be more effectively made shorter.

(Nineteenth Embodiment)

A nineteenth embodiment of the present invention is a surface-emitting laser diode module in which the surface-emitting laser diode of one of the first through fifteenth embodiments or the surface-emitting laser diode array of the sixteenth embodiment is employed.

With the surface-emitting laser diode of one of the first through fifteenth embodiments or the surface-emitting laser diode array of the sixteenth embodiment, single fundamental transverse-mode oscillation can be steadily obtained with high outputs. Accordingly, the connection rate with the fibers of the surface-emitting laser diode module, in which the surface-emitting laser diode of one of the first through fifteenth embodiments or the surface-emitting laser diode array of the sixteenth embodiment is employed, rarely fluctuates. Thus, a highly reliable surface-emitting laser diode array module can be obtained.

(Twentieth Embodiment)

A twentieth embodiment of the present invention is an electrophotographic system in which the surface-emitting laser diode of one of the first-through fifteenth embodiments or the surface-emitting laser diode array is employed.

With the surface-emitting laser diode of one of the first through fifteenth embodiments or the surface-emitting laser diode array of the sixteenth embodiment, single fundamental transverse-mode oscillation can be steadily obtained with high outputs. As outgoing beams have circular shapes and exhibit high positioning precision in the array, a single lens can easily concentrate beams with high reproducibility. Accordingly, the optical system can be simplified, and an electrophotographic system can be provided at low costs. Also, as the array can achieve high outputs with the single transverse mode, high-speed write can be performed. Thus, a high-speed electrophotographic system can be provided.

(Twenty-First Embodiment)

A twenty-first embodiment of the present invention is an optical interconnection system in which the surface-emitting laser diode of one of the first through fifteenth embodiments or the surface-emitting laser diode array of the sixteenth embodiment is employed.

With the surface-emitting laser diode of one of the first through fifteenth embodiments or the surface-emitting laser diode array of the sixteenth embodiment, single fundamental transverse-mode oscillation can be steadily obtained with high outputs. Also, the connection with optical fibers is tight, and the transverse-mode oscillation wavelength rarely fluctuates with any change in the device operation conditions. Thus, a highly reliable optical interconnection system can be provided.

(Twenty-Second Embodiment)

A twenty-second embodiment of the present invention is an optical communication system in which the surface-emitting laser diode of one of the first through fifteenth embodiments or the surface-emitting laser diode array of the sixteenth embodiment is employed.

With the surface-emitting laser diode of one of the first through fifteenth embodiments or the surface-emitting laser diode array of the sixteenth embodiment, single fundamental transverse-mode oscillation can be steadily obtained with high outputs. Also, the connection with optical fibers is tight, and the transverse-mode oscillation wavelength rarely fluctuates with any change in the device operation conditions. Thus, a highly reliable optical communication system can be provided. Furthermore, it is possible to achieve high outputs in the fundamental transverse mode. Thus, an optical communication system that performs long-distance communications can be provided.

(Twenty-Third Embodiment)

A twenty-third embodiment of the present invention is an optical communication system in which the surface-emitting laser diode array of the seventeenth or eighteenth embodiment.

In the surface-emitting laser diode array of the seventeenth or eighteenth embodiment, the surface-emitting laser diodes have uniform characteristics. Accordingly, drive control can be easily performed on the surface-emitting laser diode array. With the multi-wave surface-emitting laser diode array that can perform high-output operations in the single fundamental transverse mode, a highly reliable optical communication system can be provided at low costs.

(Twenty-Fourth Embodiment)

A twenty-fourth embodiment of the present invention is a method of fabricating the surface-emitting laser diode of any of the first through eleventh embodiments. This method is characterized by the steps of forming a hole restricting structure out of a selectively oxidized semiconductor layer having a first thickness, and forming an optical mode control structure out of a selectively oxidized semiconductor layer having a second thickness that is different from the first thickness. The non-oxide regions of the hole restricting structure and the optical mode control structure have different areas from each other.

By this method of the twenty-fourth embodiment, the surface-emitting laser diode of any of the first through eleventh embodiments can be easily obtained with high controllability and high yields.

(Twenty-Fifth Embodiment)

A twenty-fifth embodiment of the present invention is a method of fabricating the surface-emitting laser diode of any of the first through eleventh embodiments. This method is characterized by the steps of forming a hole restricting structure out of a selectively oxidized semiconductor layer having a first Al composition, and forming an optical mode control structure out of a selectively oxidized semiconductor layer having a second Al composition that is different from the first Al composition. The non-oxide regions of the hole restricting structure and the optical mode control structure have different areas from each other.

By this method of the twenty-fifth embodiment, the surface-emitting laser diode of any of the first through eleventh embodiments can be easily obtained with high controllability and high yields.

(Twenty-Sixth Embodiment)

A twenty-sixth embodiment of the present invention is a method of fabricating the surface-emitting laser diode of any of the first through eleventh embodiments. This method is characterized by the steps of forming a first mesa that has a first mesa size and includes an optical mode control structure, and forming a second mesa that has a second mesa size, different from the first mesa size, and includes a hole restricting structure. The areas of the non-oxide regions of the hole restricting structure and the optical mode control structure are different from each other.

By this method of the twenty-sixth embodiment, the surface-emitting laser diode of any of the first through eleventh embodiments can be easily obtained with high controllability and high yields.

(Twenty-Seventh Embodiment)

A twenty-seventh embodiment of the present invention is a method of fabricating the surface-emitting laser diode array of the seventeenth or eighteenth embodiment. This method is characterized by the step of forming mesas that include high-order transverse-mode control layers and have different mesa sizes among the surface-emitting laser diodes in the surface-emitting laser diode array. With the mesa size variation, non-oxide regions having different areas are formed.

By this method of the twenty-seventh embodiment, the multi-wave surface-emitting laser diode array of the seventeenth or eighteenth embodiment can be easily provided with high controllability and high yields, without an increase in the number of production procedures.

EXAMPLES

The following is a description of specific examples of the present invention, with reference to the accompanying drawings.

Example 1

FIG. 1 illustrates a surface-emitting laser diode of Example 1 of the present invention.

The surface-emitting laser diode shown in FIG. 1 is a 0.85 μm surface-emitting laser diode having a GaAs/$Al_{0.15}Ga_{0.85}As$ multi-quantum well structure as an active layer. The structure of this surface-emitting laser diode will be described below, in conjunction with the fabrication procedures.

The surface-emitting laser diode shown in FIG. 1 does crystal growth by a metal organic chemical vapor deposition (MOCVD) technique. In this surface-emitting laser diode, trimethylaluminum (TMA), trimethylgallium (TMG), trimethylindium (TMI), are utilized as III-group raw materials. As a V-group raw material, an arsine ($AsH_3$) gas is used. Further, $CBr_4$ is employed as a p-type dopant, and $H_2Se$ is employed as an n-type dopant.

More specifically, the device shown in FIG. 1 includes an n-GaAs substrate 101, an n-GaAs buffer layer 102, a 36-period n-$Al_{0.9}Ga_{0.1}As/Al_{0.15}Ga_{0.85}As$ lower semiconductor distributed Bragg reflector 103 having the n-$Al_{0.9}Ga_{0.1}As/Al_{0.15}Ga_{0.85}As$ as one period, a non-dope $Al_{0.15}Ga_{0.85}As$ resonator spacer 105, a GaAs/$Al_{0.15}Ga_{0.85}As$ multi-quantum well active layer 106, a non-dope $Al_{0.15}Ga_{0.85}As$ resonator spacer 107, and a 20-period p-$Al_{0.9}Ga_{0.1}As/Al_{0.15}Ga_{0.85}As$ upper semiconductor distributed Bragg reflector 108. These layers are formed through crystal growth in this order, with the substrate 101 being at the bottom. Further, a contact layer (not shown) having a high-density p-type dopant (carbon) near the surface is provided in the $Al_{0.15}Ga_{0.85}As$ layer that is the outermost surface layer of the upper semiconductor distribution plug reflector 108.

The n-$Al_{0.9}Ga_{0.1}As/Al_{0.15}Ga_{0.85}As$ lower semiconductor distributed Bragg reflector 103 and the p-$Al_{0.9}Ga_{0.1}As/Al_{0.15}Ga_{0.85}As$ upper semiconductor distributed Bragg reflector 108 are provided with an n-AlAs selectively oxidized layer 104 and a p-AlAs selectively oxidized layer 109, respectively. The selectively oxidized layers 104 and 109 each includes an oxidized area 112 (shown in black in FIG. 1, the same applying to the following examples) that is selectively oxidized and a non-oxide area 113a/113b that is not oxidized.

Figure 2:
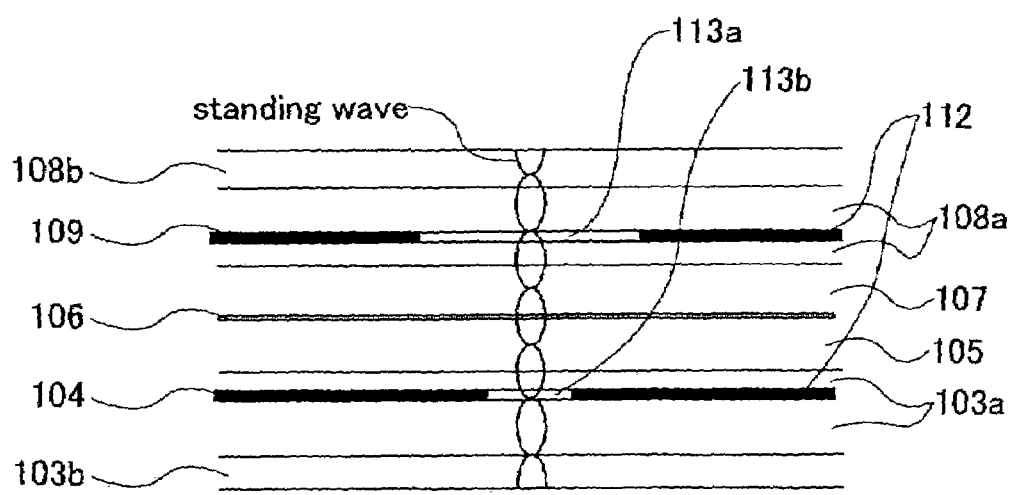
FIG. 2 illustrates the resonance region (the region of the resonator) of the surface-emitting laser diode of FIG. 1, in conjunction with the standing wave of oscillating light.

Here, an n-$Al_{0.9}Ga_{0.1}As$ layer 103a that is the low refraction layer of the lower semiconductor distributed Bragg reflector 103, a p-$Al_{0.9}Ga_{0.1}As$ layer 108a that is the low refraction layer of the upper semiconductor distributed Bragg reflector 108, an n-$Al_{0.15}Ga_{0.85}As$ layer 103b that is the high refraction layer of the lower semiconductor distributed Bragg reflector 103, and a p-$Al_{0.15}Ga_{0.85}As$ layer 108b that is the high refraction layer of the upper semiconductor distributed Bragg reflector 108, each has such a film thickness that the phase change of the oscillating light in each semiconductor layer becomes π/2, which satisfies the phase conditions for multiple reflection of the distributed Bragg reflectors (each of the layers is shown in FIG. 2). More specifically, the $Al_{0.9}Ga_{0.1}As$ layers 103a and 108a are each 69.8 nm thick, and the $Al_{0.15}Ga_{0.85}As$ layers 103b and 108b are each 59.7 nm thick.

FIG. 2 illustrates the resonance region (the resonator region) of the surface-emitting-laser diode of FIG. 1, in conjunction with the standing wave of the oscillating light. Hereinafter, the resonance region is defined as the region interposed between the Bragg reflectors. In the device of Example 1, the region denoted by reference numeral 111 is the resonance region.

FIG. 2 shows the resonance region 111, the structure of one period of the n-$Al_{0.9}Ga_{0.1}As/Al_{0.15}Ga_{0.85}As$ lower semiconductor distributed Bragg reflector 103 consisting of the n-$Al_{0.9}Ga_{0.1}As$ lower semiconductor distributed Bragg reflector low refraction layer 103a and the n-$Al_{0.15}Ga_{0.85}As$ lower semiconductor distributed Bragg reflector high refraction layer 103b, and the structure of one period of the p-$Al_{0.9}Ga_{0.1}As/Al_{0.15}Ga_{0.85}As$ upper semiconductor distributed Bragg reflector 108 consisting of the p-$Al_{0.9}Ga_{0.1}As$ upper semiconductor distributed Bragg reflector low refraction layer 108a and the p-$Al_{0.15}Ga_{0.85}As$ upper semiconductor distributed Bragg reflector high refraction layer 108b.

In the surface-emitting laser diode of FIG. 1, the n-AlAs selectively oxidized layer 104 and the p-AlAs selectively oxidized layer 109 are provided in the n-$Al_{0.9}Ga_{0.1}As$ lower semiconductor distributed Bragg reflector low refraction layer 103a and the p-$Al_{0.9}Ga_{0.1}As$ upper semiconductor distributed Bragg reflector low refraction layer 108a, respectively, which are in contact with the resonance region, as shown in FIG. 2. Here, the n-AlAs selectively oxidized layer 104 is 30 nm thick, and the p-AlAs selectively oxidized layer 109 is 20 nm. On the other hand, the n-$Al_{0.9}Ga_{0.1}As$ lower semiconductor distributed Bragg reflector low refraction layer 103a and the p-$Al_{0.9}Ga_{0.1}As$ upper semiconductor distributed Bragg reflector low refraction layer 108a that are provided with the AlAs selectively oxidized layers 104 and 109 each has such a thickness that the phase change of the oscillating light in each of the regions including the AlAs layer becomes 3π/2.

The non-doped $Al_{0.15}Ga_{0.85}As$ resonator spacer layer 105, the GaAs/$Al_{0.15}Ga_{0.85}As$ multi-quantum well active layer 106, the non-doped $Al_{0.15}Ga_{0.85}As$ resonator spacer layer 107, are adjusted in such a manner that the phase change of the oscillating light in the resonator region to be created becomes equal to 2π, and thus a 1-λ resonator structure is formed.

To achieve a high stimulated emission rate, the GaAs/$Al_{0.15}Ga_{0.85}As$ multi-quantum well active layer 106 is located at an antinode of the standing wave of the oscillating light. On the other hand, to reduce the light diffraction loss, the n-AlAs selectively oxidized layer 104 and the p-AlAs selectively oxidized layer 109 are provided at the joints of the standing wave of the oscillating light. In the device shown in FIG. 1, the n-AlAs selectively oxidized layer 104 and the AlAs selectively oxidized layer 109 are each situated at the second joint counted from the active layer 106, as shown in FIG. 2.

After the crystal growth, a 30 μm square resist pattern is formed in the surface-emitting laser diode of FIG. 1 by a known photoengraving technique. Etching removal is then performed on each layer between the surface of the p-$Al_{0.9}Ga_{0.1}As/Al_{0.15}Ga_{0.85}As$ upper semiconductor distributed Bragg reflector 108 and the middle of the n-$Al_{0.9}Ga_{0.1}As/Al_{0.15}Ga_{0.85}As$ lower distributed semiconductor Bragg reflector 103 by a known dry etching technique, and thereby a square mesa is formed.

Next, selective oxidation in the direction parallel to the substrate is performed on the n-AlAs selectively oxidized layer 104 and the p-AlAs selectively oxidized layer 109 by a one-time oxidation process that acts in the direction from the etching end surface to the center of the mesa in a heated atmosphere containing steam. By doing so, the selective oxide region 112 is formed around the mesa, while the non-oxide regions 113a and 113b are left at the center.

At this point, the oxidation rates of the n-AlAs selectively oxidized layer 104 and the p-AlAs selectively oxidized layer 109 differ with the thicknesses of the respective selective oxide layers 104 and 109. In general, the relatively thicker n-AlAs selectively oxidized layer 104 has a higher oxidation rate. Accordingly, the non-oxide region 113b is designed to have a smaller area than the non-oxide region 113a. Here, each side of the non-oxide region 113b is 3 μm long, while each side of the non-oxide region 113a is 10 μm long. Thus, the area of the non-oxidized (conductive) region 113b in the electron passage is relatively smaller than the area of the non-oxidized (conductive) region 113a in the hole passage. The selective oxidation structure that includes the relatively small non-oxide region 113b serves as an optical mode control structure.

A $SiO_2$ insulating layer 114 is formed on the entire surface of the wafer by a chemical vapor deposition (CVD) technique. After that, spin-coating with insulating resin 115 is performed in alignment with the center of the mesa, so that the insulating resin on the mesa is removed. The $SiO_2$ insulating layer 114 is then removed from the region from which the insulating resin has been removed. A 10 μm square resist pattern is next formed in the light emitting region on the mesa, and deposition is carried out. The electrode material is removed from the light emitting region by a lift-off technique, so that a p-side electrode 116 is formed. After the back surface of the n-GaAs substrate 101 is polished, an n-side electrode 117 is formed on the back surface of the substrate 101 through a deposition process. Ohmic conduction is then performed on the electrodes 116 and 117 through annealing.

In the surface-emitting laser diode of FIG. 1, the AlAs selectively oxidized layers 109 and 104 are provided in the p-$Al_{0.9}Ga_{0.1}As$/$Al_{0.15}Ga_{0.85}As$ upper semiconductor distributed Bragg reflector 108 and the n-$Al_{0.9}Ga_{0.1}As$/$Al_{0.15}Ga_{0.85}As$ lower semiconductor distributed Bragg reflector 103, respectively. Each side of the non-oxidized (conductive) region 113b formed in the n-$Al_{0.9}Ga_{0.1}As$/$Al_{0.15}Ga_{0.85}As$ lower semiconductor distributed Bragg reflector 103 is 3 μm long, which is shorter than each side of the non-oxidized (conductive) region 113a formed in the p-$Al_{0.9}Ga_{0.1}As$/$Al_{0.15}Ga_{0.85}As$ upper semiconductor distributed Bragg reflector 108. Here, the refraction of the AlAs oxide is approximately 1.6, and affects the waveguide mode in the resonator. Accordingly, a high-order transverse mode having great electric field amplitude in areas other than the center of the mesa has a great refraction loss due to the oxide layers, and has the oscillation greatly suppressed. On the other hand, a fundamental transverse mode having great electric field amplitude at the center of the mesa has a small refraction loss due to the oxidation confinement structure, and easily attains oscillation.

A conventional surface-emitting laser diode has a small non-oxidized area in the p-type distributed Bragg reflector, so as to attain steady single fundamental transverse-mode oscillation. However, this causes limitations on outputs of the device due to the decrease of the oscillation area, and an increase of the heat generation from the device due to high resistance (roll-over due to the heat).

The device of Example 1, on the other hand, suppresses the transverse-mode oscillation by virtue of the oxidation confinement structure provided in the n-$Al_{0.9}Ga_{0.1}As$/$Al_{0.15}Ga_{0.85}As$ lower semiconductor distributed Bragg reflector 103. In this device, the n-type distributed Bragg reflector has a lower resistance than the p-type distributed Bragg reflector, and accordingly, the oscillation of the high-order transverse mode can be suppressed without an increase in the resistance of the device.

However, electrons have greater mobility than holes. It is difficult to restrict the carrier injection region effectively to the center of the mesa by virtue of the oxidation restricting layer provided in the n-type distributed Bragg reflector. As a result, the carriers scatter toward the sides of the mesa, and cause a problem of a decrease of the radiative recombination rate due to the non-radiative recombination levels of the sides of the mesa. To avoid this problem, a restricting structure should be provided for the holes so as to restrict the region in which electrons and holes are excited at high density to the center of the mesa.

To achieve this objective, the device of Example 1 has an oxidation confinement structure provided in the p-type distributed Bragg reflector so as to restrict the holes. It is unnecessary to restrict the non-oxide region to so small as to suppress the oscillation of the high-order transverse mode, and the oxidation confinement structure should be only big enough to prevent the holes from scattering to the sides of the mesa. Accordingly, the oxidation confinement structure can be made larger so as to obtain high outputs. There is no need to increase the device resistance as in the prior art, and adverse influence from the heat output saturation is small. Thus, even greater oscillation can be achieved.

As described above, the device of Example 1 of the present invention can achieve great oscillation in the single fundamental mode, and has a higher heat output saturation point than conventional devices.

Example 2

Figure 3:
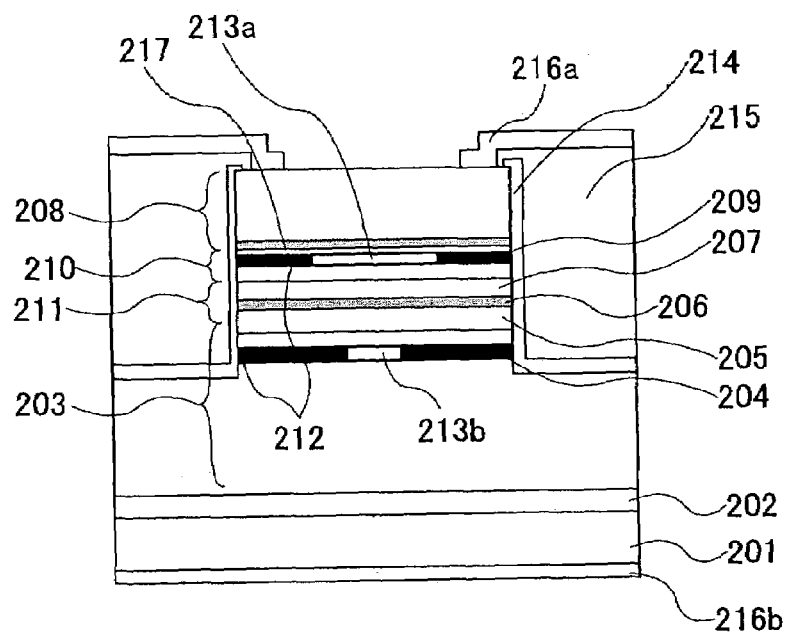
FIG. 3 illustrates the structure of a surface-emitting laser diode of Example 2 of the present invention.

FIG. 3 illustrates a surface-emitting laser diode of Example 2 of the present invention. The surface-emitting laser diode shown in FIG. 3 is a 1.3 μm band surface-emitting laser diode having a GaInNAs/GaAs multi-quantum well structure as an active layer. In the following, the structure of this surface-emitting laser diode will be described in detail, in conjunction with the production procedures.

In the surface-emitting laser diode of FIG. 3, a crystal growth process is performed in the same manner as the crystal growth process in Example 1. More specifically, the device of FIG. 3 includes: an n-GaAs substrate 201; an n-GaAs buffer layer 202; a 36-period n-$Al_{0.9}Ga_{0.1}As$/GaAs lower semiconductor distributed Bragg reflector 203 having each combination of n-$Al_{0.9}Ga_{0.1}As$/GaAs as one period; a resonance region 211 formed by a non-doped GaAs resonator spacer 205, a GaInGAs/GaAs multi-quantum well active layer 206, and a non-doped GaAs resonator spacer 207; and a 20-period upper semiconductor distributed Bragg reflector formed by a p-$Al_{0.9}Ga_{0.1}As$/GaAs upper semiconductor distributed Bragg reflector 210 and an n-$Al_{0.9}Ga_{0.1}As$/GaAs upper semiconductor distributed Bragg reflector 208. These layers are formed in this order through crystal growth, with the substrate 201 being at the bottom. Further, the GaAs layer that is the outermost surface layer of the upper semiconductor distributed Bragg reflector has a p-GaAs contact layer (not shown) formed by high-density carbon that is a p-type dopant in the vicinity of the surface.

The upper semiconductor distributed Bragg reflectors 208 and 210 and the lower semiconductor distributed Bragg reflector 203 each has such a thickness that the phase change of light in each layer with respect to the oscillating wavelength becomes π/2, which is the same as in the Example 1. More specifically, each $Al_{0.9}Ga_{0.1}As$ layer is 109.9 nm thick, and each GaAs layer is 95.2 nm thick.

The n-$Al_{0.9}Ga_{0.1}As$/GaAs lower semiconductor distributed Bragg reflector 203 and the p-$Al_{0.9}Ga_{0.1}As$/GaAs upper semiconductor distributed Bragg reflector 210 include an n-AlAs selectively oxidized layer 204 and a p-AlAs selectively oxidized layer 209, respectively. Each of the selectively oxidized layers 204 and 209 is formed by an oxide region 212 that is oxidized through selective oxidation, and a non-oxide region 213a/213b that is not oxidized.

Figure 4:
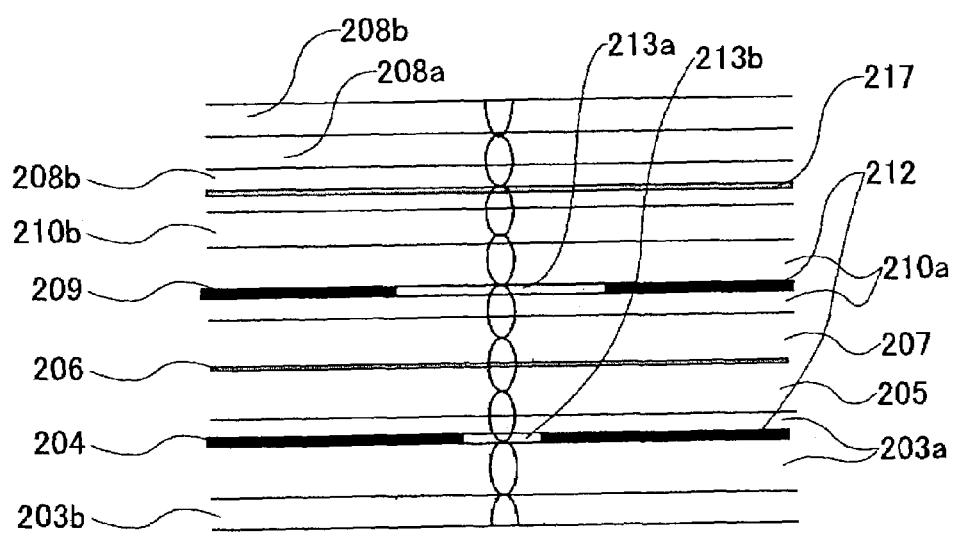
FIG. 4 illustrates the surrounding area of the resonance region of the surface-emitting laser diode of FIG. 3, in conjunction of the standing wave of oscillating light.

FIG. 4 illustrates the surrounding area of the resonance region 211 of the surface-emitting laser diode of FIG. 3, in conjunction with the standing wave of oscillating light.

The structure shown in FIG. 4 includes: the resonance region 211 that is formed by the non-doped GaAs resonator spacer 205, the GaInNAs/GaAs multi-quantum well active layer 206, and the non-doped GaAs resonator spacer 207; one period of the n-$Al_{0.9}Ga_{0.1}As$/GaAs lower semiconductor distributed Bragg reflector 203 that is formed by an n-$Al_{0.9}Ga_{0.1}As$ lower semiconductor distributed Bragg reflector low refraction layer 203a, the n-AlAs selectively oxidized layer 204, and an n-GaAs lower semiconductor distributed Bragg reflector high refraction layer 203b; and a structure that is formed by a p-$Al_{0.9}Ga_{0.1}As$ upper semiconductor distributed Bragg reflector low refraction layer 210a, the p-AlAs selectively oxidized layer 209, a p-GaAs upper semiconductor distributed Bragg reflector high refraction layer 210b, a tunnel junction 217, a GaAs upper semiconductor distributed Bragg reflector high refraction layer 208b, and an n-$Al_{0.9}Ga_{0.1}As$ upper semiconductor distributed Bragg reflector low refraction layer 208a.

In the surface-emitting laser diode of FIG. 3, the n-$Al_{0.9}Ga_{0.1}As$ lower semiconductor distributed Bragg reflector low refraction layer 203a and the p-$Al_{0.9}Ga_{0.1}As$ upper semiconductor distributed Bragg reflector low refraction layer 210a include the n-AsAl selectively oxidized layer 204 and the p-AlAs selectively oxidized layer 209, respectively. Here, the n-AlAs selectively oxidized layer 204 is 30 nm thick, and the p-AlAs selectively oxidized layer 209 is 20 nm thick.

The tunnel junction 217 formed by a p++-GaAs layer and an n++-GaAs layer is interposed between the p-GaAs upper semiconductor distributed Bragg reflector high refraction layer 210b and the n-GaAs upper semiconductor distributed Bragg reflector high refraction layer 208b.

The n-$Al_{0.9}Ga_{0.1}As$ lower semiconductor distributed Bragg reflector low refraction layer 203a and the p-$Al_{0.9}Ga_{0.1}As$ upper semiconductor distributed Bragg reflector low refraction layer 210a each has such a thickness that the phase change of the oscillating light in each of the regions including the AlAs selectively oxidized layers becomes 3π/2, which satisfies the phase conditions of Bragg reflectors.

Likewise, the tunnel junction 217, the p-GaAs upper semiconductor distributed Bragg reflector high refraction layer 210b, and the n-GaAs upper semiconductor distributed Bragg reflector high refraction layer 208b, each has such a thickness that the phase change of light in each of the layers becomes 3π/2.

In this device of Example 2, after a mesa is formed in the same manner as in Example 1, a selective oxide region 212 and non-oxide regions 213a and 213b are formed through selective oxidation, which is also the same as in Example 1. Here, the areas of the non-oxide regions vary with the thicknesses of the AlAs selectively oxidized layers. In general, the non-oxidized (conductive) region 213a that is to serve as the hole passage has a larger area than the non-oxidized (conductive) region 213b that is to serve as the electron passage. The selective oxidation structure that includes the non-oxide region 213b having the smaller area serves as an optical mode control structure.

An insulating region including a $SiO_2$ insulating layer 214 and insulating resin 215 is then formed in the same manner as in Example 1. Further, a p-side electrode 216a and an n-side electrode 216b are formed.

Like the device of Example 1, the device of Example 2 has an oxidation confinement structure provided in the n-$Al_{0.9}Ga_{0.1}As$/GaAs lower semiconductor distributed Bragg reflector 203, and thus performs transverse-mode control. Since the resistance of an n-type distributed Bragg reflector is lower than the resistance of a p-type distributed Bragg reflector, high-order transverse-mode oscillation can be suppressed, without an increase of resistance.

The surface-emitting laser diode of FIG. 3 actually has high outputs, while maintaining single fundamental transverse-mode oscillation. In this surface-emitting laser diode, the upper and lower reflectors are formed mainly by n-semiconductor distributed Bragg reflectors that have small absorption losses with a p-semiconductor distributed Bragg reflector. Thus, a long-wave band surface-emitting laser diode having excellent characteristics such as a high slope efficiency and low oscillation threshold current is realized.

In this manner, a surface-emitting laser diode structure may be provided with a tunnel junction.

Example 3

Figure 5:
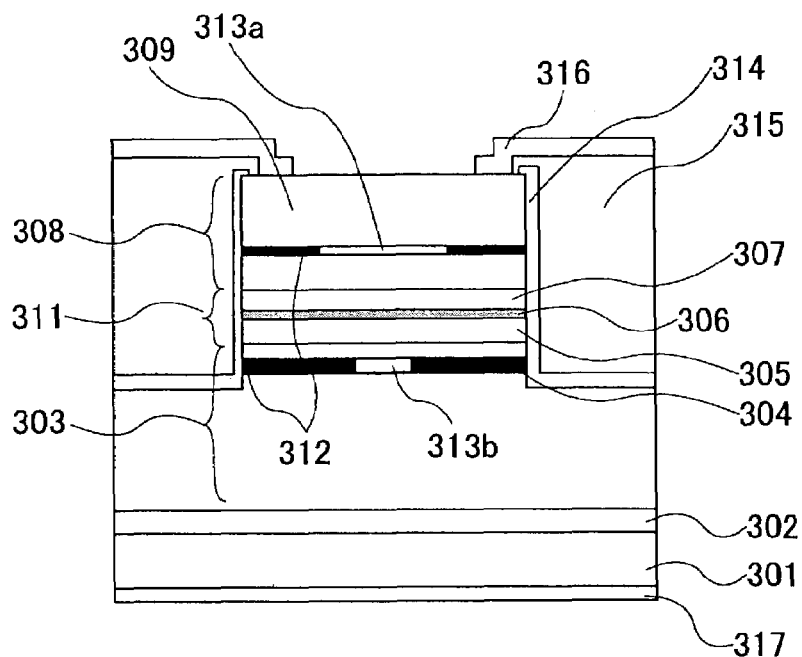
FIG. 5 illustrates the structure of a surface-emitting laser diode of Example 3 of the present invention.

FIG. 5 illustrates a surface-emitting laser diode of Example 3 of the present invention. The surface-emitting laser diode shown in FIG. 5 is a 0.98 μm band surface-emitting laser diode having a GaInAs/GaAs multi-quantum well structure as an active layer. In the following, this structure will be described in detail, in conjunction with the production procedures.

In the surface-emitting laser diode of FIG. 5, a crystal growth process is performed in the same manner as the crystal growth process in Example 1. More specifically, the device of FIG. 5 includes: an n-GaAs substrate 301; an n-GaAs buffer layer 302; a 36-period n-$Al_{0.8}Ga_{0.2}As$/GaAs lower semiconductor distributed Bragg reflector 303 having each combination of n-$Al_{0.8}Ga_{0.2}As$/GaAs as one period; a resonance region 311 formed by a non-doped GaAs resonator spacer 305, a GaInGAs/GaAs multi-quantum well active layer 306, and a non-doped GaAs resonator spacer 307; and a 20-period p-$Al_{0.8}Ga_{0.2}As$/GaAs upper semiconductor distributed Bragg reflector 308. These layers are formed in this order through crystal growth, with the substrate 301 being at the bottom. Further, the GaAs layer that is the outermost surface layer of the upper semiconductor distributed Bragg reflector 308 has a p-GaAs contact layer (not shown) formed by high-density carbon that is a p-type dopant in the vicinity of the surface.

The n-$Al_{0.8}Ga_{0.2}As$/GaAs lower semiconductor distributed Bragg reflector 303 and the p-$Al_{0.8}Ga_{0.2}As$/GaAs upper semiconductor distributed Bragg reflector 308 include an n-AlAs selectively oxidized layer 304 and a p-AlAs selectively oxidized layer 309, respectively. Each of the selectively oxidized layers 304 and 309 is formed by an oxide region 312 that is oxidized through selective oxidation, and a non-oxide region 313a/313b that is not oxidized.

Here, an n-$Al_{0.8}Ga_{0.2}As$ lower semiconductor distributed Bragg reflector low refraction layer 303a, a p-$Al_{0.8}Ga_{0.2}As$ upper semiconductor distributed Bragg reflector low refraction layer 308a, an n-GaAs lower semiconductor distributed Bragg reflector high refraction layer 303b, and a n-GaAs upper semiconductor distributed Bragg reflector high refraction layer 308b, each has such a thickness that the phase change of the oscillating light in each of the semiconductor layers becomes $\pi/2$, which satisfies the phase conditions for multi-reflection of distributed Bragg reflectors. More specifically, each $Al_{0.8}Ga_{0.2}As$ layer is 80.2 nm thick, and each GaAs layer is 69.5 nm thick.

Example 3 differs from Example 1 in the location of the p-AlAs selectively oxidized layer 309. In Example 1, the p-AlAs selectively oxidized layer 109 is located in the p-$Al_{0.9}Ga_{0.1}As$ upper semiconductor distributed Bragg reflector low refraction layer 108a, which is the first layer counted from the resonance region, in the p-$Al_{0.9}Ga_{0.1}As$/GaAs upper semiconductor distributed Bragg reflector 108. In Example 3, on the other hand, the p-AlAs selectively oxidized layer 309 is located in the p-$Al_{0.8}Ga_{0.2}As$ upper semiconductor distributed Bragg reflector low refraction layer 308a, which is the fifth layer counted from the resonance region.

Figure 6:
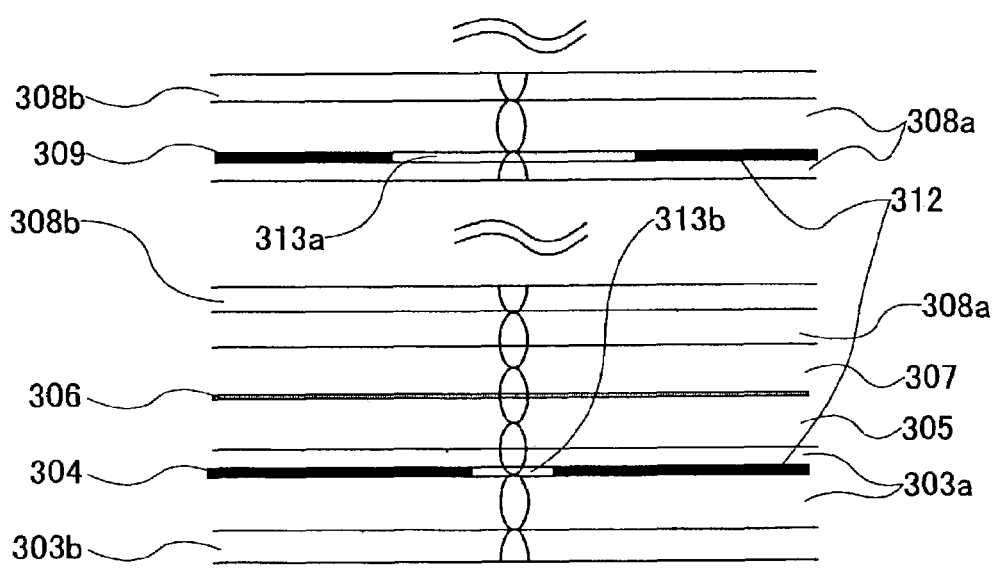
FIG. 6 illustrates the resonance region of the surface-emitting laser diode of FIG. 5, and the region in which a p-AlAs selectively oxidized layer is provided in a p-$Al_{0.8}Ga_{0.2}As$/GaAs upper semiconductor distributed Bragg reflector.

FIG. 6 illustrates the resonance region 311 and the region surrounding the p-AlAs selectively oxidized layer 309 in the p-$Al_{0.8}Ga_{0.2}As$/GaAs upper semiconductor distributed Bragg reflector 308 of the surface-emitting laser diode of FIG. 5.

FIG. 6 shows the structure of the resonance region 311 interposed between one period of the n-$Al_{0.8}Ga_{0.2}As$/GaAs lower semiconductor distributed Bragg reflector 303 that is formed by the n-$Al_{0.8}Ga_{0.2}As$ lower semiconductor distributed Bragg reflector low refraction layer 303a, the n-AlAs selectively oxidized layer 304, and the n-GaAs lower semiconductor distributed Bragg reflector high refraction layer 303b, and one period of the p-$Al_{0.8}Ga_{0.2}As$/GaAs upper semiconductor distributed Bragg reflector 308 that is formed by the p-$Al_{0.8}Ga_{0.2}As$ upper semiconductor distributed Bragg reflector low refraction layer 308a, the p-AlAs selectively oxidized layer 309, and the p-GaAs upper semiconductor distributed Bragg reflector high refraction layer 308b.

The p-AlAs selectively oxidized layer 309 is located in the p-$Al_{0.8}Ga_{0.2}As$ upper semiconductor distributed Bragg reflector low refraction layer 308a, which is the fifth layer counted from the resonance region 311. The two AlAs selectively oxidized layers 304 and 309 are provided at the locations corresponding to the joints of oscillating light.

Here, the n-AlAs selectively oxidized layer 304 is 30 nm thick, and the p-AlAs selectively oxidized layer 309 is 20 nm thick. Also, the n-$Al_{0.8}Ga_{0.2}As$ lower semiconductor distributed Bragg reflector low refraction layer 303a and the p-$Al_{0.8}Ga_{0.2}As$ upper semiconductor distributed Bragg reflector low refraction layer 308a each has such a thickness that the phase change of the oscillating light in this region including the AlAs layers becomes $3\pi/2$.

The resonance region 311 forms a 1-$\lambda$ resonator structure, which is the same as in Example 1, and the GaInAs/GaAs multi-quantum well active layer 306 is located at the antinode of the standing wave of the oscillating light.

In this device of Example 3, after a mesa is formed in the same manner as in Example 1, a selective oxide region 312 and non-oxide regions 313a and 313b are formed through selective oxidation, which is also the same as in Example 1. Here, the areas of the non-oxide regions vary with the thicknesses of the AlAs selectively oxidized layers. In general, the non-oxidized (conductive) region 313a that is to serve as the hole passage has a larger area than the non-oxidized (conductive) region 313b that is to serve as the electron passage. The selective oxidation structure that includes the non-oxide region 313b having the smaller area serves as an optical mode control structure.

An insulating region including a $SiO_2$ insulating layer 314 and insulating resin 315 is then formed in the same manner as in Example 1. Further, a p-side electrode 316 and an n-side electrode 317 are formed.

The surface-emitting laser diode of FIG. 5 can actually have high outputs, while maintaining single fundamental transverse-mode oscillation. The location of the optical mode control structure is not limited to the region surrounding the resonance region. In Example 3, the optical mode control structure can be provided at any location in the distributed Bragg reflectors.

Example 4

Figure 7:
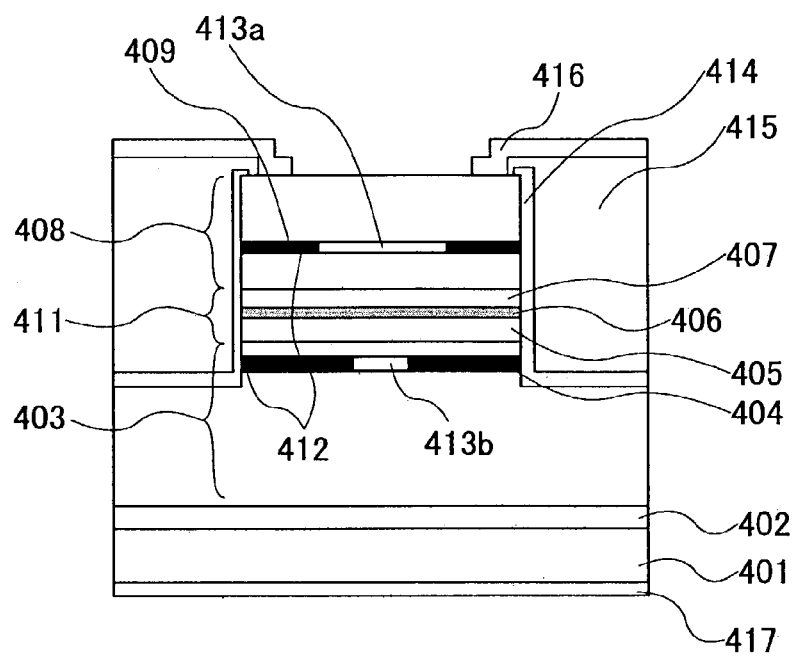
FIG. 7 illustrates the structure of a surface-emitting laser diode of Example 4 of the present invention.

FIG. 7 illustrates a surface-emitting laser diode of Example 4 of the present invention. The surface-emitting laser diode shown in FIG. 7 is a 0.98 $\mu$m band surface-emitting laser diode having a GaInAs/GaAs multi-quantum well structure as an active layer. In the following, this structure will be described in detail, in conjunction with the production procedures.

The surface-emitting laser diode of FIG. 7 has the same layer structure as the device of Example 3, except that a p-AlAs selectively oxidized layer 409 is located at an antinode of the standing wave of the oscillating light in a p-$Al_{0.8}Ga_{0.2}As$ upper semiconductor distributed Bragg reflector low refraction layer 408a in a p-$Al_{0.8}Ga_{0.2}As$/GaAs upper semiconductor distributed Bragg reflector 408. The p-$Al_{0.8}Ga_{0.2}As$ upper semiconductor distributed Bragg reflector low refraction layer 408a is the fifth layer counted from a resonance region 411.

Figure 8:
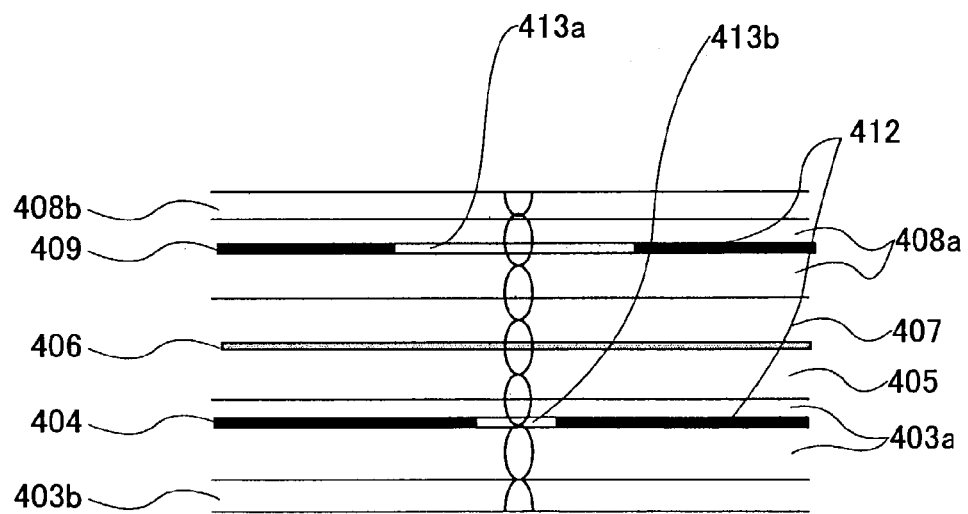
FIG. 8 illustrates the surface-emitting laser diode of FIG. 7 in greater detail.

FIG. 8 illustrates the surface-emitting laser diode of FIG. 7 in greater detail, and the structure shown in FIG. 8 corresponds to the structure shown in FIG. 6 of Example 3. Referring to FIG. 8, the p-AlAs selectively oxidized layer 409 that is 20 nm thick is located at an antinode of the standing wave of the oscillating light in the p-$Al_{0.8}Ga_{0.2}As$ upper semiconductor distributed Bragg reflector low refraction layer 408a in Example 4. The p-$Al_{0.8}Ga_{0.2}As$ upper semiconductor distributed Bragg reflector low refraction layer 408a has such a thickness that the phase change of the oscillating light in the region including the p-AlAs selectively oxidized layer 409 and the p-$Al_{0.8}Ga_{0.2}As$ upper semiconductor distributed Bragg reflector low refraction layer 408a becomes $3\pi/2$.

In this device of Example 4, a selective oxide region 412 and non-oxide regions 413a and 413b are formed through selective oxidation, which is also the same as in Example 3. Here, the areas of the non-oxide regions vary with the thicknesses of the AlAs selectively oxidized layers. In general, the non-oxidized (conductive) region 413a that is to serve as the hole passage has a larger area than the non-oxidized (conductive) region 413b that is to serve as the electron passage. The selective oxidation structure that includes the non-oxide region 413b having the smaller area serves as an optical mode control structure. Each side of the non-oxidized (conductive) region 413a is 10 $\mu$m long, and each side of the non-oxidized (conductive) region 413b is 3 $\mu$m long.

Oscillating light of high-order transverse mode has a wider electric field in the transverse direction, compared with fundamental transverse-mode light. Also, the light diffraction loss becomes greater when an oxide layer is located at an antinode of the standing wave of great electric field amplitude. Therefore, a selective oxidation structure that includes a large non-oxide region is provided at an antinode of the standing wave, so as to minimize the diffraction loss with respect to the fundamental transverse mode and to increase the diffraction loss with respect to the high-order transverse mode. Thus, the surface-emitting laser diode of FIG. 7 can have high outputs, while maintaining single fundamental transverse-mode oscillation.

Example 5

Figure 9:
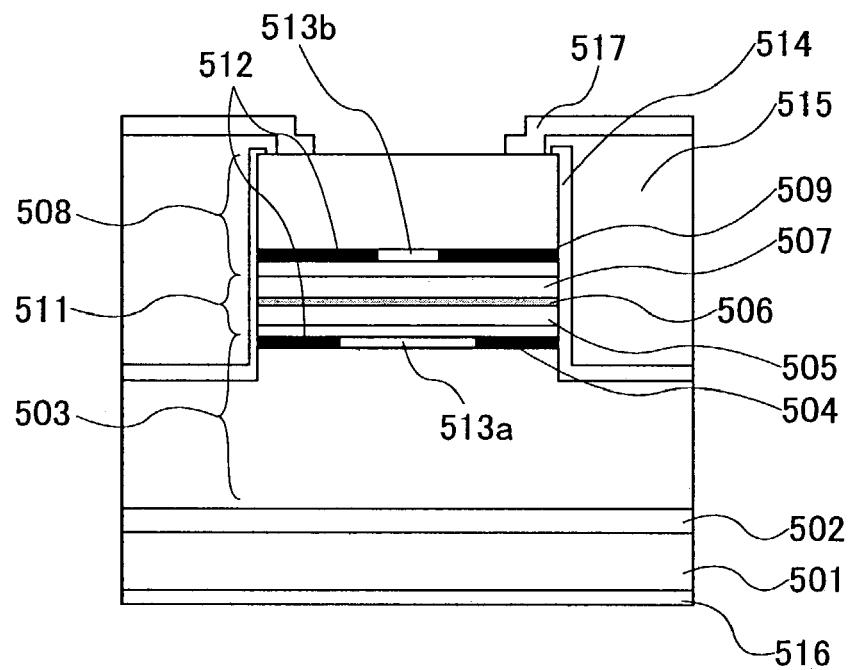
FIG. 9 illustrates the structure of a surface-emitting laser diode of Example 5 of the present invention.

FIG. 9 illustrates a surface-emitting laser diode of Example 5 of the present invention. The surface-emitting laser diode shown in FIG. 9 is a 0.85 µm band surface-emitting laser diode having a GaAs/$Al_{0.15}Ga_{0.85}As$ multi-quantum well structure as an active layer. This surface-emitting laser diode of FIG. 9 is the same as the device of Example 1, except that the conductivity types of the upper and lower structures sandwiching the active layer are reversed. In the following, the device of this example will be described in greater detail.

The device of FIG. 9 includes: a p-GaAs substrate 501; a p-GaAs buffer layer 502; a 36-period p-$Al_{0.9}Ga_{0.1}As$/$Al_{0.15}Ga_{0.85}As$ lower semiconductor distributed Bragg reflector 503 having each combination of p-$Al_{0.9}Ga_{0.1}As$/$Al_{0.15}Ga_{0.85}As$ as one period; a resonance region 511 that is formed by a non-doped $Al_{0.15}Ga_{0.85}As$ resonator spacer 505, a GaAs/$Al_{0.15}Ga_{0.85}As$ multi-quantum well active layer 506, and a non-doped $Al_{0.15}Ga_{0.85}As$ resonator spacer 507; and a 20-period n-$Al_{0.9}Ga_{0.1}As$/$Al_{0.15}Ga_{0.85}As$ upper semiconductor distributed Bragg reflector 508. These layers are formed in this order through crystal growth, with the substrate 501 being at the bottom. The p-$Al_{0.9}Ga_{0.1}As$/$Al_{0.15}Ga_{0.85}As$ lower semiconductor distributed Bragg reflector 503 and the n-$Al_{0.9}Ga_{0.1}As$/$Al_{0.15}Ga_{0.85}As$ upper semiconductor distributed Bragg reflector 508 include a p-AlAs selectively oxidized layer 504 and an n-AlAs selectively oxidized layer 509, respectively. Each of the selectively oxidized layers 504 and 509 is formed by an oxide region 512 that is oxidized through selective oxidation, and a non-oxide region 513a/513b that is not oxidized.

Figure 10:
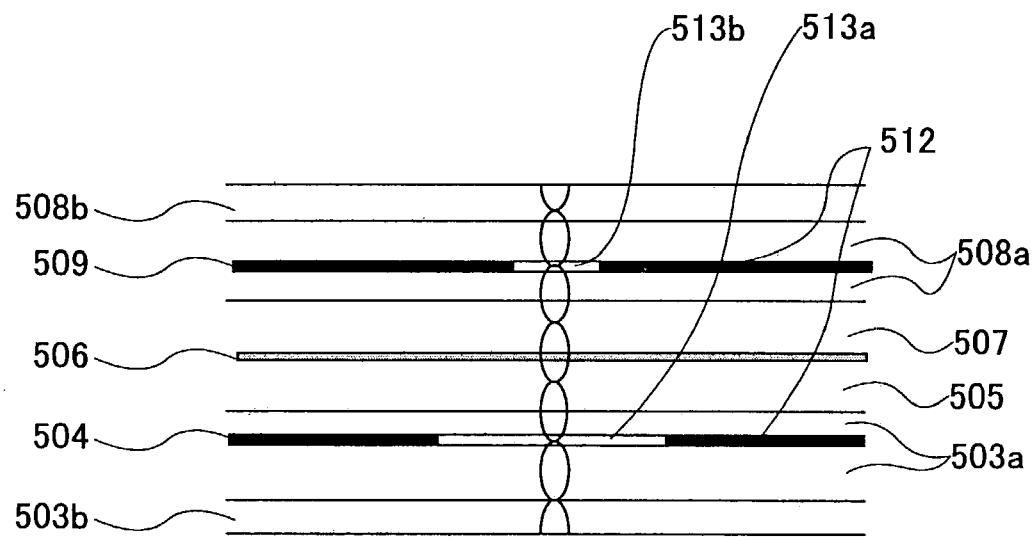
FIG. 10 illustrates the surrounding area of the resonance region of the surface-emitting laser diode of FIG. 9.

FIG. 10 illustrates the region surrounding the resonance region 511 of the surface-emitting laser diode of FIG. 9. The structure shown in FIG. 10 includes: the resonance region 511; the structure of one period of the p-$Al_{0.9}Ga_{0.1}As$/$Al_{0.15}Ga_{0.85}As$ lower semiconductor distributed Bragg reflector 503 consisting of a p-$Al_{0.9}Ga_{0.1}As$ lower semiconductor distributed Bragg reflector low refraction layer 503a, the p-AlAs selectively oxidized layer 504, and a p-$Al_{0.15}Ga_{0.85}As$ lower semiconductor distributed Bragg reflector high refraction layer 503b; and the structure of one period of the n-$Al_{0.9}Ga_{0.1}As$/$Al_{0.15}Ga_{0.85}As$ upper semiconductor distributed Bragg reflector 508 consisting of an n-$Al_{0.9}Ga_{0.1}As$ upper semiconductor distributed Bragg reflector low refraction layer 508a, the n-AlAs selectively oxidized layer 509, and an n-$Al_{0.15}Ga_{0.85}As$ upper semiconductor distributed Bragg reflector high refraction layer 508b.

In the surface-emitting laser diode of FIG. 9, the p-AlAs selectively oxidized layer 504 and the n-AlAs selectively oxidized layer 509 are provided in the p-$Al_{0.9}Ga_{0.1}As$ lower semiconductor distributed Bragg reflector low refraction layer 503a and the n-$Al_{0.9}Ga_{0.1}As$ upper semiconductor distributed Bragg reflector low refraction layer 508a, respectively, which are in contact with the resonance region, as shown in FIG. 10. Here, the n-AlAs selectively oxidized layer 509 is 30 nm thick, and the p-AlAs selectively oxidized layer 504 is 20 nm. On the other hand, the p-$Al_{0.9}Ga_{0.1}As$ lower semiconductor distributed Bragg reflector low refraction layer 503a and the n-$Al_{0.9}Ga_{0.1}As$ upper semiconductor distributed Bragg reflector low refraction layer 508a that are provided with the AlAs selectively oxidized layers 504 and 509 each has such a thickness that the phase change of the oscillating light in each of the regions including the AlAs layer becomes $3\pi/2$.

The GaAs/$Al_{0.15}Ga_{0.85}As$ multi-quantum well active layer 506 is provided at an antinode of the standing wave of the oscillating light, and the p-AlAs selectively oxidized layer 504 and the n-AlAs selectively oxidized layer 509 are provided at location corresponding to joints of the standing wave. This device also forms a 1-λ; resonator structure.

In the device of Example 5, after a mesa is formed, a selective oxide region 512 and non-oxidized (conductive) regions 513a and 513b are formed through selective oxidation in the same manner as in Example 1. The area of the selective oxide region 512 varies with the difference between the thicknesses of the AlAs selectively oxidized layers 504 and 509.

In general, the non-oxide region 513b is designed to have a smaller area than the non-oxide region 513a. Here, each side of the non-oxide region 513b is 3 µm long, while each side of the non-oxide region 513a is 10 µm long. The selective oxidation structure that includes the smaller non-oxide region 513b serves as an optical mode control structure.

An insulating region is then formed with a $SiO_2$ insulating layer 514 and insulating resin 515 in the same manner as in Example 1. After that, a p-side electrode 516 and an n-side electrode 517 are formed.

This surface-emitting laser diode of FIG. 9 also can have high outputs, while maintaining single fundamental transverse-mode oscillation.

In this manner, the substrate side can be of p-conductivity type, and the surface side can be of n-conductivity type, using a p-type semiconductor substrate.

Example 6

Figure 11:
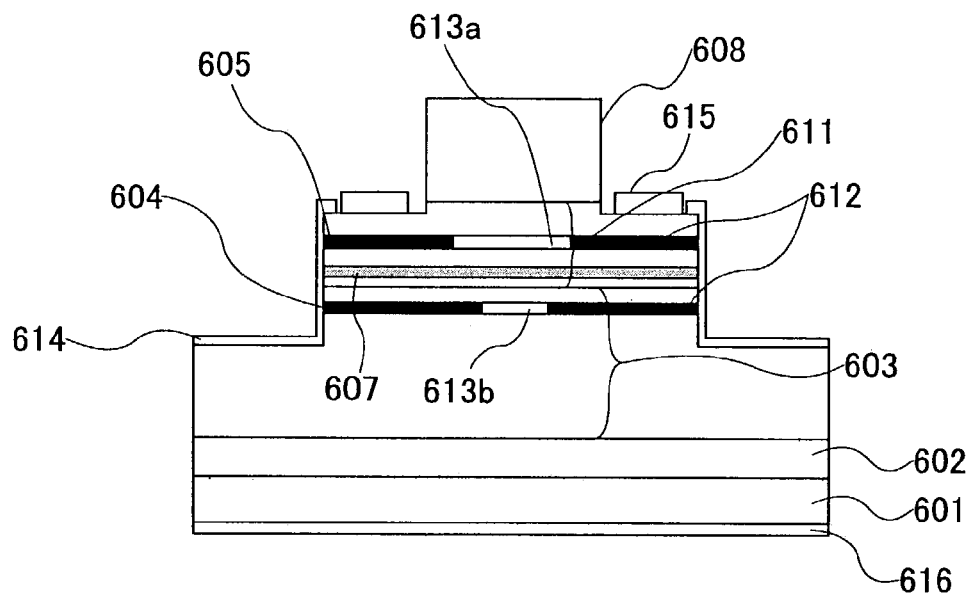
FIG. 11 illustrates the structure of a surface-emitting laser diode of Example 6 of the present invention.

FIG. 11 illustrates a surface-emitting laser diode of Example 6 of the present invention. The surface-emitting laser diode shown in FIG. 11 is a 1.3 µm band surface-emitting laser diode having a GaInNAs/GaAs multi-quantum well structure as an active layer. This surface-emitting laser diode also has a so-called intra-cavity contact structure in which the electrode for confining carriers is provided on a semiconductor layer in the device. In the following, this structure will be described in detail, in conjunction with the production procedures.

The surface-emitting laser diode of FIG. 11 is formed through crystal growth by a MOCVD method, which is the same as in Example 1, and dimethylhydrazine is employed as the nitride material for the active layer.

More specifically, the device of FIG. 11 includes an n-GaAs substrate 601, an n-GaAs buffer layer 602, a 36-period n-$Al_{0.8}Ga_{0.2}As$/GaAs lower semiconductor distributed Bragg reflector 603 having each combination of $Al_{0.8}Ga_{0.2}As$/GaAs as one period, a resonance region 611, and a 20-period non-doped $Al_{0.8}Ga_{0.2}As$/GaAs upper semiconductor distributed Bragg reflector 608. These layers are formed in this order through crystal growth, with the substrate 601 being at the bottom.

The resonance region 611 is formed by a GaInNAs/GaAs multi-quantum well active layer 607, a GaAs resonator spacer layer, and a p-AlAs selectively oxidized layer 605.

An n-AlAs selectively oxidized layer 604 is further provided in the n-$Al_{0.8}Ga_{0.2}As$/GaAs lower semiconductor distributed Bragg reflector 603. Each of the selectively oxidized layers 605 and 604 is formed by a selective oxide-region 612 that is oxidized through selective oxidation, and a non-oxide region 613a/613b that is not oxidized.

Figure 12:
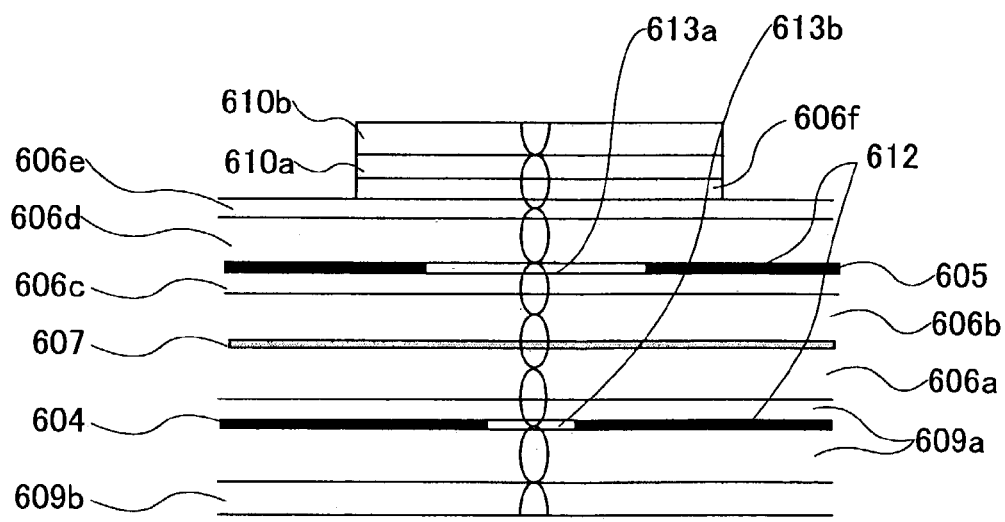
FIG. 12 illustrates the surrounding area of the resonance region of the intra-cavity contact type surface-emitting laser diode of FIG. 11.

FIG. 12 illustrates the surrounding area of the resonance region 611 of the surface-emitting laser diode of an intracavity contact type of FIG. 11. More specifically, the structure shown in FIG. 12 includes: the resonance region 611; one period of the n-$Al_{0.8}Ga_{0.2}As$/GaAs lower semiconductor distributed Bragg reflector 603 that is formed by an n-$Al_{0.8}Ga_{0.2}As$ lower semiconductor distributed Bragg reflector low refraction layer 609a, the n-AlAs selectively oxidized layer 604, and an n-GaAs lower semiconductor distributed Bragg reflector high refraction layer 609b; and one period of the non-doped $Al_{0.8}Ga_{0.2}As$/GaAs upper semiconductor distributed Bragg reflector 608 that is formed by a non-doped $Al_{0.8}Ga_{0.2}As$ upper semiconductor distributed Bragg reflector low refraction layer 610a and a non-doped GaAs upper semiconductor distributed Bragg reflector high refraction layer 610b.

As can be seen from FIG. 12, the n-AlAs selectively oxidized layer 604 is provided in the n-$Al_{0.8}Ga_{0.2}As$ lower semiconductor distributed Bragg reflector low refraction layer 609a.

The resonance region 611 is formed by a non-doped GaAs resonator spacer layer 606a, a GaInNAs/GaAs multi-quantum well structure 607, a non-doped GaAs spacer layer 606b, a p-GaAs spacer layer 606c, a p-AlAs selectively oxidized layer 605, a p-GaAs spacer layer 606d, a p-GaAs contact/resonator spacer layer 606e, and a non-doped GaAs resonator spacer layer 606f. These layers are formed through crystal growth in this order, with the non-doped GaAs resonator spacer layer 606a being closest to the substrate 601.

The $Al_{0.8}Ga_{0.2}As$ layers 609a and 610a that are the low refraction layers of the lower semiconductor distributed Bragg reflector 603 and the upper semiconductor distributed Bragg reflector 608, and the GaAs layers 609b and 610b that are the high refraction layers of the lower semiconductor distributed Bragg reflector 603 and the upper semiconductor distributed Bragg reflector 608, each has such a thickness that the phase change of the oscillating light in each semiconductor layer becomes $\pi/2$, which satisfies the phase conditions for multi-reflection of distributed Bragg reflectors. More specifically, each $Al_{0.8}Ga_{0.2}As$ layer is 108.2 nm thick, and each GaAs layer is 95.2 nm thick.

However, as shown in FIG. 12, the n-$Al_{0.8}Ga_{0.2}As$ lower semiconductor distributed Bragg reflector low refraction layer 609a sandwiching the n-AlAs selectively oxidized layer 604 has such a thickness that the phase change of the oscillating light in the n-AlAs selectively oxidized layer 604 and the n-$Al_{0.8}Ga_{0.2}As$ lower semiconductor distributed Bragg reflector low refraction layer 609a becomes $3\pi/2$. Here, the n-AlAs selectively oxidized layer 604 is 30 nm thick.

The non-doped GaAs resonator spacer layers 606a and 606b, the GaInNAs/GaAs multi-quantum well structure 607, the p-GaAs resonator spacer layers 606c and 606d, the non-doped GaAs resonator spacer layer 606f, the p-AlAs selectively oxidized layer 605, and the p-GaAs contact/resonator spacer layer 606e, which form the resonance region 611, each has such a thickness that the phase change of the oscillating light in the resonance region 611 becomes 4 $\delta$, thereby forming a 2-$\lambda$ resonator structure.

Also, the GaInNAs/GaAs multi-quantum well structure 607 is located at an antinode of the standing wave of the oscillating light. On the other hand, the n-AlAs selectively oxidized layer 604 and the p-AlAs selectively oxidized layer 605 are provided at locations corresponding to joints of the standing wave of the oscillating light, so as to reduce the light diffraction loss. In the device of FIG. 11, the n-AlAs selectively oxidized layer 604 and the p-AlAs selectively oxidized layer 605 are located at the second joints, counted from the active layer, of the standing wave, as shown in FIG. 12. Here, the p-AlAs selectively oxidized, layer 605 is 20 nm thick.

The P-GaAs contact/resonator spacer layer 606e is located at a joint of the standing wave, so as to reduce the light absorption loss caused by the high-density p-type doped semiconductor layers.

The surface-emitting laser diode of FIG. 11 is fabricated in the following manner. After the crystal growth of each layer, etching removal is performed for each layer contained between the surface of the non-doped $Al_{0.8}Ga_{0.2}As$/GaAs upper semiconductor distributed Bragg reflector 608 and the surface of the p-GaAs contact/resonator spacer layer 606e, by a known photoengraving technique and a known etching technique. A 30 $\mu$m square mesa is thus formed as shown in FIG. 12.

A 50 $\mu$m square resist pattern is then formed in alignment with the square mesa by a photoengraving technique. Etching removal is performed on each layer between the outermost surface and the middle of the n-$Al_{0.8}Ga_{0.2}As$/GaAs lower semiconductor distributed Bragg reflector 603 by a dry etching technique, so that the end surfaces of the n-AlAs selectively oxidized layer 604 and the p-AlAs selectively oxidized layer 605 are exposed. A double square mesa is thus formed.

In a heated atmosphere containing steam, the oxidation rate is controlled by adjusting the thickness difference between the n-AlAs selectively oxidized layer 604 and the p-AlAs selectively oxidized layer 605. The non-oxide region 613a having the larger non-oxidized area and the 613b having the smaller non-oxidized area are then formed in the middle of the mesa, and the selective oxide region 612 is formed in the peripheral area in the mesa.

Here, each side of the non-oxide region 613b is 5 $\mu$m long, and each side of the non-oxide region 613a is 10 $\mu$m long. In this manner, the area of the non-oxidized (conductive) region 613b in the electron passage is made smaller than the area of the non-oxidized (conductive) region 613a in the hole passage. Here, the selective oxidation structure that includes the non-oxide region 613b having the smaller area serves as an optical mode control structure.

After a $SiO_2$ layer 614 is formed on the entire surface of the wafer by a chemical vapor deposition (CVD) technique, a 45 $\mu$m square resist opening pattern is formed in alignment with the center of the mesa, and the $SiO_2$ at the opening part is removed. A 30 $\mu$m resist pattern is next formed on the p-GaAs contact/resonator spacer layer 606e in alignment with the mesa, and a p-side electrode 615 is formed by a deposition technique or a lift-off technique. The back surface of the substrate 601 is then polished, and an n-side electrode 616 is formed on the back surface of the substrate 601 by a deposition technique. Ohmic conduction is then carried out on the electrodes 615 and 616 through annealing.

The surface-emitting laser diode of FIG. 11 can have high outputs, while maintaining single fundamental transverse-mode oscillation.

With a p-type semiconductor material, the light absorptivity increases in long-wave bands including a 1.3 $\mu$m band and the like, and the oscillation threshold current also increases due to the absorption loss of high-density p-type doped layers and p-type distributed Bragg reflectors. As a result, the slope efficiency tends to decrease.

On the other hand, in the intra-cavity contact structure of Example 6, hole confining is conducted so as to eliminate the need for a p-type distributed Bragg reflector. The adverse influence from the light absorption can be reduced accordingly. A long-wave band surface-emitting laser diode with a high performance can be thus obtained.

Example 7

Figure 13:
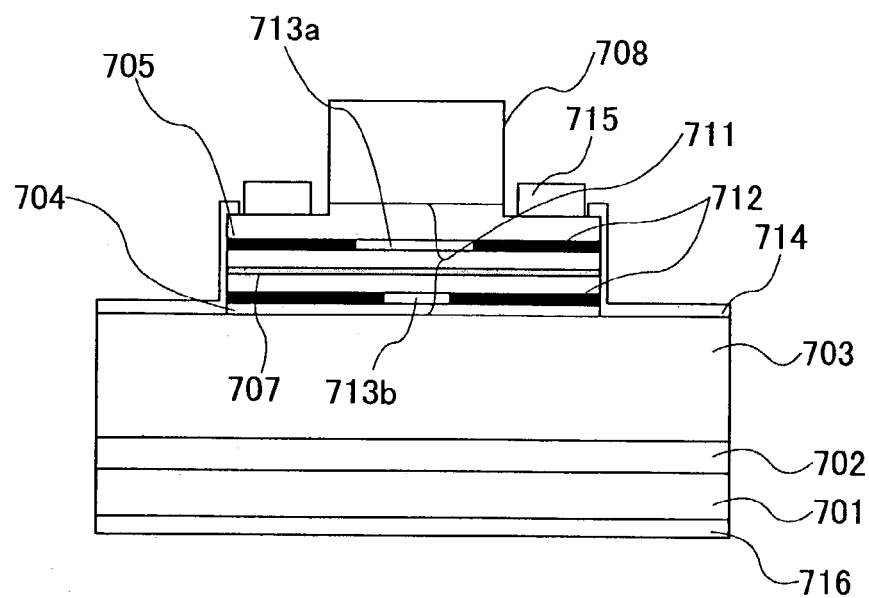
FIG. 13 illustrates the structure of a surface-emitting laser diode of Example 7 of the present invention.

FIG. 13 illustrates a surface-emitting laser diode of Example 7 of the present invention. This surface-emitting laser diode is a 1.3 μm band surface-emitting laser diode having a GaInNAs/GaAs multi-quantum well structure as an active layer. The surface-emitting laser diode of FIG. 13 also has an intra-cavity contact structure that is provided with electrodes for carrier confining in the semiconductor layers in the device. This device of Example 7 is the same as the device of Example 6, except that the n-AlAs selectively oxidized layer is provided in the resonance region. In the following, this structure will be described in detail, in conjunction with the production procedures.

The surface-emitting laser diode of FIG. 13 includes an n-GaAs substrate 701, an n-GaAs buffer layer 702, an n-$Al_{0.8}Ga_{0.2}As$/GaAs lower semiconductor distributed Bragg reflector 703, a resonance region 711, and a non-doped $Al_{0.8}Ga_{0.2}As$/GaAs upper semiconductor distributed Bragg reflector 708. These layers are formed in this order by the same crystal growth process as in Example 6.

Figure 14:
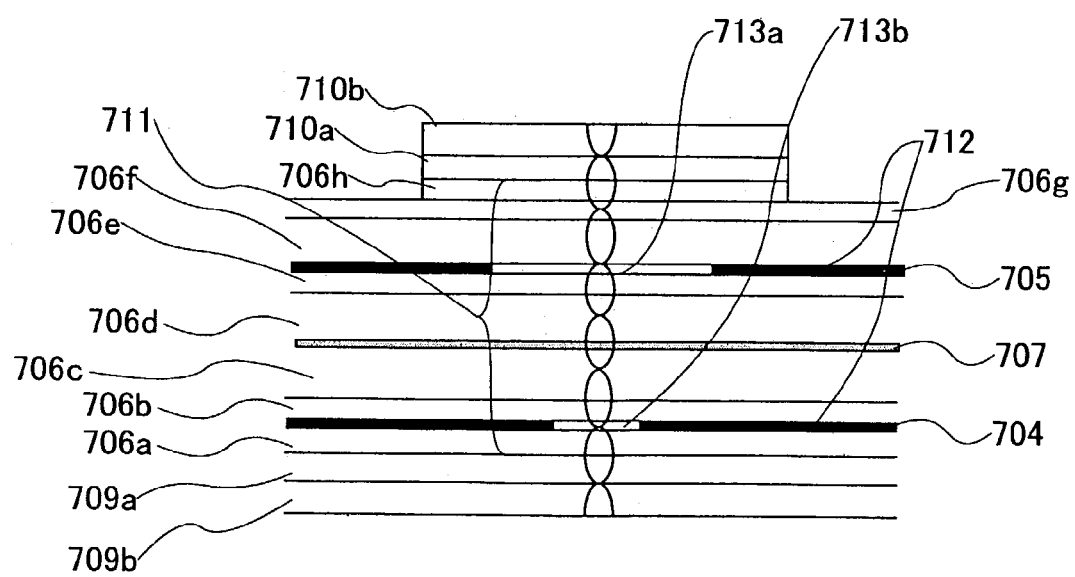
FIG. 14 illustrates the resonance region of the surface-emitting laser diode of FIG. 13 in greater detail.

FIG. 14 illustrates the resonance region of the surface-emitting laser diode of FIG. 13 in greater detail. More specifically, FIG. 14 shows the resonance region 711 interposed between one period of the n-$Al_{0.8}Ga_{0.2}As$/GaAs lower semiconductor distributed Bragg reflector 703 that is formed by an n-$Al_{0.8}Ga_{0.2}As$ lower semiconductor distributed Bragg reflector low refraction layer 709a and an n-GaAs lower semiconductor distributed Bragg reflector high refraction layer 709b, and one period of the non-doped $Al_{0.8}Ga_{0.2}As$/GaAs upper semiconductor distributed Bragg reflector 708 that is formed by a non-doped $Al_{0.8}Ga_{0.2}As$ upper semiconductor distributed Bragg reflector low refraction layer 710a and a non-doped GaAs upper semiconductor distributed Bragg reflector high refraction layer 710b.

After the formation of the n-$Al_{0.8}Ga_{0.2}As$/GaAs lower semiconductor distributed Bragg reflector 703 through crystal growth, the resonance region 711 and the non-doped $Al_{0.8}Ga_{0.2}As$/GaAs upper semiconductor distributed Bragg reflector 708 are formed through crystal growth. As shown in FIG. 14, the resonance region 711 includes an n-GaAs resonator spacer layer 706a, an n-AlAs selectively oxidized layer 704, an n-GaAs resonator spacer layer 706b, a non-doped GaAs resonator spacer layer 706c, a GaInNAs/GaAs multi-quantum well structure 707, a non-doped GaAs resonator spacer layer 706d, a p-GaAs resonator spacer layer 706e, a p-AlAs selectively oxidized layer 705, a p-GaAs resonator spacer layer 706f, a p-GaAs resonator spacer/contact layer 706g, and a non-doped GaAs resonator spacer layer 706h.

After the crystal growth in the device of FIG. 13, a square mesa is formed by an etching technique, and selective oxidation is performed. A $SiO_2$ insulating layer 714, a p-side electrode 715, and an n-side electrode 716, are then formed. All of these processes are carried out in the same manner as in Example 6.

In this example, the n-AlAs selectively oxidized layer 704 is interposed between the n-GaAs resonator spacer layers 706a and 706b. Also, the n-AlAs selectively oxidized layer 704 and the p-AlAs selectively oxidized layer 705 are provided in the resonance region 711, as shown in FIG. 13.

The phase change of oscillating light in the resonance region 711 is equal to 5π. The resonance region 711 thus forms a 2.5-λ resonator. The n-AlAs selectively oxidized layer 704 and the p-AlAs selectively oxidized layer 705 have different thicknesses. Each side of the non-oxide region 713b provided in the n-type semiconductor layer as the electron passage is 5 μm long, and each side of the non-oxide region 713a provided in the p-type semiconductor layer as the hole passage is 10 μm long. Here, the selective oxidation structure that includes the non-oxide region 713b having the smaller area serves as an optical mode control structure.

The surface-emitting laser diode of FIG. 13 can also have high outputs, while maintaining single fundamental transverse-mode oscillation. Accordingly, the selectively oxidized layers can be provided in the resonance region.

Example 8

Figure 15:
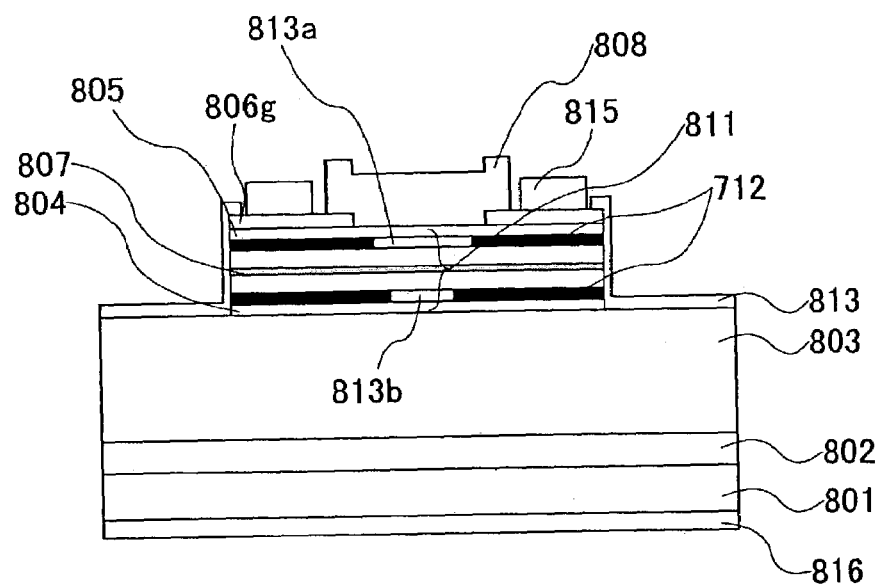
FIG. 15 illustrates the structure of a surface-emitting laser diode of Example 8 of the present invention.

FIG. 15 illustrates a surface-emitting laser diode of Example 8 of the present invention. The surface-emitting laser diode shown in FIG. 15 is a 1.3 μm band surface-emitting laser diode having a GaInNAs/GaAs multi-quantum well structure as an active layer. This surface-emitting laser diode also has an intra-cavity contact structure in which the electrode for confining carriers is provided on a semiconductor layer in the device. This device of Example 8 has the n-AlAs selectively oxidized layer in the resonance region, which is the same as in the device of Example 7. In this device, the upper reflector is formed by a dielectric material ($MgF_2$) and a semiconductor material (ZnSe). In the following, this structure will be described in detail, in conjunction with the production procedures.

The intra-cavity contact-type surface-emitting laser diode of FIG. 15 includes an n-GaAs substrate 801, an n-GaAs buffer layer 802, a 36-period n-AlAs/GaAs lower semiconductor distributed Bragg reflector 803 having each combination of AlAs/GaAs as one period, a resonance region 811, and a p-GaAs contact layer 806g. These layers are formed in this order through crystal growth, with the substrate 801 being at the bottom.

Figure 16:
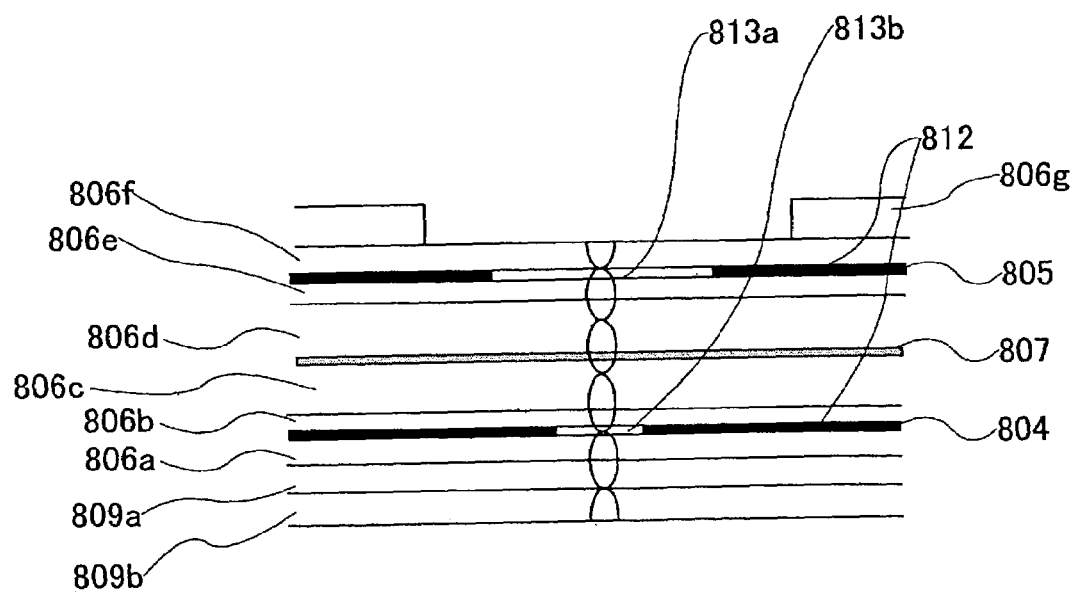
FIG. 16 illustrates the surrounding area of the resonance region of the intra-cavity contact type surface-emitting laser diode of FIG. 15.

FIG. 16 illustrates the region surrounding the resonance region 811 of the intra-cavity contact-type surface-emitting laser diode of FIG. 15 in greater detail. More specifically, FIG. 16 shows one period of the n-AlAs/GaAs lower semiconductor distributed Bragg reflector 803 formed by an a-AlAs lower semiconductor distributed Bragg reflector low refraction layer 809a and an n-GaAs lower semiconductor distributed Bragg reflector high refraction layer 809b, and the resonance region 811 located on the n-AlAs/GaAs lower semiconductor distributed Bragg reflector 803.

In the intra-cavity contact-type surface-emitting laser diode of FIG. 15, after the formation of the n-AlAs/GaAs lower semiconductor distributed Bragg reflector 803 through crystal growth, the resonance region 811 and the p-GaAs contact layer 806g are formed also through crystal growth. The resonance region 811 is formed by an n-GaAs resonator spacer layer 806a, an n-AlAs selectively oxidized layer 804, an n-GaAs resonator spacer layer 806b, a non-doped GaAs resonator spacer layer 806c, a GaInNAs/GaAs multi-quantum well structure 807, a non-doped GaAs resonator spacer layer 806d, a p-GaAs resonator spacer layer 806e, a p-$Al_{0.95}Ga_{0.5}As$ selectively oxidized layer 805, and a p-GaAs resonator spacer layer 806f. The phase change of oscillating light in the resonance region 611 is equal to 4 δ, and the resonance region 811 thus forms a 2-λ resonator structure.

In the intra-cavity contact-type surface-emitting laser diode of FIG. 15, after the mesa formation through etching, the selective oxidation, and the formation of a $SiO_2$ insulating layer 813, the-p-GaAs contact layer 806g in the resonance region is removed through etching to reduce the absorption loss, and a 5-period AnSe/$MgF_2$ upper distributed Bragg reflector 808 having each combination of ZnSe/$MgF_2$ as one period is formed by an electron beam deposition technique. A wet etching technique or the like is suitable for the etching of the p-GaAs contact layer 806g. It is preferable to provide a GaInP etching stop layer or the like under the p-GaAs contact layer 806g for better etching control.

After a p-side electrode 815 and an n-side electrode 816 are formed, an etching process is performed on the AnSe/$MgF_2$ upper distributed Bragg reflector 808 by a dry etching technique, so as to form a mesa.

In this example, AlGaAs layers having different Al compositions as AlAs selectively oxidized layers. The p-$Al_{0.95}Ga_{0.5}As$ selectively oxidized layer 805 is interposed between the p-GaAs resonator spacer layers 806e and 806f. The n-AlAs selectively oxidized layer 804 is interposed between the n-GaAs resonator spacer layers 806a and 806b. Both the selectively oxidized layers 804 and 805 are 30 nm thick.

In general, an AlGaAs layer containing a larger amount of Al has a higher oxidation rate. Accordingly, non-oxide regions 813a and 813b having different areas can be formed through a one-time oxidation process by virtue of the difference in the Al compositions. The oxidation rate can be thus controlled with the difference in the Al composition, and the area of the non-oxidized (conductive) region 813b in the electron passage is smaller than the area of the non-oxidized (conductive) region 813a in the hole passage. Here, each side of the non-oxide region 813b is 5 μm long, while each side of the non-oxide region 813a is 10 μm long. The selective oxidation structure that includes the smaller non-oxide region 813b serves as an optical mode control structure.

This surface-emitting laser diode of FIG. 15 can perform high-output operations, and actually has high outputs, while maintaining single fundamental transverse-mode oscillation. Also, the device resistance remains low.

As described above, the upper distributed reflector for a surface-emitting laser diode can be formed by a dielectric material, instead of a semiconductor material.

Example 9

Figure 17:
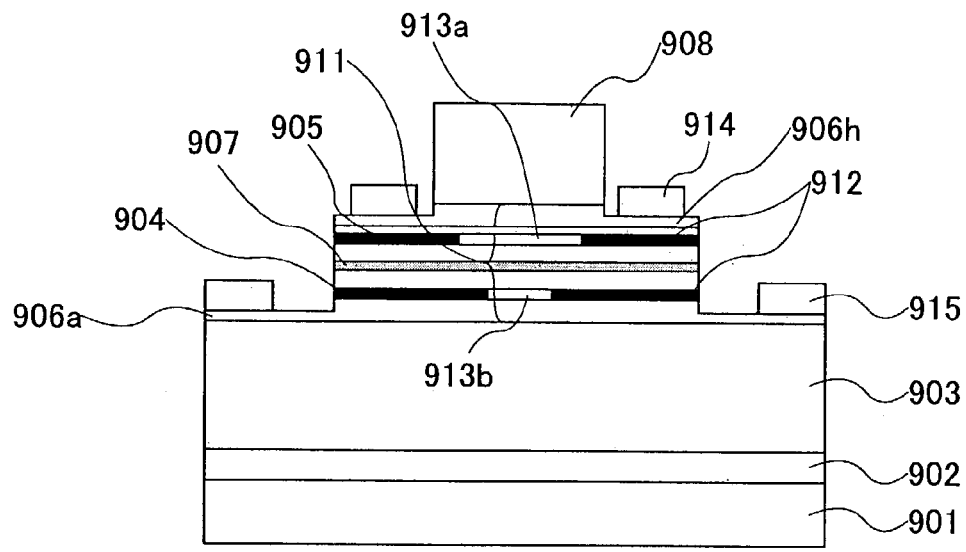
FIG. 17 illustrates the structure of a surface-emitting laser diode of Example 9 of the present invention.

FIG. 17 illustrates a surface-emitting laser diode of Example 9 of the present invention. The surface-emitting laser diode shown in FIG. 17 is a 1.3 μm band surface-emitting laser diode having a GaInNAs/GaAs multi-quantum well structure as an active layer. This surface-emitting laser diode has an intra-cavity contact structure in which the electrode for confining carriers is provided on a semiconductor layer in the device. This device of Example 9 has both the p-side and n-side electrodes on the surface side of the substrate. In the following, this structure will be described in detail, in conjunction with the production procedures.

The surface-emitting laser diode of FIG. 17 includes a semi-insulating GaAs substrate 901, a non-doped GaAs buffer layer 902, a 36-period non-doped AlAs/GaAs lower semiconductor distributed Bragg reflector 903 having each combination of AlAs/GaAs as one period, a resonance region 911, and a 20-period non-doped $Al_{0.8}Ga_{0.2}As$/GaAs upper semiconductor distributed Bragg reflector 908 having each combination of $Al_{0.8}Ga_{0.2}As$/GaAs as one period. These layers are formed in this order through crystal growth, with the substrate 901 being at the bottom.

Figure 18:
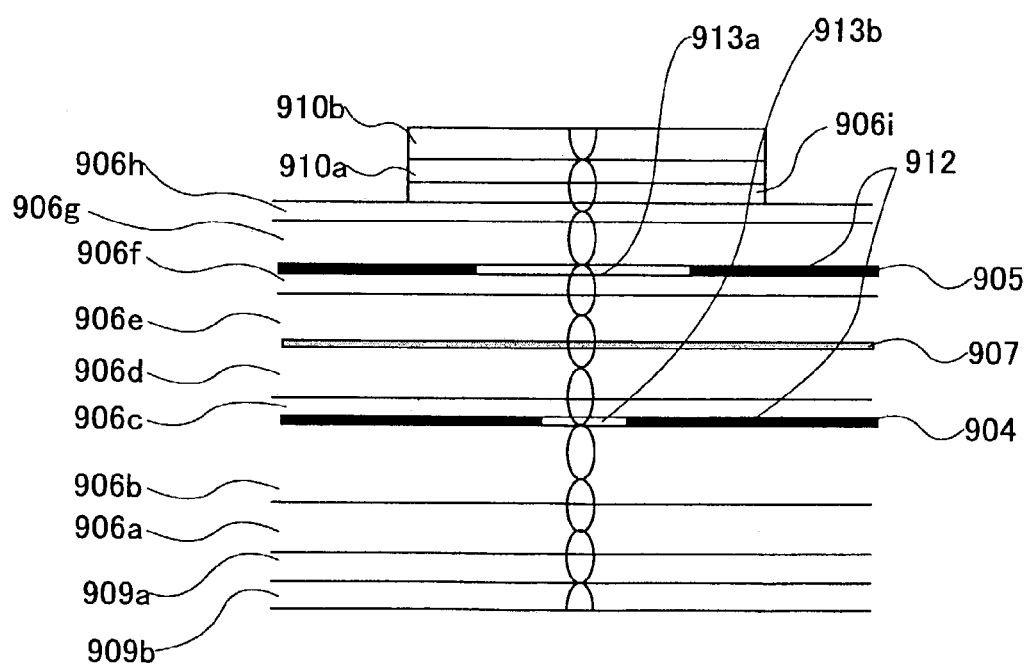
FIG. 18 illustrates the surrounding area of the resonance region of the surface-emitting laser diode of FIG. 17.

FIG. 18 illustrates the region surrounding the resonance region 911 of the surface-emitting laser diode of FIG. 17 in greater detail. More specifically, FIG. 18 shows one period of the non-doped AlAs/GaAs lower semiconductor distributed Bragg reflector 903 formed by a non-doped AlAs lower semiconductor distributed Bragg reflector low refraction layer 909a and a non-doped GaAs lower semiconductor distributed Bragg reflector high refraction layer 909b, the resonance region 911 located above the non-doped AlAs/GaAs lower semiconductor distributed Bragg reflector 903, and one period of the non-doped $Al_{0.8}Ga_{0.2}As$/GaAs upper semiconductor distributed Bragg reflector 908 formed by a non-doped $Al_{0.8}Ga_{0.2}As$ upper semiconductor distributed Bragg reflector low refraction layer 910a and a non-doped GaAs upper semiconductor distributed Bragg reflector high refraction layer 910b.

In the intra-cavity contact-type surface-emitting laser diode of FIG. 17, after the formation of the non-doped AlAs/GaAs lower semiconductor distributed Bragg reflector 903 through crystal growth, the resonance region 911 and the non-doped $Al_{0.8}Ga_{0.2}As$/GaAs upper semiconductor distributed Bragg reflector 908 are formed also through crystal growth, as shown in FIG. 18. The resonance region 911 is formed by an n-GaAs contact/resonator spacer layer 906a, an n-GaAs resonator spacer layer 906b, an n-AlAs selectively oxidized layer 904, an n-GaAs resonator spacer layer 906c, a non-doped GaAs resonator spacer layer 906d, a GaInNAs/GaAs multi-quantum well structure 907, a non-doped GaAs resonator spacer layer 906e, a p-GaAs resonator spacer layer 906f, a p-$Al_{0.98}Ga_{0.02}As$ selectively oxidized layer 905, and a p-GaAs resonator spacer layer 906g, a p-GaAs contact/resonator spacer layer 906h, and a non-doped GaAs resonator spacer layer 906i.

In this device of Example 9, the p-GaAs contact/resonator spacer layer 906h for gaining conduction with the p-side electrode, and the n-GaAs contact/resonator spacer layer 906a for gaining conduction with the n-side electrode, are employed as shown in FIG. 17. Etching is performed on the device of FIG. 17 so as to expose the surfaces of the contact layers 906h and 906a. A double square mesa is thus formed. After that, a selective oxide region 912 and non-oxidized (conductive) regions 913a and 913b are formed in a heated atmosphere containing steam. An n-side electrode 915 and a p-side electrode 914 are then formed.

In this example, the areas of the non-oxide regions are controlled with the Al composition difference between the selectively oxidized layers. More specifically, the p-$Al_{0.98}Ga_{0.02}As$ selectively oxidized layer 905 is provided in the hole passage, and the n-AsAl selectively oxidized layer 904 is provided in the electron passage, so that the area of the non-oxidized (conductive) region 913b in the electron passage becomes smaller than the area of the non-oxidized (conductive) region 913a in the hole passage.

Here, each side of the non-oxide region 913b provided in the n-type semiconductor layer that serves as the electron passage is 3 μm long, while each side of the non-oxide region 913a provided in the p-type semiconductor layer that serves as the hole passage is 10 μm long. The selective oxidation structure that includes the smaller non-oxide region 913b serves as an optical mode control structure.

This surface-emitting laser diode of FIG. 17 can perform high-output operations, and actually has high outputs, while maintaining single fundamental transverse-mode oscillation. Also, the device resistance remains low.

This device of Example 9 has both the p-side and n-side electrodes on the contact layers provided in the resonator region, and accordingly, has a structure that does not guide carriers via the semiconductor distributed Bragg reflectors. With this structure, it is not necessary to perform impurity doping on the semiconductor distributed Bragg reflectors, and the light absorption loss caused by free carrier absorption and the like can be reduced. Thus, a long-wave band intra-cavity contact-type surface-emitting laser diode with an excellent performance can be obtained.

Example 10

Figure 19:
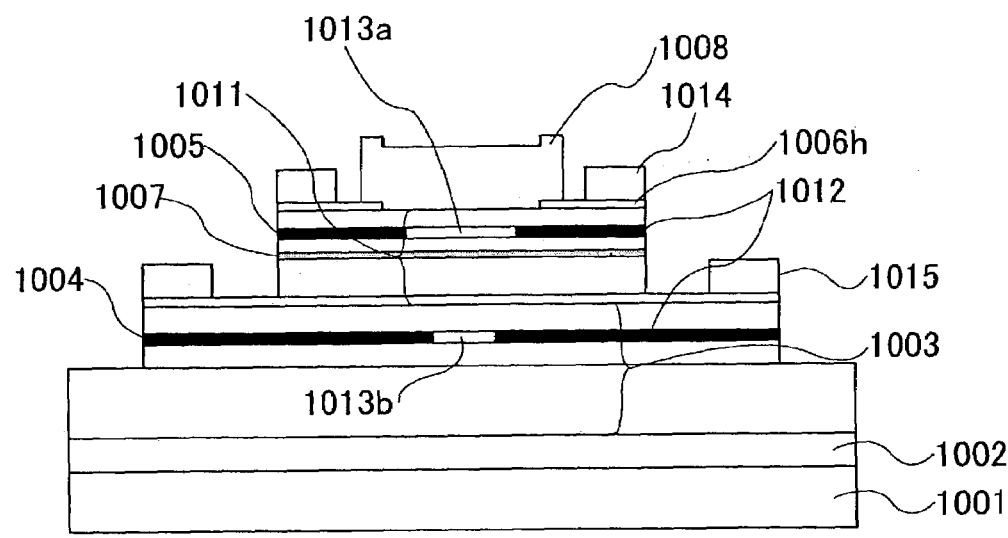
FIG. 19 illustrates the structure of a surface-emitting laser diode of Example 10 of the present invention.

FIG. 19 illustrates a surface-emitting laser diode of Example 10 of the present invention. The surface-emitting laser diode shown in FIG. 19 is a 670-nm band visible surface-emitting laser diode having a GaInP/AlGaInP multi-quantum well structure as an active layer. This surface-emitting laser diode has an intra-cavity contact structure in which the electrode for confining carriers is provided on a semiconductor layer in the device. This device of Example 10 also has both the p-side and n-side electrodes on the outer surface, but has a different structure from the device of Example 9. In the following, this structure will be described in detail, in conjunction with the production procedures.

The surface-emitting laser diode of FIG. 19 is fabricated by a MOCVD technique, using phosphine ($PH_3$) as a phosphorus (p) material and dimethylzinc (DMZn) as a p-type dopant for part of the layers.

The surface-emitting laser diode of FIG. 19 includes a semi-insulating GaAs substrate 1001, a non-doped GaAs buffer layer 1002, a 56-period non-doped $Al_{0.9}Ga_{0.1}As/Al_{0.5}Ga_{0.5}As$ lower semiconductor distributed Bragg reflector 1003 having each combination of $Al_{0.9}Ga_{0.1}As/Al_{0.5}Ga_{0.5}As$ as one period, a resonance region 1011, and a p-$(Al_{0.5}Ga_{0.5})_{0.5}In_{0.5}P$ contact layer 1006h. These layers are formed in this order through crystal growth, with the substrate 1001 being at the bottom.

Figure 20:
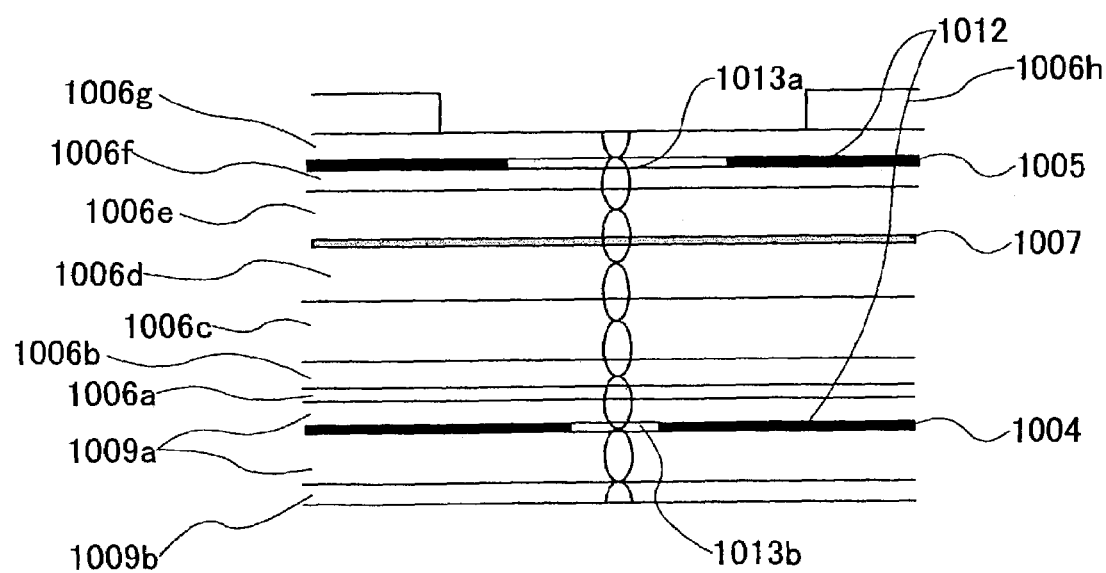
FIG. 20 illustrates the surrounding area of the resonance region of the surface-emitting laser diode of FIG. 19.

FIG. 20 illustrates the region surrounding the resonance region 1011 of the surface-emitting laser diode of FIG. 19 in greater detail. More specifically, FIG. 20 shows one period of the non-doped $Al_{0.9}Ga_{0.1}As/Al_{0.5}Ga_{0.5}As$ lower semiconductor distributed Bragg reflector 1003 formed by a non-doped $Al_{0.9}Ga_{0.1}As$ lower semiconductor distributed Bragg reflector low refraction layer 1009a and a non-doped $Al_{0.5}Ga_{0.5}As$ lower semiconductor distributed Bragg reflector high refraction layer 1009b, the resonance region 1011 located above the non-doped $Al_{0.9}Ga_{0.1}As/Al_{0.5}Ga_{0.5}As$ lower semiconductor distributed Bragg reflector 1003, and the p-GaAs contact layer 1006h.

As shown in FIG. 20, a non-doped AlAs selectively oxidized layer 1004 is provided at a location corresponding to a joint of the standing wave of the oscillating light in the non-doped $Al_{0.9}Ga_{0.1}As$ lower semiconductor distributed Bragg reflector low refraction layer 1009a, which is closest to the active layer side of the non-doped $Al_{0.9}Ga_{0.1}As/Al_{0.5}Ga_{0.5}As$ lower semiconductor distributed Bragg reflector 1003.

In the surface-emitting laser diode of FIG. 19, after the formation of the non-doped $Al_{0.9}Ga_{0.1}As/Al_{0.5}Ga_{0.5}As$ lower semiconductor distributed Bragg reflector 1003 through crystal growth, further crystal growth is carried out to form an n-$(Al_{0.5}Ga_{0.5})_{0.5}In_{0.5}P$ contact/resonator spacer layer 1006a, an n-$(Al_{0.5}Ga_{0.5})_{0.5}In_{0.5}P$ resonator spacer layer 1006b, a non-doped $(Al_{0.5}Ga_{0.5})_{0.5}In_{0.5}P$ resonator spacer layer 1006c, a non-doped $(Al_{0.5}Ga_{0.5})_{0.5}In_{0.5}P$ resonator spacer layer 1006d, a GaInP/$(Al_{0.5}Ga_{0.5})_{0.5}In_{0.5}P$ multi-quantum well structure 1007, a non-doped $(Al_{0.5}Ga_{0.5})_{0.5}In_{0.5}P$ resonator spacer layer 1006e, a p-$(Al_{0.5}Ga_{0.5})_{0.5}In_{0.5}P$ resonator spacer layer 1006f, a p-$Al_{0.98}Ga_{0.02}As$ selectively oxidized layer 1005, and a p-$(Al_{0.5}Ga_{0.5})_{0.5}In_{0.5}P$ resonator spacer layer 1006g, and the p-GaAs contact layer 1006h, as shown in FIG. 20.

Here, the p-$Al_{0.98}Ga_{0.02}As$ selectively oxidized layer 1005 is provided at a location corresponding to a joint of the standing wave of oscillating light, and has a different thickness and Al composition from the non-doped AlAs selectively oxidized layer 1004. More specifically, the p-$Al_{0.98}Ga_{0.02}As$ selectively oxidized layer 1005 is 20 nm thick, and the non-doped AlAs selectively oxidized layer 1004 is 30 nm thick. The resonance region 1011 forms a 2.5-$\lambda$ resonator structure.

A double square mesa structure shown in FIG. 19 is then formed by a known photoengraving technique and a known dry etching technique. To reduce the oscillating light absorption, etching removal is performed on the p-GaAs contact layer 1006h in the resonance region 1011.

Oxidation is then performed on the etching end surfaces of the p-$Al_{0.98}Ga_{0.02}As$ selectively oxidized layer 1005 and the non-doped AlAs selectively oxidized layer 1004 in a heated atmosphere containing steam, so as to form a selective oxide region 1012 and non-oxide regions 1013a and 1013b. The oxidation rate of the selectively oxidized layers are controlled by adjusting the Al composition and layer thicknesses. In this device, the Al composition and thicknesses of the selectively oxidized layers are adjusted so that each side of the non-oxide region 1013a becomes 10 $\mu$m long, and that each side of the non-oxide region 1013b becomes 3 $\mu$m long. Here, the selective oxidation structure that includes the smaller non-oxide region 1013b serves as an optical mode control structure.

A 7-period $TiO_2/SiO_2$ upper dielectric distributed Bragg reflector 1008 having each combination of $TiO_2/SiO_2$ as one period is formed by an electron beam deposition technique, and is shaped into the mesa shown in FIG. 19 by a known dry etching technique. After that, a p-side electrode 1014 and an n-side electrode 1015 are formed.

In the surface-emitting laser diode of FIG. 19, the two electrodes 1014 and 1015 provided on the surface of the substrate guide the carriers, and the oxide insulating layers formed in the non-doped $Al_{0.9}Ga_{0.1}As/Al_{0.5}Ga_{0.5}As$ lower semiconductor distributed Bragg reflector 1003 does not adversely affect the electric resistance.

This device of Example 10 has both the p-side and n-side electrodes on the contact layers provided in the resonator region, and accordingly, has a structure that does not guide carriers via the semiconductor distributed Bragg reflectors. With this structure, it is not necessary to perform impurity doping on the semiconductor distributed Bragg reflectors, and the light absorption loss caused by free carrier absorption and the like can be reduced. As the upper distributed Bragg reflector is made of a dielectric material, the absorption loss can be further reduced. In a visible band in which single fundamental transverse-mode control is performed, it is necessary to reduce the non-oxidized area that easily increases the resistance and is readily influenced by heat generation. However, the device of Example 10 has the smaller non-oxide region 1013b outside the current passage, so that increases of resistance due to the non-oxide region 1013b can be prevented.

This surface-emitting laser diode of FIG. 19 can perform high-output operations, and actually has high outputs, while maintaining single fundamental transverse-mode oscillation. Also, the device resistance remains very low.

Example 11

Figure 21:
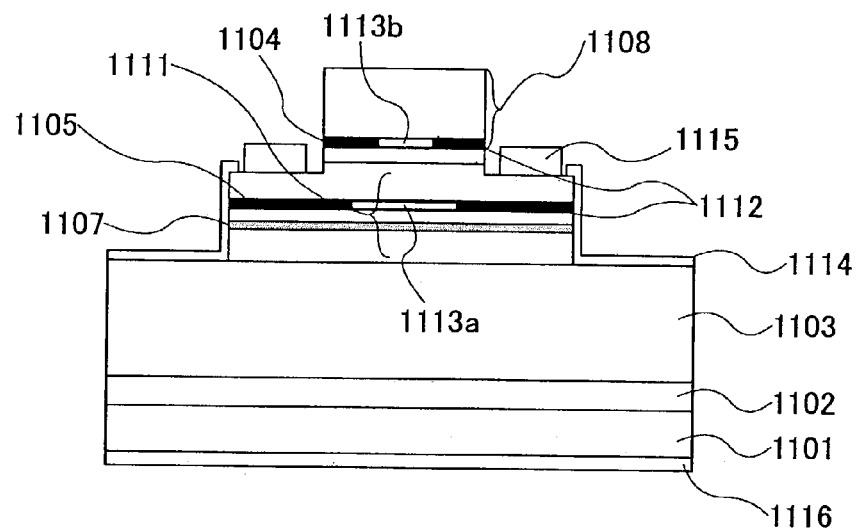
FIG. 21 illustrates the structure of a surface-emitting laser diode of Example 11 of the present invention.

FIG. 21 illustrates a surface-emitting laser diode of Example 11 of the present invention. The surface-emitting laser diode shown in FIG. 21 is a 1.3 μm band surface-emitting laser diode having a GaInNAsSb/GaAs multi-quantum well structure as an active layer. This surface-emitting laser diode has an intra-cavity contact structure in which the electrode for confining carriers is provided on a semiconductor layer in the device. This device of Example 11 also has a selective oxidation structure that performs oscillation transverse-mode control in a region outside the carrier conduction region. In the following, this structure will be described in detail.

The structure of a resonance region 1111 of the surface-emitting laser diode of FIG. 21 is similar to the resonance region of the device of Example 6. The surface-emitting laser diode of Example 11 has a selective oxidation structure formed by a non-doped AlAs selectively oxidized layer in a non-doped upper distributed Bragg reflector, instead of the selective oxidation structure formed by the n-AlAs selectively oxidized layer 604 provided in the n-$Al_{0.8}Ga_{0.2}As$/GaAs lower semiconductor distributed Bragg reflector 603 in Example 6. The surface-emitting laser diode of Example 11 further has a GaInNAsSb/GaAs multi-quantum well structure as an active layer.

The device of FIG. 21 includes an n-GaAs substrate 1101, an n-GaAs-buffer layer 1102, an n-$Al_{0.8}Ga_{0.2}As$/GaAs lower semiconductor distributed Bragg reflector 1103, the resonance region 1111, and a non-doped $Al_{0.8}Ga_{0.2}As$/GaAs upper semiconductor distributed Bragg reflector 1108. These layers are formed in this order through crystal growth, with the substrate 1101 being at the bottom.

Figure 22:
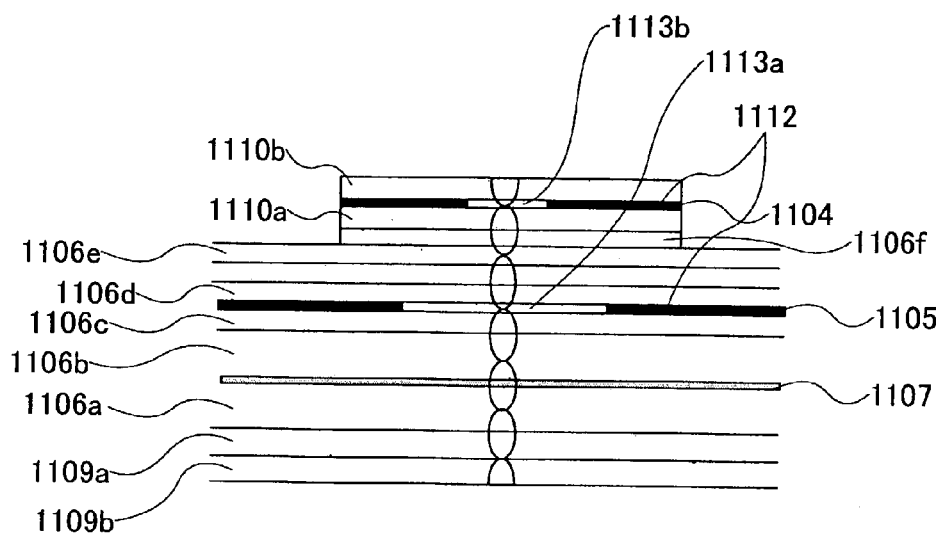
FIG. 22 illustrates the resonance region of the surface-emitting laser diode of FIG. 21 in greater detail.

FIG. 22 illustrates the region surrounding the resonance region 1111 of the surface-emitting laser diode of FIG. 21 in greater detail. More specifically, FIG. 22 shows one period of the n-$Al_{0.8}Ga_{0.2}As$/GaAs lower semiconductor distributed Bragg reflector 1103 formed by an n-$Al_{0.8}Ga_{0.2}As$ lower semiconductor distributed Bragg reflector low refraction layer 1109a and an n-GaAs lower semiconductor distributed Bragg reflector high refraction layer 1109b, one period of the non-doped $Al_{0.8}Ga_{0.2}As$/GaAs upper semiconductor distributed Bragg reflector 1108 formed by a non-doped $Al_{0.8}Ga_{0.2}As$ upper semiconductor distributed Bragg reflector low refraction layer 1110a and a non-doped GaAs upper semiconductor distributed Bragg reflector high refraction layer 1110b, and the resonance region 1111 interposed between the one period of the n-$Al_{0.8}Ga_{0.2}As$/GaAs lower semiconductor distributed Bragg reflector 1103 and the one period of the non-doped $Al_{0.8}Ga_{0.2}As$/GaAs upper semiconductor distributed Bragg reflector 1108.

After the formation of the n-$Al_{0.8}Ga_{0.2}As$/GaAs lower semiconductor distributed Bragg reflector 1103 through crystal growth, further crystal growth is carried out to form the resonance region 1111 that includes a non-doped GaAs resonator spacer layer 1106a, a GaInNAsSb/GaAs multi-quantum well structure 1107, a non-doped GaAs spacer layer 1106b, a p-GaAs spacer layer 1106c, a p-AlAs selectively oxidized layer 1105, a p-GaAs spacer layer 1106d, a p-GaAs contact/resonator spacer layer 1106e, and a non-doped GaAs spacer layer 1106f.

A non-doped AlAs selectively oxidized layer 1104 is further provided in the non-doped $Al_{0.8}Ga_{0.2}As$/GaAs upper semiconductor distributed Bragg reflector 1108. The p-AlAs selectively oxidized layer 1105 is thinner than the non-doped AlAs selectively oxidized layer 1104.

In the non-doped $Al_{0.8}Ga_{0.2}As$/GaAs upper semiconductor distributed Bragg reflector 1108, the non-doped AlAs selectively oxidized layer 1104 is provided in the non-doped $Al_{0.8}Ga_{0.2}As$ upper semiconductor distributed Bragg reflector low refraction layer 1110a, which is located at the first joint, counted from the side of the resonance region 1111, of the standing wave of the oscillating light. The non-doped $Al_{0.8}Ga_{0.2}As$ upper semiconductor distributed Bragg reflector low refraction layer 1110a that contains the non-doped AlAs selectively oxidized layer 1104 has such a thickness that the phase change of the light in the non-doped AlAs selectively oxidized layer 1104 and the non-doped $Al_{0.8}Ga_{0.2}As$ upper semiconductor distributed Bragg reflector low refraction layer 1110a becomes 3π/2. Likewise, the p-AlAs selectively oxidized layer 1105 is provided at a location corresponding to a joint of the standing wave of oscillating light.

After the formation of a double square mesa, selective oxidation is performed on the two selectively oxidized layers 1104 and 1105 in a heated atmosphere containing steam, so as to form a selective oxide region 1112 and non-oxide regions 1113a and 1113b. The oxidation rate of the selectively oxidized layers is controlled by adjusting the layer thicknesses. Each side of the non-oxide region 1113b in the non-doped AlAs selectively oxidized layer 1104 is 5 μm long, while each side of the non-oxide region 1113a in the p-AlAs selectively oxidized layer 1105 that serves as the hole passage is 10 μm long. Here, the selective oxidation structure that includes the smaller non-oxide region 1113b serves as an optical mode control structure.

A $SiO_2$ insulating layer 1114, a p-side electrode 1115, and an n-side electrode 1116, are then formed to thereby complete the surface-emitting laser diode of FIG. 21.

The surface-emitting laser diode of FIG. 21 does not guide current via the upper semiconductor distributed Bragg reflector 1108. As the upper semiconductor distributed Bragg reflector 1108 is non-doped and a p-type distributed Bragg reflector is not employed in this structure, the absorption loss is small. Furthermore, the non-oxide region 1113b provided in the non-doped $Al_{0.8}Ga_{0.2}As$/GaAs upper semiconductor distributed Bragg reflector 1108 does not adversely affect the resistance. Thus, the device resistance constantly remains very low.

This surface-emitting laser diode of FIG. 21 can perform high-output operations, and actually has high outputs, while maintaining single fundamental transverse-mode oscillation.

As described above, a long-wave band intra-cavity contact-type surface-emitting laser diode with an excellent performance can be obtained.

Example 12

Figure 23:
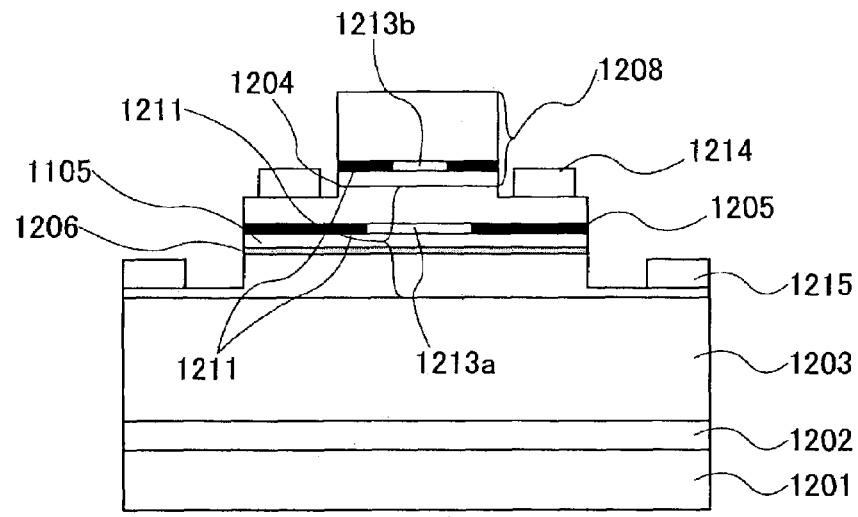
FIG. 23 illustrates the structure of a surface-emitting laser diode of Example 12 of the present invention.

FIG. 23 illustrates a surface-emitting laser diode of Example 12 of the present invention. The surface-emitting laser diode shown in FIG. 23 is a 1.3 μm band surface-emitting laser diode having a GaInNAsSb/GaAs multi-quantum well structure as an active layer. This surface-emitting laser diode has an intra-cavity contact structure in which the electrode for confining carriers is provided on a semiconductor layer in the device. This device of Example 12 differs from the device of Example 11 in that the p-side and n-side electrodes are both provided on the outer surface of the device. In the following, this structure will be described in detail.

The device of FIG. 23 includes a semi-insulating GaAs substrate 1201, a non-doped GaAs buffer layer 1202, a non-doped AlAs/GaAs lower semiconductor distributed Bragg reflector 1203, a resonance region 1211, and a non-doped $Al_{0.8}Ga_{0.2}As$/GaAs upper semiconductor distributed Bragg reflector 1208. These layers are formed in this order through crystal growth, with the substrate 1201 being at the bottom.

Figure 24:
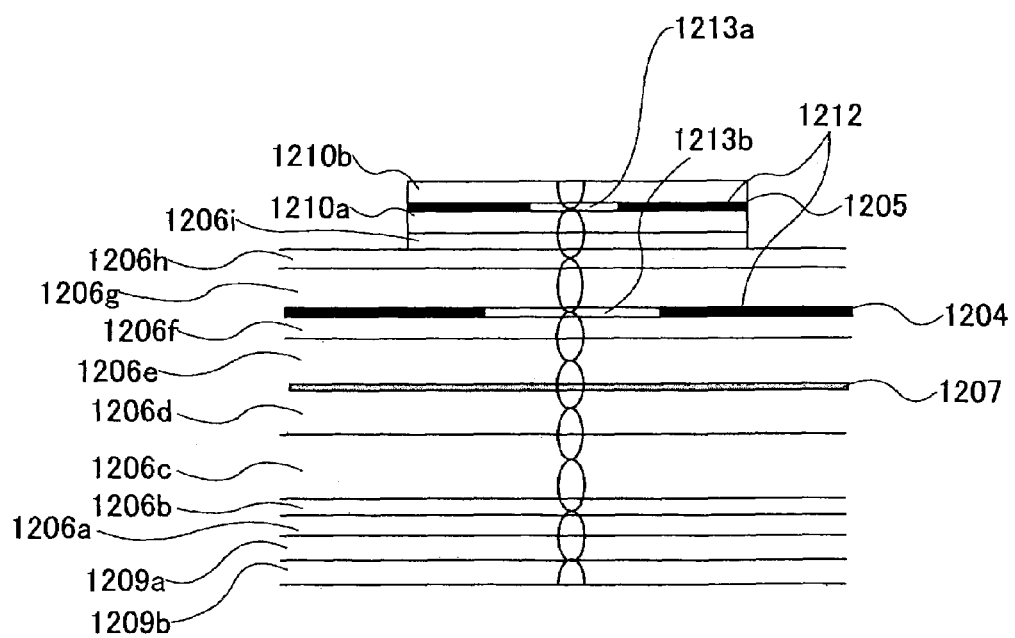
FIG. 24 illustrates the surrounding area of the resonance region of the surface-emitting laser diode of FIG. 23.

FIG. 24 illustrates the region surrounding the resonance region 1211 of the surface-emitting laser diode of FIG. 23 in greater detail. More specifically, FIG. 24 shows one period of the non-doped AlAs/GaAs lower semiconductor distributed Bragg reflector 1203 formed by a non-doped AlAs lower semiconductor distributed Bragg reflector low refraction layer 1209a and a non-doped GaAs lower semiconductor distributed Bragg reflector high refraction layer 1209b, the resonance region 1211 provided above the one period of the non-doped AlAs/GaAs lower semiconductor distributed Bragg reflector 1203, and one period of the non-doped $Al_{0.8}Ga_{0.2}As$/GaAs upper semiconductor distributed Bragg reflector 1208 formed by a non-doped $Al_{0.8}Ga_{0.2}As$ upper semiconductor distributed Bragg reflector low refraction layer 1210a and a non-doped GaAs upper semiconductor distributed Bragg reflector high refraction layer 1210b.

In the intra-cavity contact-type surface-emitting laser diode of FIG. 23, after the formation of the non-doped AlAs/GaAs lower semiconductor distributed Bragg reflector 1203 through crystal growth, further crystal growth is carried out to form the resonance region 1211 and the non-doped $Al_{0.8}Ga_{0.2}As$/GaAs upper semiconductor distributed Bragg reflector 1208. As shown in FIG. 24, the resonance region 1211 includes a non-doped GaAs resonator spacer layer 1206a, an n-GaAs contact/resonator spacer layer 1206b, an n-AlAs selectively oxidized layer 1204, an n-GaAs resonator spacer layer 1206c, a non-doped GaAs resonator spacer layer 1206d, a GaInNAsSb/GaAs multi-quantum well structure 1207, a non-doped GaAs resonator spacer layer 1206e, a p-GaAs resonator spacer layer 1206f, a p-AlAs selectively oxidized layer 1205, a p-GaAs resonator spacer layer 1206g, a p-GaAs contact/resonator spacer layer 1206h, and a non-doped GaAs resonator spacer layer 1206i. In this example, to reduce the absorption loss due to free carriers, the n-GaAs contact/resonator spacer layer 1206b is also provided at the location of the standing wave of oscillating light.

In the non-doped $Al_{0.8}Ga_{0.2}As$/GaAs upper semiconductor distributed Bragg reflector 1208, the non-doped AlAs selectively oxidized layer 1204 and the p-AlAs selectively oxidized layer 1205 are provided at locations corresponding to joints of the standing wave of the oscillating light in the resonance region 1211, as shown in FIG. 24. The non-doped AlAs selectively oxidized layer 1204 is thicker than the p-AlAs selectively oxidized layer 1205.

After the crystal growth of the above layers, a double square mesa is formed by a known photoengraving technique and a dry etching technique. Selective oxidation is then performed to form a selective oxide region 1212 and non-oxide regions 1213a and 1213b. Here, the sizes of the non-oxide regions 1213a and 1213b are controlled by adjusting the thicknesses of the AlAs selectively oxidized layers 1204 and 1205. The non-oxide region 1213a has a larger area than the non-oxide region 1213b. The selective oxidation structure that includes the smaller non-oxide region 1213b serves as an optical mode control structure.

A p-side electrode 1214 and an n-side electrode 1215 are then formed to thereby complete the surface-emitting laser diode of FIG. 23.

The intra-cavity contact-type surface-emitting laser diode of FIG. 23 does not guide current via the upper semiconductor distributed Bragg reflector 1208. The non-oxide region 1213b provided in the non-doped $Al_{0.8}Ga_{0.2}As$/GaAs upper semiconductor distributed Bragg reflector 1208 does not adversely affect the resistance. Thus, the device resistance constantly remains very low. Also, with the non-oxide region 1213b provided in the non-doped $Al_{0.8}Ga_{0.2}As$/GaAs upper semiconductor distributed Bragg reflector 1208, transverse-mode control can be performed, and single fundamental transverse-mode oscillation can be achieved with high outputs.

This surface-emitting laser diode of FIG. 23 can thus perform high-output operations, and actually has high outputs, while maintaining single fundamental transverse-mode oscillation.

In this device of Example 12, the upper and lower semiconductor distributed Bragg reflectors are both non-doped, and accordingly, the light absorption loss is minimized. Thus, a long-wave band intra-cavity contact-type surface-emitting laser diode with an excellent performance can be obtained.

Example 13

Figure 25:
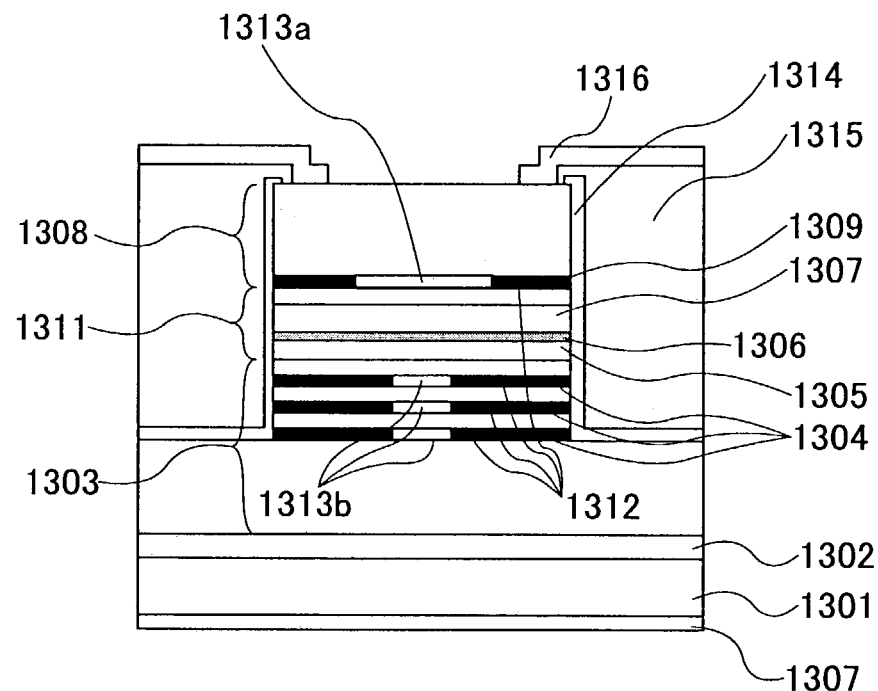
FIG. 25 illustrates the structure of a surface-emitting laser diode of Example 13 of the present invention.

FIG. 25 illustrates a surface-emitting laser diode of Example 13 of the present invention. The surface-emitting laser diode shown in FIG. 25 is a 0.85 μm band surface-emitting laser diode having a GaAs/$Al_{0.15}Ga_{0.85}As$ multi-quantum well structure as an active layer. This device of Example 13 has two or more selective oxidation structures each having a small-area non-oxidized (conductive) region that is provided in the n-$Al_{0.9}Ga_{0.1}As$/$Al_{0.15}Ga_{0.85}As$ lower semiconductor distributed Bragg reflector in the device of Example 1. In the following, this structure will be described in detail.

The device of FIG. 25 has the same layer structure as the device of Example 1, except for the number of n-AlAs selectively oxidized layers 1304 provided in an n-$Al_{0.9}Ga_{0.1}As$/$Al_{0.15}Ga_{0.85}As$ lower semiconductor distributed Bragg reflector 1303. The layers in the layer structure of this example are also formed through crystal growth. The device of FIG. 25 has three n-AlAs selectively oxidized layers 1304.

Figure 26:
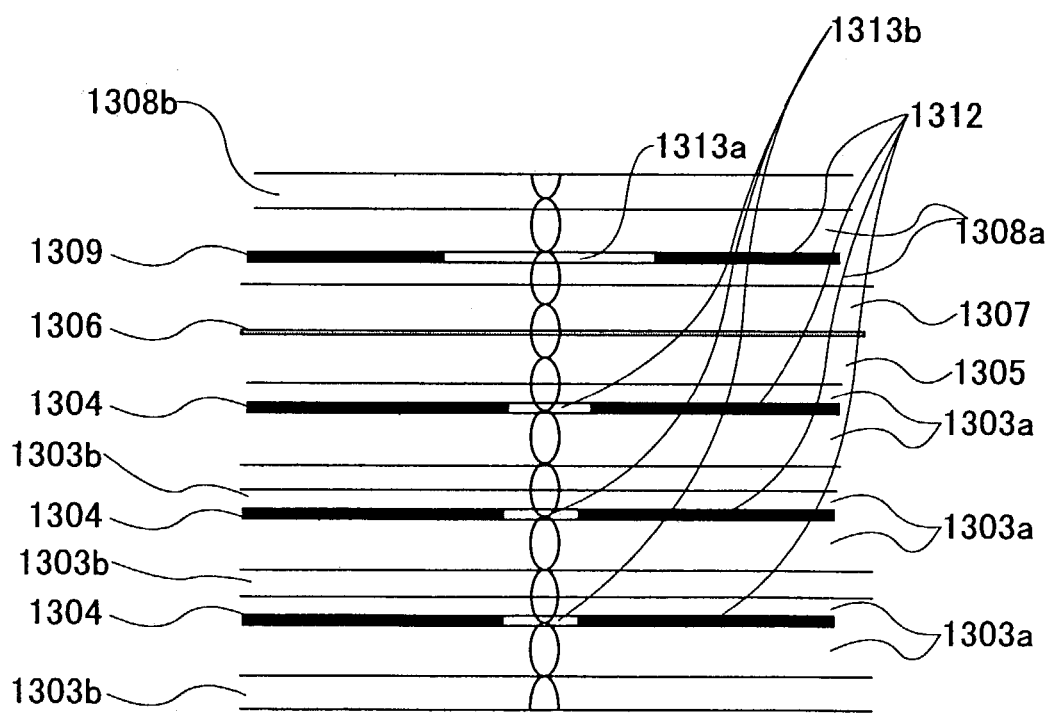
FIG. 26 illustrates the surrounding area of the resonance region of the surface-emitting laser diode of FIG. 25.

FIG. 26 illustrates the region surrounding the resonance region of the surface-emitting laser diode of FIG. 25 in greater detail. More specifically, FIG. 26 shows three periods of the n-$Al_{0.9}Ga_{0.1}As$/$Al_{0.15}Ga_{0.85}As$ lower semiconductor distributed Bragg reflector 1303 each formed by an n-$Al_{0.9}Ga_{0.1}As$ lower semiconductor distributed Bragg reflector low refraction layer 1303a and an n-$Al_{0.15}Ga_{0.85}As$ lower semiconductor distributed Bragg reflector high refraction layer 1303b, a resonance region 1311 provided above the three periods of the n-$Al_{0.9}Ga_{0.1}As$/$Al_{0.15}Ga_{0.85}As$ lower semiconductor distributed Bragg reflector 1303, and one period of a p-$Al_{0.9}Ga_{0.1}As$/$Al_{0.15}Ga_{0.85}As$ upper semiconductor distributed Bragg reflector 1308 formed by a p-$Al_{0.9}Ga_{0.1}As$ upper semiconductor distributed Bragg reflector low refraction layer 1308a and a p-$Al_{0.15}Ga_{0.85}As$ upper semiconductor distributed Bragg reflector high refraction layer 1308b;

In the surface-emitting laser diode of FIG. 25, one n-AlAs selectively oxidized layer 1304 is formed in each n-$Al_{0.9}Ga_{0.1}As$ lower semiconductor distributed Bragg reflector low refraction layer 1303a, starting from the one closest to the resonance region 1311, as shown in FIG. 26. There are three n-AlAs selectively oxidized layers 1304 in total. Each of the n-AlAs selectively oxidized layers 1304 is located at a joint of the standing wave of oscillating light, and is thicker than a p-AlAs selectively oxidized layer 1309.

In the device of FIG. 25, after the crystal growth of the above layers, a mesa is formed, and selective oxidation is performed to form a selective oxide region 1312 and non-oxide regions 1313a and 1313b. As each of the n-AlAs selectively oxidized layers 1304 is thicker than the p-AlAs selectively oxidized layer 1309, the non-oxide region 1313a has a larger area than each non-oxide region 1313b. Here, the selective oxidation structures that include the non-oxide regions 1313b serve as high-order transverse-mode suppressing layers.

After the above selective oxidation, a $SiO_2$ insulating layer 1314, insulating resin 1315, a p-side electrode 1316, and an n-side electrode 1317 are formed to thereby complete the surface-emitting laser diode of FIG. 25.

This surface-emitting laser diode of FIG. 25 can perform high-output operations, and actually has high outputs, while maintaining single fundamental transverse-mode oscillation. The surface-emitting laser diode of FIG. 25 has two or more (three) selective oxidation structures each including a non-oxide region 1313b in the n-$Al_{0.9}Ga_{0.1}As/Al_{0.15}Ga_{0.85}As$ lower semiconductor distributed Bragg reflector. With this structure, the transverse-mode selecting capacity is increased, and single fundamental transverse-mode oscillation can be achieved with high outputs.

As described above, a long-wave band surface-emitting laser diode with an excellent performance can be obtained.

Example 14

Figure 27:
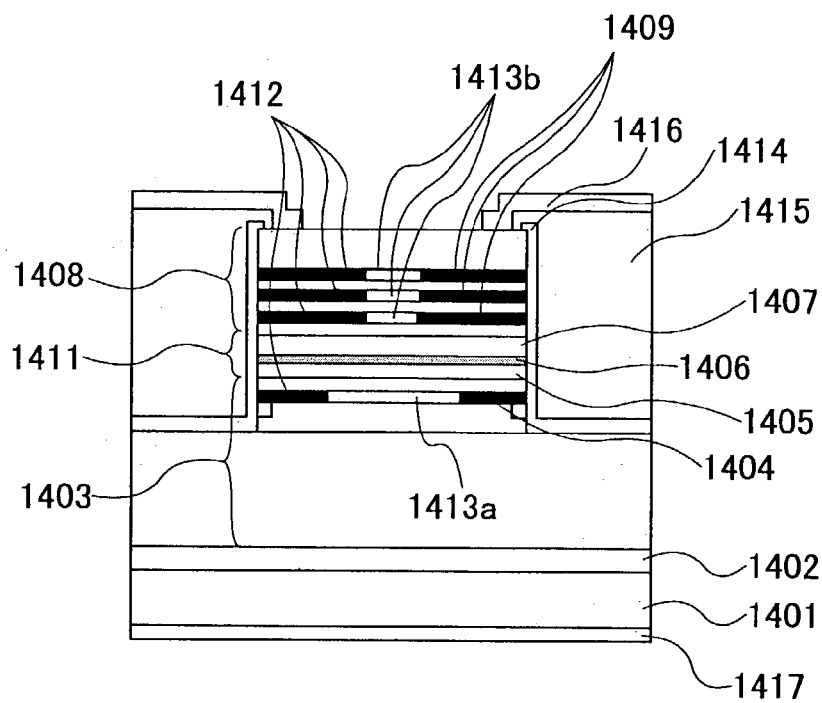
FIG. 27 illustrates the structure of a surface-emitting laser diode of Example 14 of the present invention.

FIG. 27 illustrates a surface-emitting laser diode of Example 14 of the present invention. The surface-emitting laser diode shown in FIG. 27 is a 0.85 μm band surface-emitting laser diode having a GaAs/$Al_{0.15}Ga_{0.85}As$ multi-quantum well structure as an active layer. This device of Example 14 has the same layer structure as the device of Example 5, except that there are two or more selective oxidation structures each including a non-oxidized (conductive) region having a small area in the n-$Al_{0.9}Ga_{0.1}As/Al_{0.15}Ga_{0.85}As$ upper semiconductor distributed Bragg reflector. This device of Example 14 also has the same structure as the device of Example 13, except that the conductivity types of the upper and lower layer structures sandwiching the active layer are reversed. In the following, the structure of this device will be described in detail.

The device of FIG. 27 has the same layer structure as the device of Example 5, except for the number of n-AlAs selectively oxidized layers 1409 provided in an n-$Al_{0.9}Ga_{0.1}As/Al_{0.15}Ga_{0.85}As$ upper semiconductor distributed Bragg reflector 1408. The layers in the layer structure of this example are also formed through crystal growth. The device of FIG. 25 has three n-AlAs selectively oxidized layers 1409.

Figure 28:
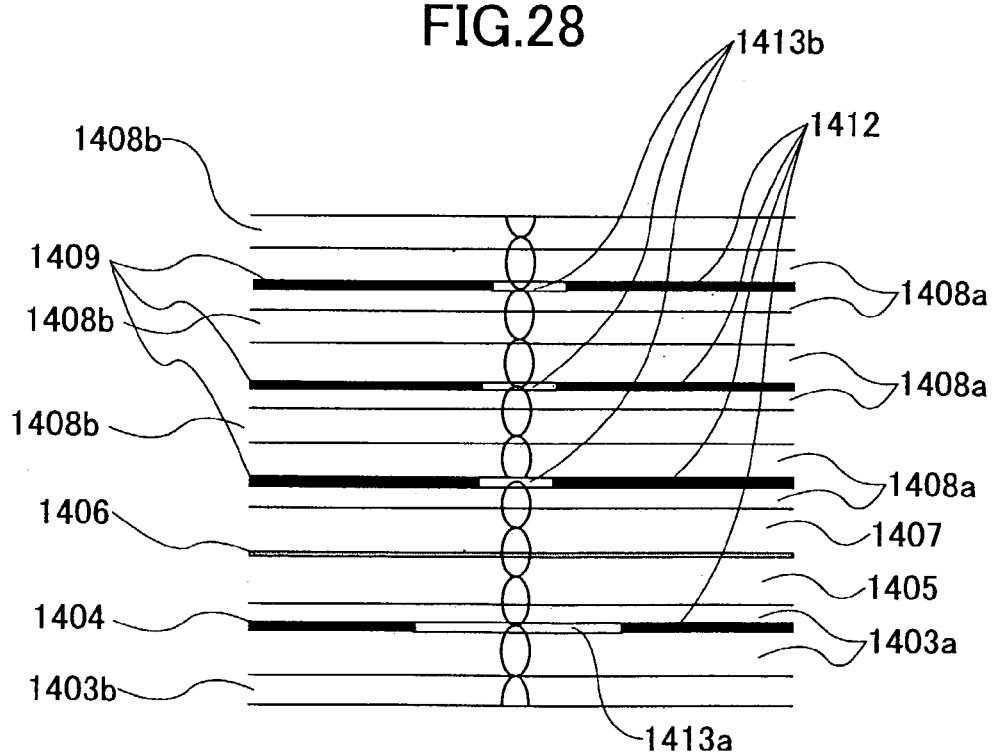
FIG. 28 illustrates the surrounding area of the resonance region of the surface-emitting laser diode of FIG. 27, in conjunction with the standing wave of oscillating light.

FIG. 28 illustrates the region surrounding the resonance region 1411 of the surface-emitting laser diode of FIG. 27 in greater detail. More specifically, FIG. 28 shows one period of a p-$Al_{0.9}Ga_{0.1}As/Al_{0.15}Ga_{0.85}As$ lower semiconductor distributed Bragg reflector 1403 formed by a p-$Al_{0.9}Ga_{0.1}As$ lower semiconductor distributed Bragg reflector low refraction layer 1403a and a p-$Al_{0.15}Ga_{0.85}As$ lower semiconductor distributed Bragg reflector high refraction layer 1403b, the resonance region 1411 provided above the one period of the p-$Al_{0.9}Ga_{0.1}As/Al_{0.15}Ga_{0.85}As$ lower semiconductor distributed Bragg reflector 1403, and three periods of the n-$Al_{0.9}Ga_{0.1}As/Al_{0.15}Ga_{0.85}As$ upper semiconductor distributed Bragg reflector 1408 each formed by an n-$Al_{0.9}Ga_{0.1}As$ upper semiconductor distributed Bragg reflector low refraction layer 1408a and an n-$Al_{0.15}Ga_{0.85}As$ upper semiconductor distributed Bragg reflector high refraction layer 1408b.

In the surface-emitting laser diode of FIG. 27, one n-AlAs selectively oxidized layer 1409 is formed in each n-$Al_{0.9}Ga_{0.1}As$ upper semiconductor distributed Bragg reflector low refraction layer 1408a, starting from the one closest to the resonance region 1411, as shown in FIG. 28. There are three n-AlAs selectively oxidized layers 1409 in total. Each of the n-AlAs selectively oxidized layers 1409 is located at a joint of the standing wave of oscillating light, as shown in FIG. 28, and is thicker than a p-AlAs selectively oxidized layer 1404.

In the device of FIG. 27, after the crystal growth of the above layers, a mesa is formed, and selective oxidation is performed to form a selective oxide region 1412 and non-oxide regions 1413a and 1413b. As each of the n-AlAs selectively oxidized layers 1409 is thicker than the p-AlAs selectively oxidized layer 1404, each non-oxide region 1413b has a smaller area than the non-oxide region 1413a. Here, the selective oxidation structures that include the non-oxide regions 1413b serve as high-order transverse-mode suppressing layers.

After the above selective oxidation, a $SiO_2$ insulating layer 1414, insulating resin 1415, a p-side electrode 1417, and an n-side electrode 1416 are formed to thereby complete the surface-emitting laser diode of FIG. 27.

This surface-emitting laser diode of FIG. 27 can perform high-output operations, and actually has high outputs, while maintaining single fundamental transverse-mode oscillation. The surface-emitting laser diode of FIG. 27 has two or more (three) selective oxidation structures each including a non-oxide region 1413b in the n-$Al_{0.9}Ga_{0.1}As/Al_{0.15}Ga_{0.85}As$ upper semiconductor distributed Bragg reflector. With this structure, the transverse-mode selecting capacity is increased, and single fundamental transverse-mode oscillation can be achieved with high outputs.

As described above, a long-wave band surface-emitting laser diode with an excellent performance can be obtained.

Example 15

Figure 29:
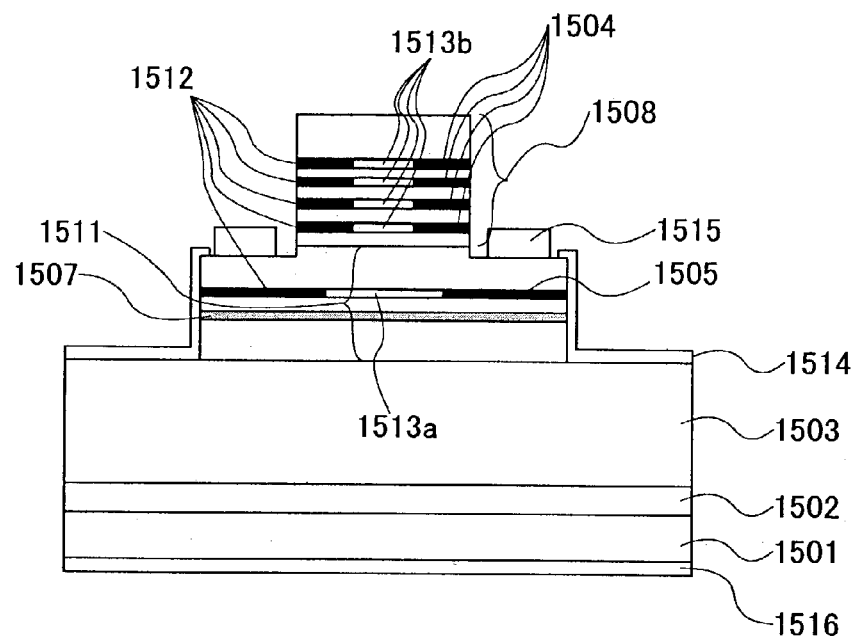
FIG. 29 illustrates the structure of a surface-emitting laser diode of Example 15 of the present invention.

FIG. 29 illustrates a surface-emitting laser diode of Example 15 of the present invention. The surface-emitting laser diode shown in FIG. 29 is a 1.3 μm band surface-emitting laser diode having a GaInNAs/GaAs multi-quantum well structure as an active layer. This device of Example 15 has the same structure as the device of Example 11, except that there are two or more selective oxidation structures each including a non-oxide region having a small area in the non-doped $Al_{0.8}Ga_{0.2}As$/GaAs upper semiconductor distributed Bragg reflector. In the following, this structure will be described in detail.

The device of FIG. 29 has the same layer structure as the device of Example 11, except for the number of n-AlAs selectively oxidized layers 1504 provided in a non-doped $Al_{0.8}Ga_{0.2}As$/GaAs upper semiconductor distributed Bragg reflector 1508. The layers in the layer structure of this example are also formed through crystal growth. The device of FIG. 29 has four n-AlAs selectively oxidized layers 1504.

Figure 30:
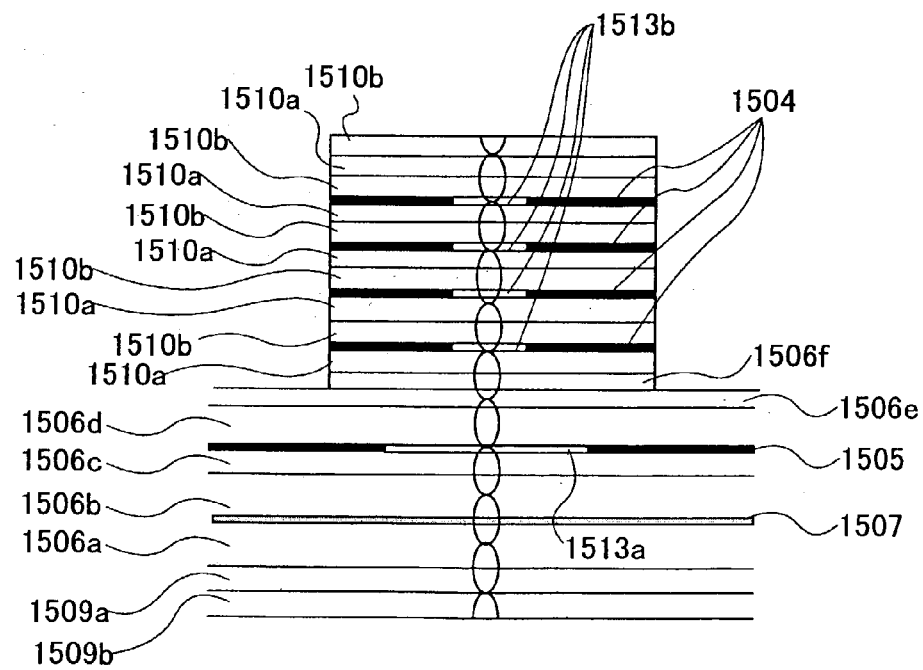
FIG. 30 illustrates the surrounding area of the resonance region of the surface-emitting laser diode of FIG. 29, in conjunction with the standing wave of oscillating light.

FIG. 30 illustrates the region surrounding the resonance region 1511 of the surface-emitting laser diode of FIG. 29 in greater detail. More specifically, FIG. 30 shows the resonance region 1511, one period of an n-AlAs/GaAs lower semiconductor distributed Bragg reflector 1503 formed by an n-AlAs lower semiconductor distributed Bragg reflector low refraction layer 1509a and an n-GaAs lower semiconductor distributed Bragg reflector high refraction layer 1509b, and five periods of the non-doped $Al_{0.8}Ga_{0.2}As$/GaAs upper semiconductor distributed Bragg reflector 1508 each formed by a non-doped $Al_{0.8}Ga_{0.2}As$ upper semiconductor distributed Bragg reflector low refraction layer 1510a and a non-doped GaAs upper semiconductor distributed Bragg reflector high refraction layer 1510b.

In the device of FIG. 29, after the formation of the n-AlAs/GaAs lower semiconductor distributed Bragg reflector 1503 through crystal growth, further crystal growth is carried out to form the resonance region 1511 and the non-doped $Al_{0.8}Ga_{0.2}As$/GaAs upper semiconductor distributed Bragg reflector 1508 in the same manner as in Example 11. The resonance region 1511 includes a non-doped GaAs resonator spacer layer 1506a, a GaInNAs/GaAs multi-quantum well structure 1507, a non-doped GaAs spacer layer 1506b, a p-GaAs spacer layer 1506c, a p-AlAs selectively oxidized layer 1505, a p-GaAs spacer layer 1506d, a p-GaAs contact/resonator spacer layer 1506e, and a non-doped GaAs spacer layer 1506f.

In the surface-emitting laser diode of FIG. 29, one non-doped AlAs selectively oxidized layer 1504 is formed in each non-doped $Al_{0.8}Ga_{0.2}As$ upper semiconductor distributed Bragg reflector low refraction layer 1510a, starting from the one closest to the resonance region 1511, as shown in FIG. 30. There are four non-doped AlAs selectively oxidized layers 1504 in total. Each of the non-doped AlAs selectively oxidized layers 1504 is located at a joint of the standing wave of oscillating light, as shown in FIG. 30, and is thicker than the p-AlAs selectively oxidized layer 1505.

In the device of FIG. 29, after the crystal growth of the above layers, a double mesa is formed, and selective oxidation is performed to form a selective oxide region 1512 and non-oxide regions 1513a and 1513b. Each side of each non-oxide region 1513b is 5 μm long, and each side of the non-oxide region 1513a is 10 μm long. Here, the selective oxidation structures that include the non-oxide regions 1513b serve as high-order transverse-mode suppressing layers.

The surface-emitting laser diode of FIG. 29 has the two or more (four) non-doped AlAs selectively oxidized layers 1504 in the non-doped $Al_{0.8}Ga_{0.2}As$/GaAs upper semiconductor distributed Bragg reflector 1508, and employs the two or more (four) non-oxide regions 1513b. With this structure, the transverse-mode selecting capacity is increased, and single fundamental transverse-mode oscillation can be achieved with high outputs. Furthermore, the device resistance is very low, because the non-oxide regions 1513a each having a small area are located outside the current passage.

As described above, a long-wave band surface-emitting laser diode with an excellent performance can be obtained.

Example 16

Figure 31:
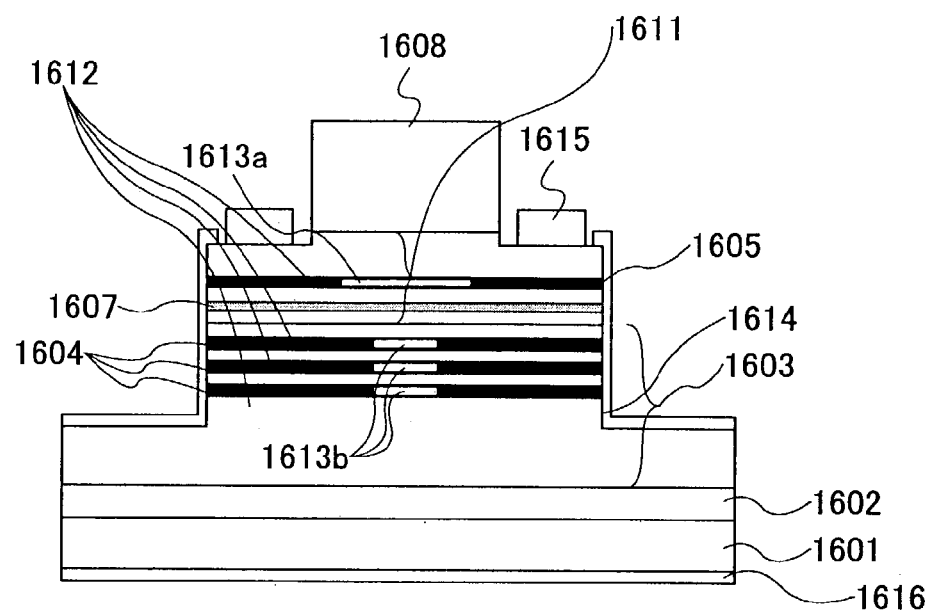
FIG. 31 illustrates the structure of a surface-emitting laser diode of Example 16 of the present invention.

FIG. 31 illustrates a surface-emitting laser diode of Example 16 of the present invention. The surface-emitting laser diode shown in FIG. 31 is a 1.3 μm band surface-emitting laser diode having a GaInNAs/GaAs multi-quantum well structure as an active layer. This device of Example 16 has the same structure as the device of Example 6, except that there are two or more selective oxidation structures each including a non-oxide region having a small area in the n-$Al_{0.8}Ga_{0.2}As$/GaAs lower semiconductor distributed Bragg reflector. In the following, this structure will be described in detail.

The device of FIG. 31 has the same layer structure as the device of Example 6, except for the number of n-AlAs selectively oxidized layers 1604 provided in an n-$Al_{0.8}Ga_{0.2}As$/GaAs lower semiconductor distributed Bragg reflector 1603. The layers in the layer structure of this example are also formed through crystal growth. The layer structure of a resonance region 1611 is exactly the same as the resonance region 611 of Example 6, and therefore explanation of the layer structure is omitted in this description. The device of FIG. 31 has three n-AlAs selectively oxidized layers 1604.

The surface-emitting laser diode of FIG. 31 includes an n-GaAs substrate 1601, an n-GaAs buffer layer 1602, the n-$Al_{0.8}Ga_{0.2}As$/GaAs lower semiconductor distributed Bragg reflector 1603, the resonance region 1611, and a non-doped $Al_{0.8}Ga_{0.2}As$/GaAs upper semiconductor distributed Bragg reflector 1608. These layers are formed through crystal growth in this order, with the n-GaAs substrate 1601 being at the bottom.

The resonance region 611 is formed by a GaAs resonator spacer layer 1606, a GaInNAs/GaAs multi-quantum well structure 1607, and a p-AlAs selectively oxidized layer 1605.

In this device of Example 16, each n-AlAs selectively oxidized layer 1604 is formed at each corresponding one of the joints of the standing wave of oscillating light, starting from the one closest to the resonance region 1611, in the n-$Al_{0.8}Ga_{0.2}As$/GaAs lower semiconductor distributed Bragg reflector 1603. There are three n-AlAs selectively oxidized layers 1604 in total. Each of the n-AlAs selectively oxidized layers 1604 is thicker than the p-AlAs selectively oxidized layer 1605. The thicknesses of the AlAs selectively oxidized layers 1604 and 1605 of two different types are adjusted so that each side of each non-oxide region 1613b becomes 5 μm long, and that each side of the non-oxide region 1613a becomes 10 μm long. Here, the selective oxidation structures that include the non-oxide regions 1613b serve as optical mode control structures.

The intra-cavity contact-type surface-emitting laser diode of FIG. 31 has two or more (three) oxidized layers in the lower distributed Bragg reflector, and employs two or more non-oxide regions 1613b. With this structure, the transverse-mode selecting capacity is increased, and single fundamental transverse-mode oscillation can be achieved with high outputs.

As described above, a long-wave band intra-cavity contact-type surface-emitting laser diode with an excellent performance can be obtained.

Example 17

Figure 32:
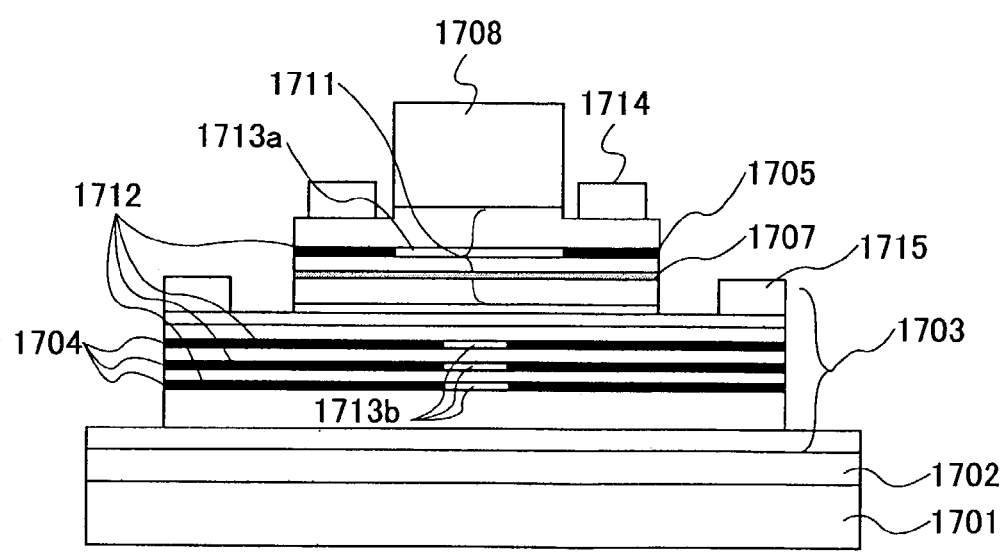
FIG. 32 illustrates the structure of a surface-emitting laser diode of Example 17 of the present invention.

FIG. 32 illustrates a surface-emitting laser diode of Example 17 of the present invention. The surface-emitting laser diode shown in FIG. 32 is a 1.3 μm band surface-emitting laser diode having a GaInNAs/GaAs multi-quantum well structure as an active layer. This device of Example 17 has the same structure as the device of Example 16, except that the p-side and n-side electrodes are both provided on the outer surface of the device. In the following, this structure will be described in detail.

The device of FIG. 32 has the same layer structure as the device of Example 16, except that the p-side and n-side electrodes are provided on the surface of the substrate. In this device, a non-doped $Al_{0.8}Ga_{0.2}As$/GaAs lower semiconductor distributed Bragg reflector 1703 is employed as the lower distributed Bragg reflector, and selectively oxidized layers 1704 each including a non-oxide region 1713b having a small area are located in the non-doped $Al_{0.8}Ga_{0.2}As/GaAs$ lower semiconductor distributed Bragg reflector 1703, not in a resonance region 1711. There are two or more (three) selectively oxidized layers 1704. The layer structure of the resonance region 1711 is substantially the same as the resonance region of Example 12, and therefore explanation of the layer structure is omitted in this description.

The surface-emitting laser diode of FIG. 32 includes a semi-insulating GaAs substrate 1701, a non-doped GaAs buffer layer 1702, the non-doped $Al_{0.8}Ga_{0.2}As/GaAs$ lower semiconductor distributed Bragg reflector 1703, the resonance region 1711, and a non-doped $Al_{0.8}Ga_{0.2}As/GaAs$ upper semiconductor distributed Bragg reflector 1708. These layers are formed through crystal growth in this order, with the semi-insulating GaAs substrate 1701 being at the bottom.

The resonance region 711 is formed by a GaAs resonator spacer layer 1706, a GaInNAs/GaAs multi-quantum well structure 1707, and a p-AlAs selectively oxidized layer 1705.

In this device of FIG. 32, each non-doped AlAs selectively oxidized layer 1704 is formed at each corresponding one of the joints of the standing wave of oscillating light, starting from the one closest to the resonance region 1711, in the non-doped $Al_{0.8}Ga_{0.2}As/GaAs$ lower semiconductor distributed Bragg reflector 1703. There are three non-doped AlAs selectively oxidized layers 1704 in total. Each of the non-doped AlAs selectively oxidized layers 1704 is thicker than the p-AlAs selectively oxidized layer 1705. The thicknesses of the AlAs selectively oxidized layers 1704 and 1705 of two different types are adjusted so that each side of each non-oxide region 1713b becomes 5 $\mu$m long, and that each side of the non-oxide region 1713a becomes 10 $\mu$m long.

In the device of FIG. 32, after the crystal growth of the layers, a mesa is formed, and selective oxidation is carried out to form a selective oxide region 1712 and the non-oxide regions 1713a and 1713b. As each of the non-doped AlAs selectively oxidized layers 1704 is thicker than the p-AlAs selectively oxidized layer 1705, the area of each non-oxide region 1713b is smaller than the area of the non-oxide region 1713a. Here, the selective oxidation structures that include the non-oxide regions 1713b serve as high-order transverse-mode suppressing layers.

The intra-cavity contact-type surface-emitting laser diode of FIG. 32 has two or more (three) oxidized layers in the non-doped $Al_{0.8}Ga_{0.2}As/GaAs$ lower semiconductor distributed Bragg reflector 1703, and employs two or more non-oxide regions 1713b. With this structure, the transverse-mode selecting capacity is further increased, and single fundamental transverse-mode oscillation can be achieved with high outputs. Also, the device resistance remains very low, because the non-oxide regions 1713b each having a small area is provided outside the current passage.

As described above, a long-wave band intra-cavity contact-type surface-emitting laser diode with an excellent performance can be obtained.

Example 18

Figure 33:
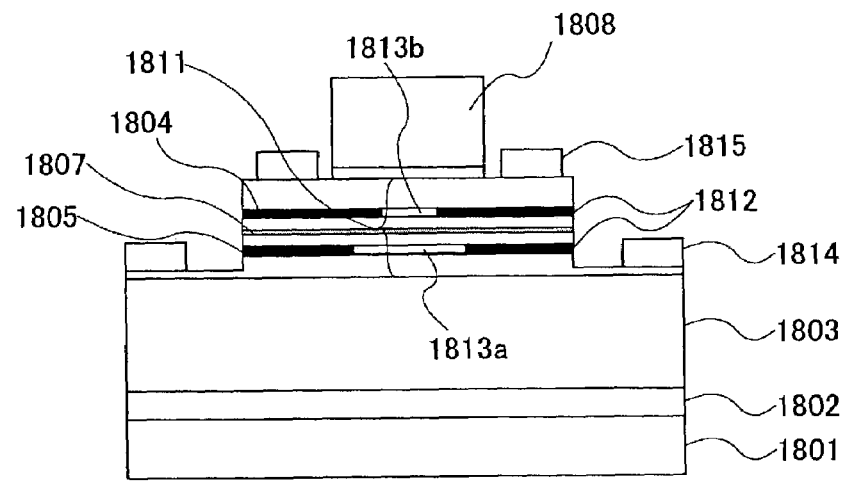
FIG. 33 illustrates the structure of a surface-emitting laser diode of Example 18 of the present invention.

FIG. 33 illustrates a surface-emitting laser diode of Example 18 of the present invention. The surface-emitting laser diode shown in FIG. 33 is a 1.3 $\mu$m band surface-emitting laser diode having a GaInNAs/GaAs multi-quantum well structure as an active layer. Each of the intra-cavity contact-type surface-emitting laser diodes of the foregoing example's has the n-conductivity at the substrate side in the resonance region. However, this device of Example 18 has the p-conductivity at the substrate side in the resonance region. In the following, this structure will be described in detail.

The device of FIG. 33 includes a semi-insulating GaAs substrate 1801, a non-doped GaAs buffer layer 1802, a 36-period non-doped AlAs/GaAs lower semiconductor distributed Bragg reflector 1803 having each combination of AlAs/GaAs as one period, a resonance region 1811, and a 20-period non-doped $Al_{0.8}Ga_{0.2}As/GaAs$ upper semiconductor distributed Bragg reflector 1808 having each combination of $Al_{0.8}Ga_{0.2}As/GaAs$ as one period. These layers are formed through crystal growth in this order, with the semi-insulating GaAs substrate 1801 being at the bottom.

Figure 34:
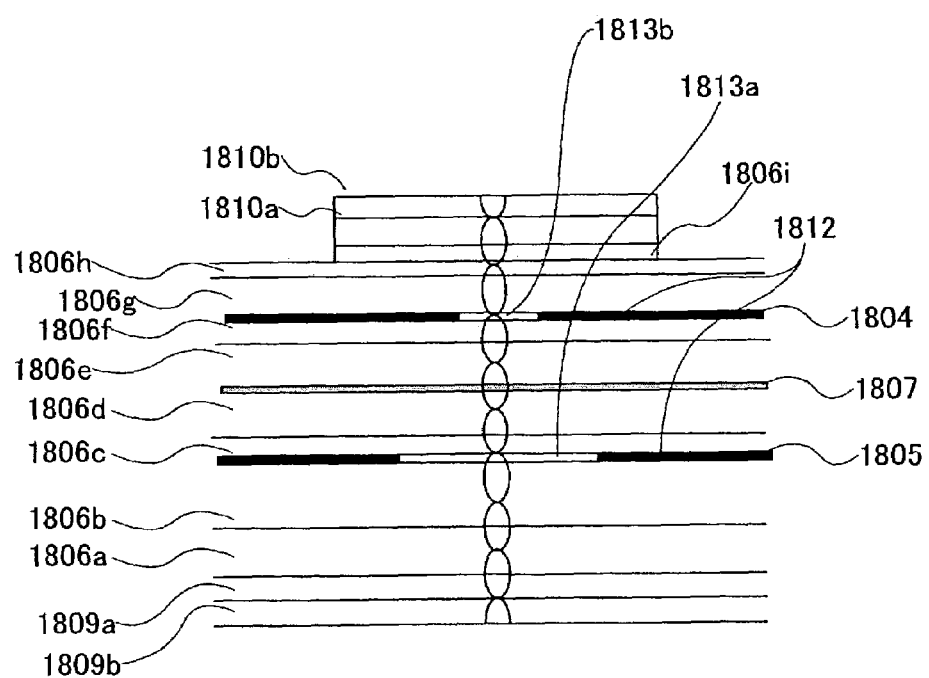
FIG. 34 illustrates the surrounding area of the resonance region of the surface-emitting laser diode of FIG. 33 in greater detail.

FIG. 34 illustrates the region surrounding the resonance region 1811 of the surface-emitting laser diode of FIG. 33 in greater detail. More specifically, FIG. 34 shows one period of the non-doped AlAs/GaAs lower semiconductor distributed Bragg reflector 1803 formed by a non-doped AlAs lower semiconductor distributed Bragg reflector low refraction layer 1809a and a non-doped GaAs lower semiconductor distributed Bragg reflector high refraction layer 1809b, one period of the non-doped $Al_{0.8}Ga_{0.2}As/GaAs$ upper semiconductor distributed Bragg reflector 1808 formed by a non-doped $Al_{0.8}Ga_{0.2}As$ upper semiconductor distributed Bragg reflector low refraction layer 1810a and a non-doped GaAs upper semiconductor distributed Bragg reflector high refraction layer 1810b, and the resonance region 1811 interposed between the one period of the non-doped AlAs/GaAs lower semiconductor distributed Bragg reflector 1803 and the one period of the non-doped $Al_{0.8}Ga_{0.2}As/GaAs$ upper semiconductor distributed Bragg reflector 1808.

After the non-doped AlAs/GaAs lower semiconductor distributed Bragg reflector 1803 is formed through crystal growth, further crystal growth is carried out to form the resonance region 1811 that includes a p-GaAs contact/resonator spacer layer 1806a, a p-GaAs resonator spacer layer 1806b, a p-AlAs selectively oxidized layer 1805, a p-GaAs resonator spacer layer 1806c, a non-doped GaAs resonator spacer layer 1806d, a GaInNAs/GaAs multi-quantum well structure 1807, a non-doped GaAs resonator spacer layer 1806e, an n-GaAs resonator spacer layer 1806f, an n-AlAs selectively oxidized layer 1804, an n-GaAs resonator spacer layer 1806g, an n-GaAs contact/resonator spacer layer 1806h, and non-doped GaAs resonator spacer layer 1806i.

In the device of FIG. 33, after the crystal growth of the layers, a double mesa is formed, and selective oxidation is performed to form a selective oxide region 1812 and non-oxide regions 1813a and 1813b.

In the selective oxidizing process for the device of FIG. 33, the n-AlAs selectively oxidized layer 1804 is made thicker than the p-AlAs selectively oxidized layer 1805, so that the area of the non-oxidized (conductive) region 1813a that is to serve as the hole passage becomes larger than the area of the non-oxidized (conductive) region 1813b that is to serve as the electron passage. More specifically, each side of the non-oxidized (conductive) region 1813b that is to serve as the electron passage is 3 $\mu$m long, while each side of the non-oxidized (conductive) region 1813a that is to serve as the hole passage is 10 $\mu$m long. Here, the selective oxidation structure including the non-oxide region 1813b serves as an optical mode control structure.

The device of FIG. 33 also has a low resistance and high outputs, while maintaining single fundamental transverse-mode oscillation.

It is possible for the other devices of the foregoing examples to employ this structure having the p-type conductivity on the substrate side of the active layer. This structure having the p-type conductivity on the substrate side of the active layer can also be applied to devices other than the devices of the foregoing examples.

Although a MOCVD technique is used for crystal growth in each of the foregoing examples, it is also possible to use other crystal growth techniques such as a molecular beam epitaxy (MBE) technique. Also, a p-type substrate can be employed, instead of an n-type substrate or a semi-insulating substrate. The oscillation wavelength band may be 1.5 $\mu$m, for example, other than the above mentioned wavelength bands of 670 nm, 0.98 $\mu$m, 1.3 $\mu$m, and 0.85 $\mu$m. Also, the semiconductor materials that constitute the devices of the foregoing examples may be replaced with other materials, depending on the oscillation wavelength. The device structure of each of the foregoing examples may be modified. The materials for the distributed Bragg reflectors may also be optimally changed, depending on the oscillation wavelength. Thus, a device that is optimally suitable for the oscillation wavelength can be formed in accordance with any one of the foregoing examples.

The materials that form distributed Braff reflectors such as dielectric reflectors can be replaced with other materials. Also, the lengths and structures of the resonators can be changed. To reduce the device resistance, it is effective to employ a heterospike buffer layer on the heterointerface of Al(Ga)As/GaAs or the like, as a heterospike buffer layer has such a composition. A heterospike buffer layer may be provided on the interface with a selectively oxidized layer or the like. Examples of a heterospike buffer layer include a single layer that has the compositions of the two layers that form a heterointerface, a multi-layer structure containing different compositions, and a layer having a composition continually changed.

Example 19

Figure 35:
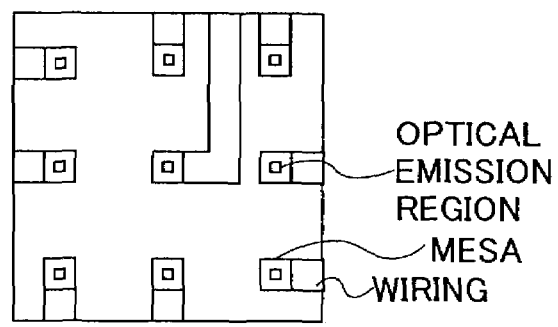
FIG. 35 illustrates the structure of a surface-emitting laser diode array of Example 19 of the present invention.

FIG. 35 illustrates a surface-emitting laser diode array of Example 19 of the present invention. More specifically, FIG. 35 is a top view of a monolithic laser diode array that two-dimensionally integrates 4×4 surface-emitting laser diodes of the present invention. In the example shown in FIG. 35, wiring is provided to each upper electrode so as to drive each device independently. The surface-emitting laser diode array of FIG. 35 is fabricated in the same manner and by the same method as in each of the foregoing examples.

Each of the devices that constitute the surface-emitting laser diode of FIG. 35 has a high-order transverse-mode suppressing layer that is formed by a selective oxidation structure having a small non-oxide region in the electron passage or in a non-conductive region. This high-order transverse-mode suppressing layer suppresses high-order transverse-mode oscillation, without an increase of the device resistance. Each device also has a selective oxidation structure having a large non-oxide region in a p-type distributed Bragg reflector. This selective oxidation structure restricts the hole-restricting region to the center of the mesa, without a rapid increase of the device resistance. Accordingly, each device has a low resistance and a wider oscillation region. With these devices, single fundamental transverse-mode oscillation can be achieved with high outputs, while suppressing heat generation. Thus, a surface-emitting laser diode array that performs high-output operations in the single transverse mode can be obtained.

Example 20

Figure 36:
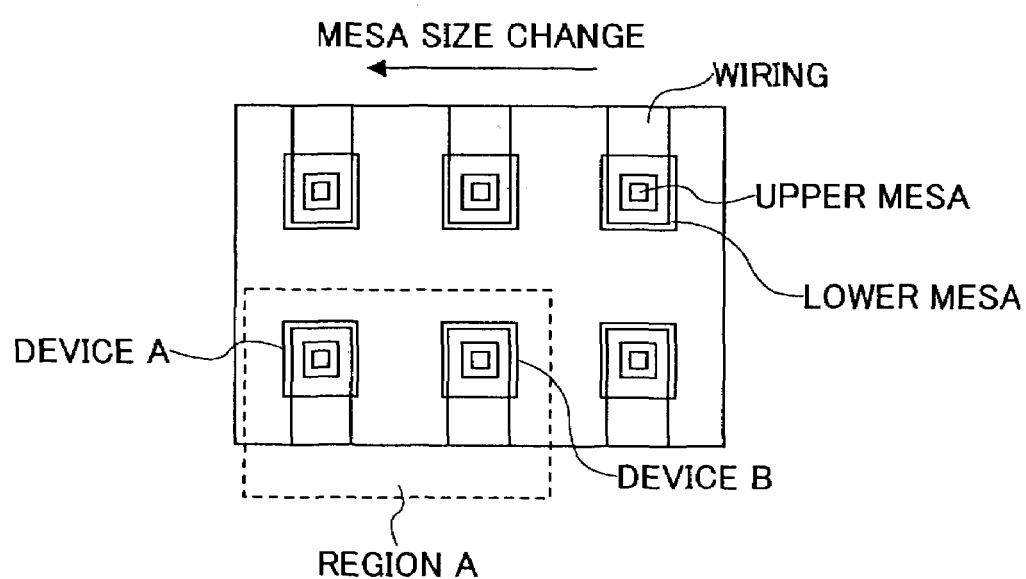
FIG. 36 illustrates the structure of a multi-wave surface-emitting laser diode array of Example 20 of the present invention.
Figure 37:
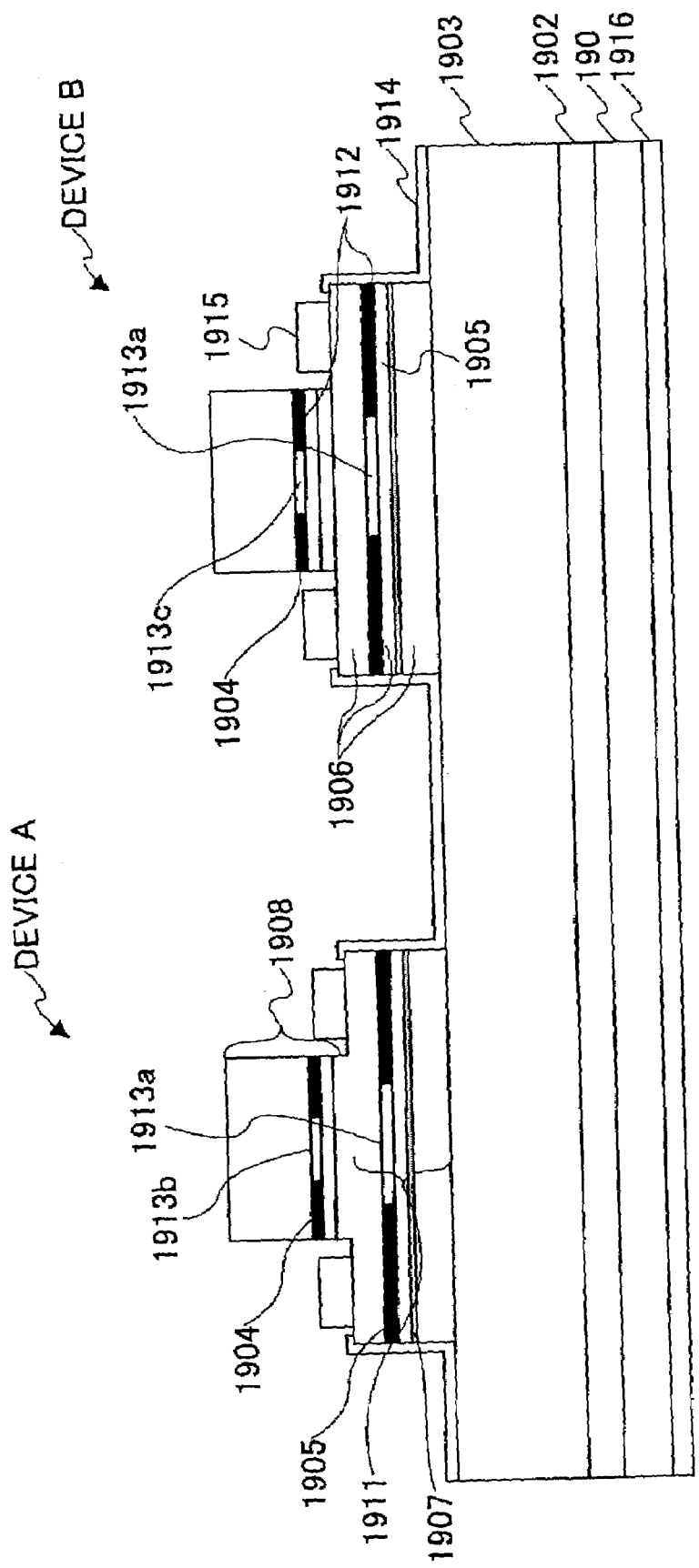
FIG. 37 also illustrates the structure of the multi-wave surface-emitting laser diode array of Example 20 of the present invention.

FIGS. 36 and 37 illustrate a multi-wave surface-emitting laser diode array of Example 20 of the present invention. FIG. 36 shows the multi-wave surface-emitting laser diode array that is formed by 2×3 1.55 $\mu$m band surface-emitting laser diodes each having a GaInNAsSb/GaAs multi-quantum well structure as an active layer. FIG. 37 illustrates the structures of two neighboring devices A and B in a region A in the multi-wave surface-emitting laser diode array of FIG. 36.

Each of the 1.55 $\mu$m band surface-emitting laser diodes of the multi-wave surface-emitting laser diode array of Example 20 has the same structure as the surface-emitting laser diode of Example 11, as can be seen from FIG. 37. However, the thicknesses of the layers that form each surface-emitting laser diode are adjusted so as to conform to the oscillation wavelength band of 1.55 $\mu$m. As can be seen from FIG. 37, each device of the multi-wave surface-emitting laser diode array of Example 20 has an intra-cavity contact structure in which the electrode for confining carries is provided on a semiconductor layer in the surface-emitting laser diode, and has a selective oxidation structure for transverse-mode oscillation control in a region that does not meet the carrier conduction region.

This multi-wave surface-emitting laser diode array of Example 20 also has a p-side electrode on the upper surface of each surface-emitting laser diode, so that each surface-emitting laser diode can be driven independently. Further, an n-side common electrode is provided on the bottom surface of the substrate.

In this multi-wave surface-emitting laser diode array of Example 20, the mesa sizes of the surface-emitting laser diodes differ from one another. In FIG. 36, the upper mesa sizes gradually become greater toward the left. Between the two neighboring devices A and B shown in FIG. 37, for instance, the mesa size of the device A is greater than the mesa size of the device B.

In the following, the structure of this multi-wave surface-emitting laser diode array of Example 20 will be described in greater detail. Each surface-emitting laser diode shown in FIG. 37 is formed by n-GaAs substrate 1901, an n-GaAs buffer layer 1902, an n-Al$_{0.8}$Ga$_{0.2}$As/GaAs lower semiconductor distributed Bragg reflector 1903, a resonance region 1911, and a non-doped Al$_{0.8}$Ga$_{0.2}$As/GaAs upper semiconductor distributed Bragg reflector 1908. These layers are formed in this order through crystal growth, with the substrate 1901 being at the bottom.

Here, the non-doped Al$_{0.8}$Ga$_{0.2}$As/GaAs upper semiconductor distributed Bragg reflector 1908 has a non-doped AlAs selectively oxidized layer 1904 formed therein.

Like the resonance region of Example 6, the resonance region 1911 is formed by a GaAs resonator spacer layer 1906, a GaInNAsSb/GaAs multi-quantum well structure 1907, and a p-AlAs selectively oxidized layer 1905. The p-AlAs selectively oxidized layer 1905 is thinner than the non-doped AlAs selectively oxidized layer 1904. The layer structure of the resonance region 1911 is the same as the layer structure of the resonance region of Example 6.

Etching is then performed twice to form a double square mesa for each device by the same known photoengraving technique and the same known etching technique as the techniques utilized in each of the foregoing examples. Here, the upper mesa sizes are varied in the surface-emitting laser diode array. In FIG. 37, the upper mesa size of the device A is greater than the upper mesa size of the device B, as already mentioned. After that, selective oxidation is performed on the two selectively oxidized layers 1905 and 1904, to thereby form a selective oxide region 1912 and non-oxide regions 1913a and 1913b/1913c.

Being relatively thicker than the non-doped AlAs selectively oxidized layer 1904, the p-AlAs selectively oxidized layer 1905 has a higher oxidation rate than the non-doped selectively oxidized layer 1904. The area of the non-oxide region 1913a is larger than the area of the non-oxide region 1013b/1913c. The oxidation rate of the non-doped AlAs selectively oxidized layer 1904 of the device A is the same as the oxidation rate of the non-doped AlAs selectively oxidized layer 1904 of the device B. However, as the upper mesa size of the device A is greater than the upper mesa size of the device B, the area of the non-oxide region 1913b is larger than the area of the non-oxide region 1913c. Here, each selective oxidation structure that includes the non-oxide region 1913b/1913c serves as an optical mode control structure.

In the multi-wave surface-emitting laser diode array of FIG. 36, the upper mesa sizes of the surface-emitting laser diodes that constitute the array are different from one another. Likewise, the areas of the non-oxide regions formed in the non-doped AlAs selectively oxidized layers 1904 are different from one another, as already mentioned.

A $SiO_2$ insulating layer 1914 is then formed for each of the surface-emitting laser diodes, and a p-side electrode 1915 is formed by a vapor deposition technique and a lift-off technique for each of the surface-emitting laser diodes. An n-side electrode 1916 is then deposited on the bottom surface of the substrate, and Ohmic conduction is carried out through annealing, to thereby complete the multi-wave surface-emitting laser diode array of FIGS. 36 and 37.

In the surface-emitting laser diode array of FIG. 36, the areas of the non-oxide regions of the optical mode control structures of the surface-emitting laser diodes are different from one another, and accordingly, the oscillation wavelengths of the surface-emitting laser diodes are different from one another. A surface-emitting laser diode having a smaller non-oxide region in the optical mode control structure can attain greater oscillation in a short-wave band area. The wavelength intervals among the surface-emitting laser diodes that constitute the multi-wave surface-emitting laser diode array of Example 20 are 1 nm, and attain oscillation wavelengths of 1546 nm to 1553 nm.

In each of the surface-emitting laser diodes of FIG. 36, current confining is not performed via the upper semiconductor distributed Bragg reflector, which is a non-doped type. As a p-type distributed Bragg reflector that has high light absorptivity is not employed in each of the surface-emitting laser diodes of FIG. 36, the surface-emitting laser diode array has only a small loss. Also, the oscillation threshold current is low, and the slope efficiency is high. The surface-emitting laser diode array can also have high outputs.

Since the optical mode control structure is provided in the non-doped $Al_{0.8}Ga_{0.2}As$/GaAs upper semiconductor distributed Bragg reflector 1908 in each surface-emitting laser diode, the non-oxide region 1913b/1913c does not affect the device resistance. Accordingly, each of the surface-emitting laser diode has a very low resistance, and generates little heat. The surface-emitting laser diodes of FIG. 36 can thus perform high-output operations. Also, the current restriction in each of the surface-emitting laser diodes of FIG. 36 is performed by the selective oxidation structure formed through selective oxidation performed on the p-AlAs selectively oxidized layer 1905 provided in the resonance region. By doing so, variations of the oscillation threshold current and operation voltage among the surface-emitting laser diodes can be made very small within the array. Thus, a multi-wave surface-emitting laser diode array of uniform characteristics can be obtained. This multi-wave surface-emitting laser diode array of Example 20 can have high outputs, while maintaining single fundamental transverse-mode oscillation.

Although a multi-wave surface-emitting laser diode array that includes 2×3 surface-emitting laser diodes has been described, it is possible to employ a different array structure (having a different number of devices, or a different layout of devices).

Example 21

Figure 38:
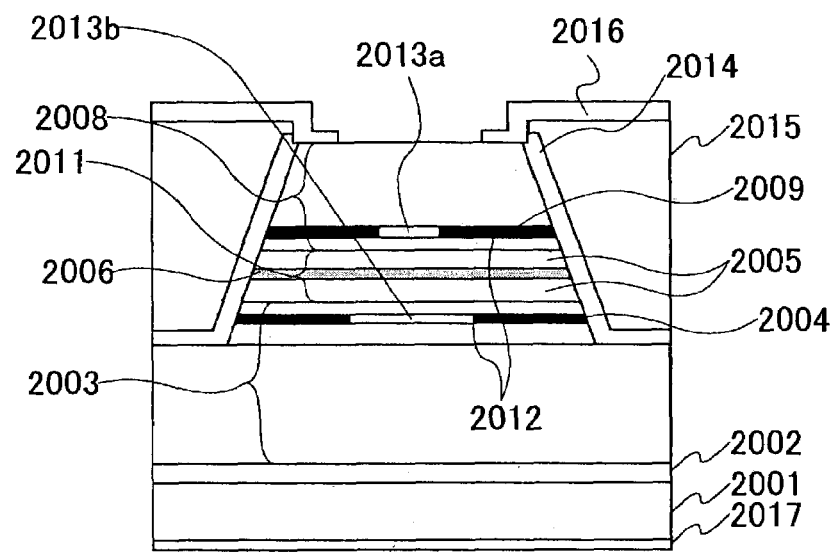
FIG. 38 illustrates the structure of a surface-emitting laser diode of Example 21 of the present invention.

FIG. 38 illustrates a surface-emitting laser diode of Example 21 of the present invention. The surface-emitting laser diode shown in FIG. 38 is a 1.3 μm band surface-emitting laser diode that has a GaInNAs/GaAs multi-quantum well structure as an active layer, and is formed on a p-type semiconductor substrate, which is the same as in Example 5. The structure of this surface-emitting laser diode of Example 21 is the same as the structure of the device of Example 5, except for the oscillation wavelength, the materials for the active layer, and the composition of semiconductor materials that form the distributed Bragg reflectors. In short, the structure of this example is fundamentalally the same as the structure described in Example 5. However, the thicknesses of the layers are adjusted based on the oscillation wavelength. Also, the composition of the semiconductor materials that form the semiconductor distributed Bragg reflectors is made transparent with respect to the oscillation wavelength.

As shown in FIG. 38, the width of the mesa of the surface-emitting laser diode of Example 21 is smaller at the top and is greater at the bottom (a tapered shape). In the following, this structure will be described in detail.

The surface-emitting laser diode of FIG. 38 includes: a p-GaAs substrate 2001; a p-GaAs buffer layer 2002; a 36-period p-$Al_{0.9}Ga_{0.1}As$/GaAs lower semiconductor distributed Bragg reflector 2003 having each combination of $Al_{0.9}Ga_{0.1}As$/GaAs as one period; a resonance region 2011 that is formed by a GaAs resonator spacer 2005 and a GaInNAs/GaAs multi-quantum well active layer 2006; and a 26-period n-$Al_{0.9}Ga_{0.1}As$/GaAs upper semiconductor distributed Bragg reflector 2008. These layers are formed in this order through crystal growth, with the substrate 2001 being at the bottom.

The p-$Al_{0.9}Ga_{0.1}As$/GaAs lower semiconductor distributed Bragg reflector 2003 and the n-$Al_{0.9}Ga_{0.1}As$/GaAs upper semiconductor distributed Bragg reflector 2008 include a p-AlAs selectively oxidized layer 2004 and an n-AlAs selectively oxidized layer 2009, respectively. The AlAs selectively oxidized layers 2004 and 2009 have the same thickness (20 nm). The structure of the resonance region 2011 is the same as the resonance region of Example 5.

In the device of FIG. 38, after the crystal growth of the layers, a resist mask is formed by a known photoengraving technique. The square mesa having the tapered shape shown in FIG. 38 is then formed. To form such a tapered shape through etching, a known area gradation mask is employed as a photomask in forming the resist mask, or the dry etching conditions are optimally adjusted. In this device of Example 21, the convex resist mask is formed with an area gradation mask, followed by etching. A wet etching technique may also be utilized to form the tapered mesa. In that case, the conditions such as the mask shape, the etching liquid, the etching technique, should be selected suitably for the wet etching.

After the formation of the tapered mesa, selective oxidation is performed on the p-AlAs partially oxidize layer 2004 and the n-AlAs selectively oxidized layer 2009, to thereby form a selective oxide region 2012 and non-oxidized (conductive) regions 2013$a$ and 2013$b$ that have different areas. Here, the selective oxidation structure that includes the non-oxide region 2013$b$ serves as a high-order transverse-mode suppressing layer, and the selective oxidation structure that includes the non-oxide region 2013$a$ serves as a hole restricting layer.

As the surface-emitting laser diode of Example 21 has the tapered mesa, the part of the mesa that includes the p-AlAs selectively oxidized layer 2004 forming the hole confining structure through the selective oxidation is greater in size than the part of the mesa that includes the n-AlAs selectively oxidized layer 2009 forming the high-order transverse-mode suppressing layer through the selective oxidation. Accordingly, after the oxidation of the same lengths in the selectively oxidized layers 2004 and 2009 at the same oxidation rate, the p-AlAs selectively oxidized layer 2004 that is located in an antinode of the mesa has the larger non-oxide region 2013$b$ by virtue of the differences in mesa size. Thus, the area of the non-oxidized (conductive) region 2013$b$ in the electron passage is smaller than the area of the non-oxidized (conductive) region 2013$a$ in the hole passage.

After the selective oxidation, an insulating region including a $SiO_2$ insulating 2014 and insulating resin 2015 is formed. A p-side electrode 2016 and an n-side electrode 2017 are then formed to complete the surface-emitting laser diode of FIG. 38.

The surface-emitting laser diode of FIG. 38 can have high outputs, while maintaining single fundamental transverse-mode oscillation.

As described above, instead of two or more mesas of different sizes that have vertical etching sides, a tapered mesa in which the mesa size is tapered can be employed in the present invention.

Example 22

Figure 39:
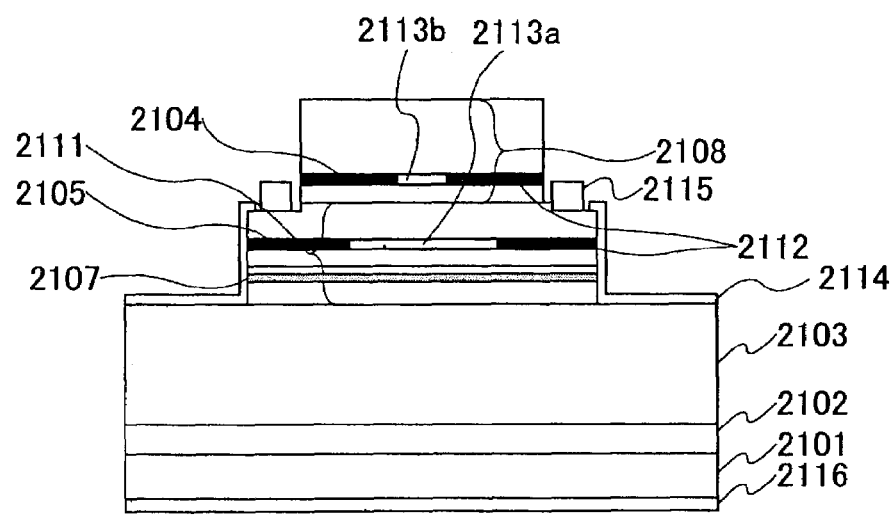
FIG. 39 illustrates the structure of a surface-emitting laser diode of Example 22 of the present invention.

FIG. 39 illustrates a surface-emitting laser diode of Example 22 of the present invention. The surface-emitting laser diode shown in FIG. 39 is a 0.85 $\mu$m band surface-emitting laser diode having a GaAs/$Al_{0.15}Ga_{0.85}As$ multi-quantum well structure as an active layer. This surface-emitting laser diode of FIG. 39 has an intra-cavity contact structure in which the electrode for confining carriers is provided on a semiconductor layer in the device. Also, this device of Example 22 has the selective oxidation structure for transverse-mode oscillation control in a region that does not meet the carrier conduction region.

The structure of the surface-emitting laser diode of FIG. 39 is the same as the device of Example 11, except for the oscillation wavelength, the materials for the active layer, the resonator spacer layers, and the composition of semiconductor materials that form distributed Bragg reflectors. In short, the layer structure of this example is fundamentalally the same as the layer structure described in Example 11. However, the thickness of each layer is adjusted based on the oscillation wavelength. Also, the composition of the semiconductor materials that form the semiconductor distributed Bragg reflectors are made transparent with respect to the oscillation wavelength. More specifically, the GaAs resonator spacer of Example 11 is replaced by an $Al_{0.15}Ga_{0.85}As$ resonator spacer layer, and the upper and lower $Al_{0.8}Ga_{0.2}As$/GaAs semiconductor distributed Bragg reflectors of Example 11 are replaced by $Al_{0.9}Ga_{0.1}As$/$Al_{0.15}Ga_{0.85}As$ semiconductor distributed Bragg reflectors. The thickness of each layer is adjusted so as to satisfy the resonance conditions with respect to the oscillation wavelength.

The surface-emitting laser diode of FIG. 39 also includes two selective oxidation structures having different non-oxide regions that are formed through selective oxidation performed on selectively oxidized layers contained in mesas of different sizes, respectively. In the following, this structure will be described in detail.

The device of FIG. 39 includes an n-GaAs substrate 2101, an n-GaAs buffer layer 2102, an n $Al_{0.9}Ga_{0.1}As$/$Al_{0.15}Ga_{0.85}As$ lower semiconductor distributed Bragg reflector 2103, a resonance region 2111, and a non-doped $Al_{0.9}Ga_{0.1}As$/$Al_{0.15}Ga_{0.85}As$ upper semiconductor distributed Bragg reflector 2108. These layers are formed in this order through crystal growth, with the substrate 2101 being at the bottom.

The resonance region 2111 is formed by an $Al_{0.15}Ga_{0.85}As$ resonator spacer region 2106, a GaAs/$Al_{0.15}Ga_{0.85}As$ multi-quantum well structure 2107, and a p-AlAs selectively oxidized layer 2105. The non-doped $Al_{0.9}Ga_{0.1}As$/$Al_{0.15}Ga_{0.85}As$ upper semiconductor distributed Bragg reflector 2108 includes a non-doped AlAs selectively oxidized layer 2104. Here, the p-AlAs selectively oxidized layer 2105 and the non-doped AlAs selectively oxidized layer 2104 have the same thickness (20 nm).

In the device of FIG. 39, after the crystal growth of the layers, two square mesas of different sizes are formed by a known photoengraving technique and a known etching technique. In this example, the size (the length of each side) of the upper mesa is 10 $\mu$m, and the size (the length of each side) of the lower mesa is 18 $\mu$m. As shown in FIG. 39, the upper mesa includes the non-doped AlAs selectively oxidized layer 2104, and the lower mesa includes the p-AlAs selectively oxidized layer 2105.

Selective oxidation is then performed on the non-doped AlAs selectively oxidized layer 2104 and the p-AlAs selectively oxidized layer 2105, to thereby form a selective oxide region 2112 and non-oxidized (conductive) regions 2113$a$ and 2113$b$ that have different areas. As the sizes of the mesas that include the non-doped AlAs selectively oxidized layer 2104 and the p-AlAs selectively oxidized layer 2105 differ from each other, the area of the non-oxide region 2113$a$ of the p-AlAs selectively oxidized layer 2105 included in the lower mesa that is the greater in size becomes larger, after the oxidation of the same lengths in the two selectively oxidized layers 2104 and 2105 at the same oxidation rates.

In each of the selectively oxidized layers 2104 and 2105, the oxidation is performed on the peripheral area of 3.5 $\mu$m in width. As a result, each side of the non-oxide region 2113$a$ is 11 $\mu$m long, and each side of the non-oxide region 2113$b$ is 3 $\mu$m long.

Here, the selective oxidation structure that includes the smaller non-oxide region 2113$b$ serves as an optical mode control structure. Also, the selective oxidation structure that includes the larger non-oxide region 2113$a$ serves as a hole restricting structure.

A $SiO_2$ insulating layer 2114, a p-side electrode 2115, and an n-side electrode 2116 are then formed, to thereby complete the surface-emitting laser diode of FIG. 39.

The surface-emitting laser diode of FIG. 39 does not guide current via the upper semiconductor distributed Bragg reflector, which is a non-doped type. As a p-type distributed Bragg reflector having a high light absorptivity is not employed in the surface-emitting laser diode of FIG. 39, the light loss is very low. Accordingly, the oscillation threshold current is small, and the slope efficiency is high. Furthermore, as the non-oxide region 2113b provided in the non-doped $Al_{0.9}Ga_{0.1}As$/GaAs upper semiconductor distributed Bragg reflector 2108 does not affect the resistance, the device resistance can remain very low.

The surface-emitting laser diode of FIG. 39 can perform high-output operations, being able to have high outputs, while maintaining single fundamental transverse-mode oscillation.

In this example, the selective oxidation structures having different non-oxide regions are formed by a one-time oxidation process, utilizing the differences in thickness and Al composition between the two selectively oxidized layers, and the size difference between the upper and lower mesas. However, it is also possible to oxidize the partial oxidized layers separately, or to perform selective oxidation twice or more on the same selectively oxidized layer. For example, the order of the mesa forming etching process and the oxidation process can be changed, or the etching depth in the mesa formation can be optimally changed. Also, an oxidation protection film or the like may be formed on the side surfaces of the selectively oxidized layers, so that the selectively oxidized layers can be oxidized separately.

Example 23

Figure 40:
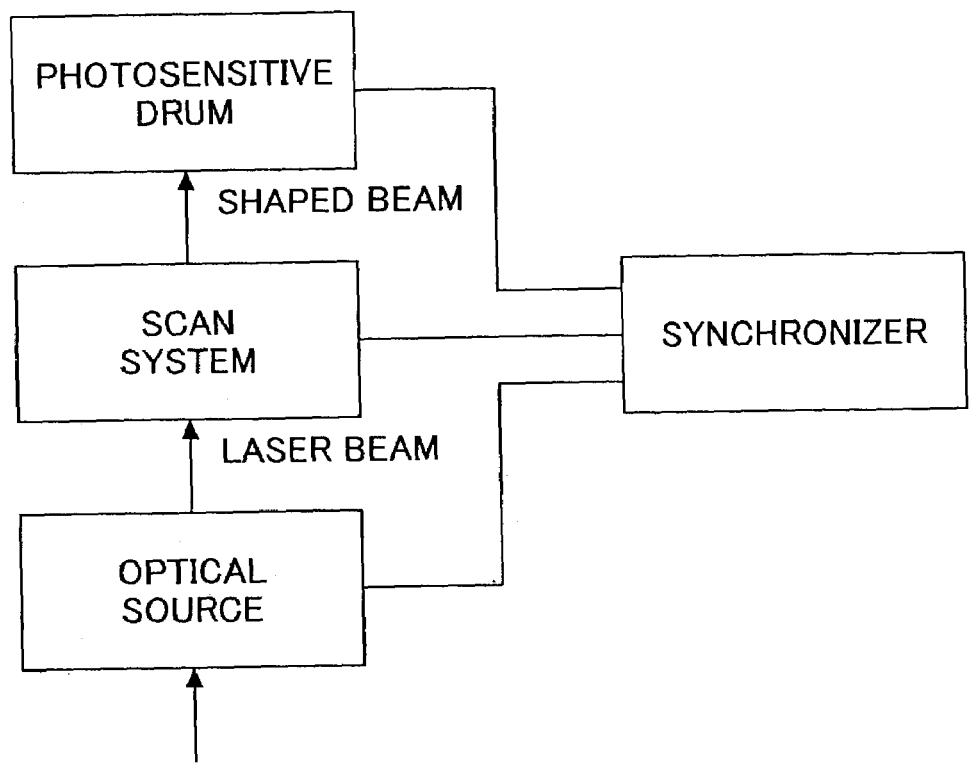
FIG. 40 illustrates the structure of an electrophotographic system of Example 23 of the present invention.

FIG. 40 illustrates an electrophotographic system of Example 23 of the present invention. The electrophotographic system of FIG. 40 includes a photosensitive drum, an optical scan system (a scan converging optical system), a WRITE light source, and a synchronous control circuit (a synchronization controller). In this electrophotographic system, a surface-emitting laser diode or a surface-emitting laser diode array of the present invention is employed as the WRITE light source.

The electrophotographic system of FIG. 40 is controlled by the synchronous control circuit, and beams from the WRITE light source are gathered onto the photosensitive drum by the scan converging optical system that includes a polygon mirror and a lens converging system. A latent image is thus formed on the photosensitive drum. Conventionally, a surface-emitting laser diode often fails to perform a high-output operation, due to adverse influence of heat generation. However, a surface-emitting laser diode of the present invention readily performs high-output operations, and accordingly, can be employed as the WRITE light source of an electrophotographic system. As the oscillation mode is the single fundamental transverse mode in a surface-emitting laser diode of the present invention, a far visual field image is a single-peaked type. As the beam condensing is also easy, a high-definition full-color image can be obtained.

A red surface-emitting laser diode having an AlGaInP material as an active layer material can have an oscillation wavelength of 650 nm, which is shorter than an oscillation wavelength with an AlGaAs material. Therefore, more freedom can be allowed for the designing in the optical system. Accordingly, such a red surface-emitting laser diode is suitable for the WRITE light source of a high-definition full-color electrophotographic system. Such a red surface-emitting laser diode can employ an AlGaInP material as an active layer, and AlGaAs and AlGaInP materials as distributed Bragg reflectors. Since these materials can be grown through crystal growth in a lattice arrangement on a GaAs substrate, an AlAs material or the like can be used as selectively oxidized layers. However, as an AlGaInP material is easily affected by a temperature change, there will be problems, such as output saturation and oscillation stop, due to a temperature rise caused by heat generation of the device. To avoid these problems, the red surface-emitting laser diode of the present invention employs an optical mode control structure that is formed by a selective oxidation structure including a small non-oxide region in the electron passage or in a non-conductive region. With this structure, high-order transverse-mode oscillation can be suppressed, without an increase of the device resistance. Furthermore, it is unnecessary to perform transverse-mode oscillation control with a conventional single oxidation confinement structure provided a p-type Bragg reflector or the like in the hole passage. Accordingly, it is unnecessary to form a very small current restriction structure, so that the device resistance can be made low. A surface-emitting laser diode of the present invention has less heat generation, and can perform high-output operation with higher efficiency, while maintaining single fundamental transverse-mode oscillation. In view of these facts, a surface-emitting laser diode or a surface-emitting laser diode array of the present invention is suitable for the WRITE light source of an electrophotographic system.

Particularly, with the surface-emitting laser diode array of Example 19, a multi-beam write system with a higher write speed can be realized. Thus, a high-speed, high-definition full-color electrophotographic system can be obtained.

Example 24

Figure 41:
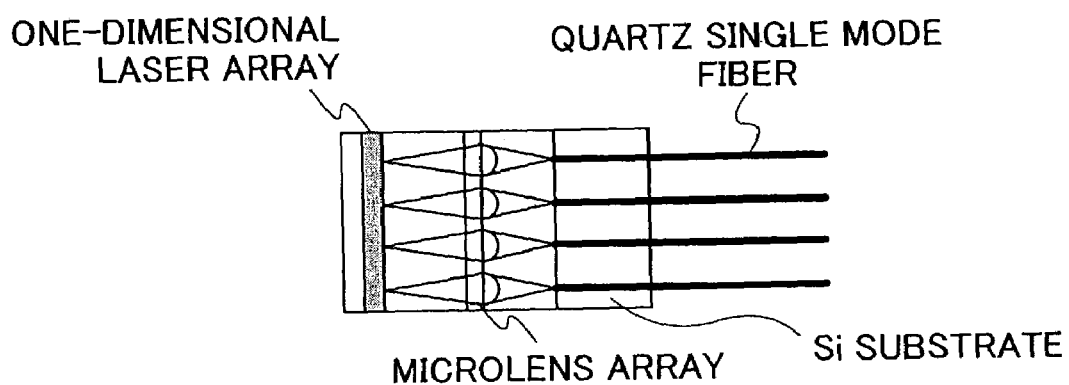
FIG. 41 schematically illustrates a surface-emitting laser diode module of Example 24 of the present invention.

FIG. 41 schematically illustrates a surface-emitting laser diode module of Example 24 of the present invention. The laser diode array module of FIG. 41 includes a one-dimensional monolithic surface-emitting laser diode array, a microlens array, and a fiber array, all of which are mounted on a silicon substrate.

In this module, the surface-emitting laser diode array is located on the opposite side from fibers, and is connected, via the microlens array, to quartz single-mode fibers mounted in V-shaped grooves formed in the silicon substrate. The surface-emitting laser diode array has an oscillation wavelength band of 1.3 μm. With the quartz single-mode fibers, high-speed transmission can be performed.

Since the surface-emitting laser diode module of Example 24 employs a surface-emitting laser diode array of the present invention, stable fundamental transverse-mode oscillation can be maintained even when there is a change in the drive conditions such as the surrounding temperature. Also, the connecting rate with the fibers rarely changes. Thus, a highly reliable laser diode module can be obtained.

Example 25

Figure 42:
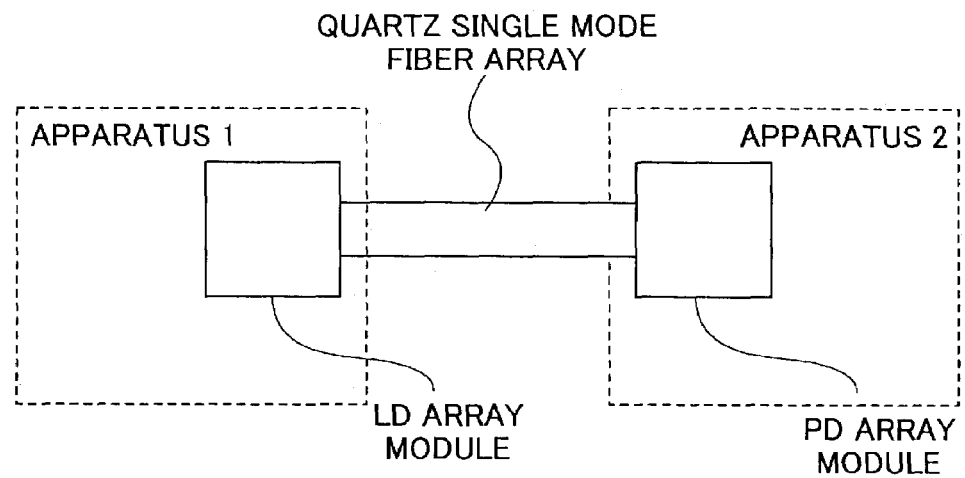
FIG. 42 illustrates the structure of an optical interconnection system of Example 25 of the present invention.

FIG. 42 illustrates an optical interconnection system of Example 25 of the present invention. The interconnection system of FIG. 42 has an apparatus 1 and an apparatus 2 that are connected to each other with an optical fiber array. The apparatus 1, which is a transmission apparatus, includes a one-dimensional laser diode array module formed by surface-emitting laser diodes or a surface-emitting laser diode array of the present invention, and a drive circuit for the module. The apparatus 2, which is a reception apparatus, includes a photodiode array module and a signal detecting circuit.

As the optical interconnection system of Example 25 employs a surface-emitting laser diode array of the present invention, stable fundamental transverse-mode oscillation can be maintained even when there is a change in the drive conditions such as the surrounding temperature. Also, the connecting rate with the fibers rarely changes. Thus, a highly reliable interconnection system can be obtained.

Although a parallel interconnection system has been described as Example 25, it is also possible to obtain a serial transmission system that includes a single device. Furthermore, an interconnection structure of the present invention can be formed between boards, chips, or inside a chip.

Example 26

Figure 43:
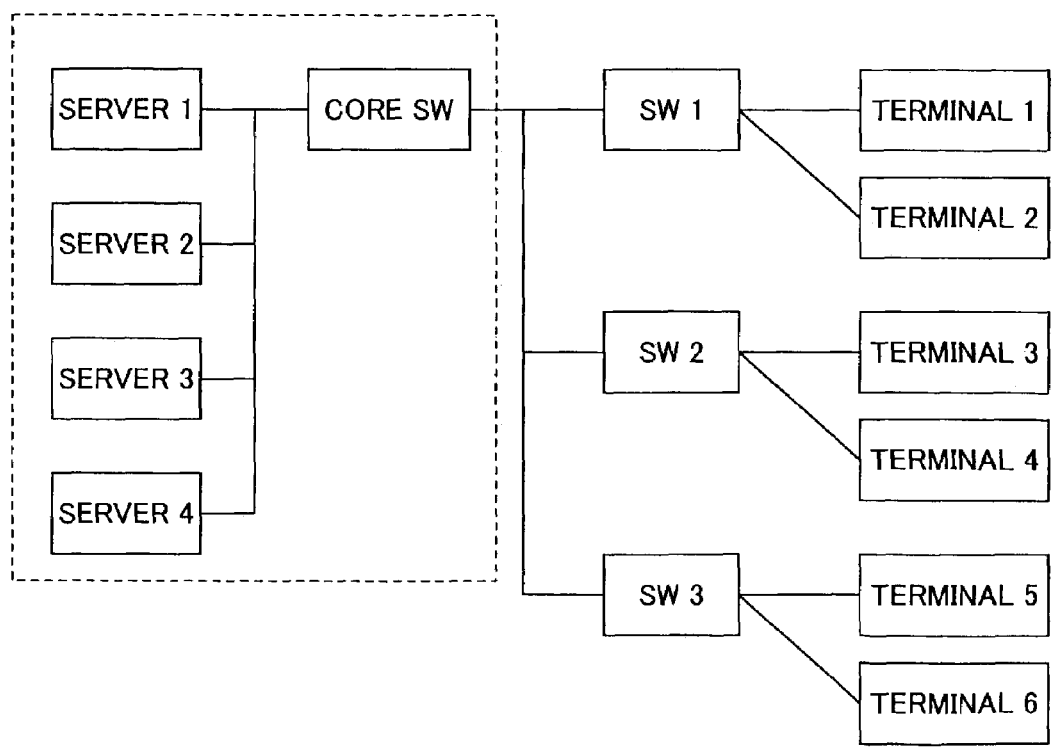
FIG. 43 illustrates the structure of an optical communication system of Example 26 of the present invention.

FIG. 43 illustrates an optical communication system of Example 26 of the present invention. The optical communication system of FIG. 43 is an optical LAN system that includes surface-emitting laser diodes or surface-emitting laser diode array devices of the present invention. More specifically, surface-emitting laser diodes or surface-emitting laser diode arrays of the present invention are employed as light sources for optical transmission between servers and a core switch, between the core switch and switches, and between the switches and terminals.

In this optical communication system, apparatuses are connected with quartz single-mode fibers or multi-mode fibers. As the physical layer of such an optical LAN, Gigabit Ethernet such as 1000BASE-LX can be employed. As the optical LAN system of FIG. 43 includes surface-emitting laser diodes of the present invention as light sources, stable fundamental transverse-mode oscillation can be maintained even when there is a change in the drive conditions such as the surrounding temperature. Also, the connecting rate with the fibers rarely changes. Thus, a highly reliable interconnection system can be obtained.

Example 27

Figure 44:
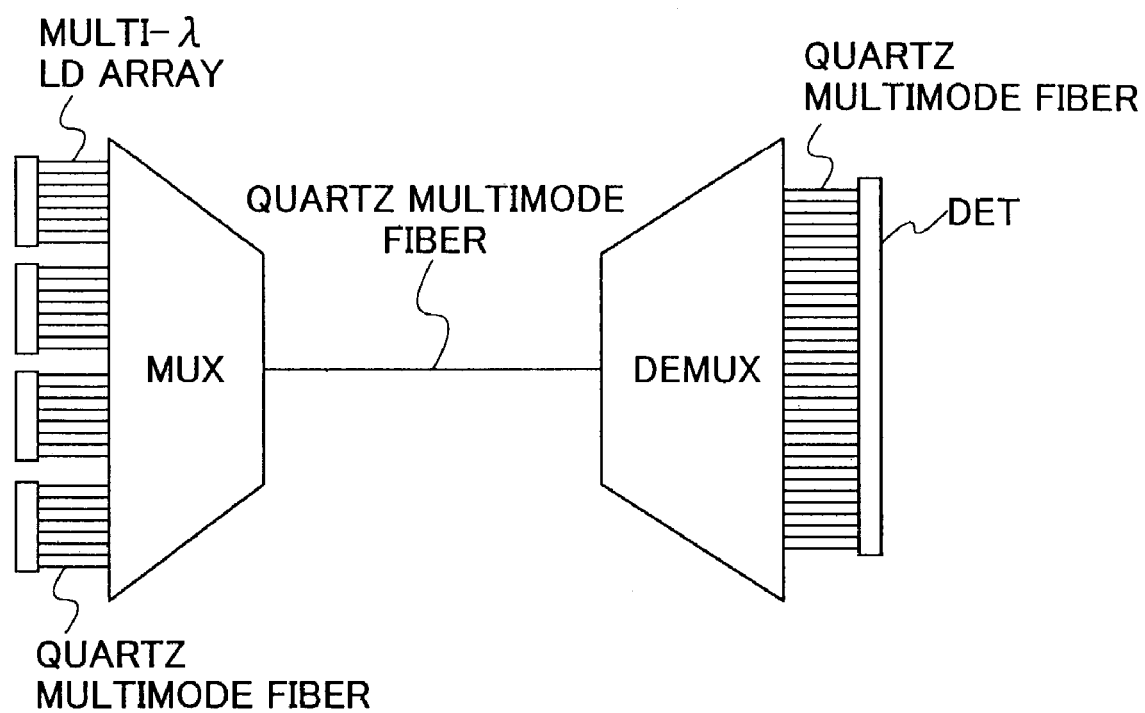
FIG. 44 illustrates the structure of a wavelength division multiplexing (WDM) communication system of Example 27 of the present invention.

FIG. 44 illustrates a wavelength division multiplexing (WDM) communication system of Example 27 of the present invention.

The WDM communication system of FIG. 44 includes light sources formed by multi-wave surface-emitting laser diode arrays of the present invention, a WDM combiner, quartz multi-mode fibers, a WDM divider, and light receivers.

In this system, arrayed waveguide gratings (AWG) may be employed as the divider and the combiner. Also, surface-emitting laser diode arrays each having a GaInNAsSb material as an active layer and having an oscillation wavelength band of 1.55 $\mu$m, which is the same as the surface-emitting laser diode array of Example 20, can be employed as the multi-wave surface-emitting laser diode arrays. Here, the wavelength intervals among the surface-emitting laser diodes in each surface-emitting laser diode array are 1 nm. In the WDM communication system of FIG. 44, four surface-emitting laser diode arrays each including eight devices and having different center wavelengths are employed to thereby form a 32-channel system. Signals transmitted from the surface-emitting laser diodes of each surface-emitting laser diode array are combined by the combiner, and are transmitted through one multi-mode fiber. Based on the wavelengths, the divider distributes the transmitted signals to the light receivers, which convert the transmitted signals to electric signals.

The multi-wave surface-emitting laser diode arrays that serve as the light sources in this optical communication system of Example 27 can have high outputs, while maintaining fundamental single transverse-mode oscillation, because each surface-emitting laser diode in the arrays has a very low resistance. Accordingly, high-speed modulation can be performed, and the characteristics of the surface-emitting laser diodes, such as the oscillation threshold current, are almost uniform in each array. With this structure, it is not necessary to employ a complicated drive circuit for driving each array. Thus, a highly reliable WDM communication system can be obtained at low costs.

Although the WDM communication system of 1.55 $\mu$m band has been described as Example 27, other wavelength bands such as a 1.3 $\mu$m band can be used. Depending on the wavelength band, the materials and compositions of the devices that form the multi-wave surface-emitting laser diode arrays can be optimally selected. It is also possible to change the number of channels and the wavelength intervals, if necessary. Instead of the quartz multi-mode fibers, quartz single-mode fibers or POFs (Plastic Optical Fibers) can be employed as optical fibers, so that optimum fibers can be selected for the wavelength band that is being used.

It should be noted that the present invention is not limited to the embodiments specifically disclosed above, but other variations and modifications may be made without departing from the scope of the present invention.

What is claimed is:

1. A surface-emitting laser diode device that oscillates in the direction perpendicular to a substrate, comprising:
    an active layer;
    a resonator structure including a first distributed Bragg reflector and a second distributed Bragg reflector that face each other and sandwich the active layer;
    a hole passage that extends from a first electrode to the active layer;
    an electron passage that extends from a second electrode to the active layer;
    a hole confinign structure that is provided in the hole passage and defines a region for confining holes to the active layer; and
    an optical mode control structure that includes a non-oxide region provided in the resonator structure and an oxide region surrounding the non-oxide region, each region containing Al as a constituent element,
    the area of the non-oxide region being smaller than the area of the hole restricting structure.

2. The surface-emitting laser diode device as claimed in claim 1, wherein the hole restricting structure includes a non-oxide region and an oxide region surrounding the non-oxide region, both regions being formed out of a semiconductor layer containing Al as a constituent element.

3. The surface-emitting laser diode device as claimed in claim 2, wherein the hole restricting structure and the optical mode control structure each includes an oxide region and a non-oxide region that are formed through selective oxidation performed on a part of a semiconductor layer, each region containing Al as a constituent element.

4. The surface-emitting laser diode device as claimed in claim 1, wherein the optical mode control structure is provided in the electron passage.

5. The surface-emitting laser diode device as claimed in claim 1, wherein the optical mode control structure is provided in a region that does not meet the electron passage and the hole passage.

6. The surface-emitting laser diode device as claimed in claim 5, wherein the part of the hole restricting structure that defines the region for confining holes is formed by a p-type semiconductor layer.

7. The surface-emitting laser diode device as claimed in claim 1, wherein:
the part of the hole restricting structure that defines the region for confining holes is formed by a p-type semiconductor layer; and
the non-oxide region in the optical mode control structure is formed by a n-type semiconductor layer.

8. The surface-emitting laser diode device as claimed in claim 1, wherein the first distributed Bragg reflector and the second distributed Bragg reflector are formed by laminated structures of semiconductor layers.

9. The surface-emitting laser diode device as claimed in claim 1, wherein one of the first distributed Bragg reflector and the second distributed Bragg reflector is formed by a laminated structure of semiconductor layers, while the other one is formed by a laminated structure of semiconductor or dielectric layers.

10. The surface-emitting laser diode device as claimed in claim 1, wherein:
at least one of the first distributed Bragg reflector and the second distributed Bragg reflector is a semiconductor Bragg reflector having a laminated structure of n-type semiconductor layers, and
a tunnel junction is interposed between the n-type semiconductor Bragg reflector and the active layer.

11. The surface-emitting laser diode device as claimed in claim 1, wherein:
at least one of the first distributed Bragg reflector and the second distributed Bragg reflector includes a laminated structure of non-doped semiconductor layers; and
one of the first electrode and the second electrode is provided on a semiconductor layer interposed between the active layer and the distributed Bragg reflector that includes the laminated structure of the non-doped semiconductor layer.

12. The surface-emitting laser diode device as claimed in claim 1, wherein the hole restricting structure is provided at a location corresponding to an antinode of the standing wave of oscillating light in the resonator structure.

13. The surface-emitting laser diode device as claimed in claim 1, wherein a plurality of optical mode control structures each having the same structure as the optical mode control structure are provided in the electron passage.

14. The surface-emitting laser diode device as claimed in claim 1, wherein a plurality of optical mode control structures each having the same structure as the optical mode control structure are provided in a region that does not meet the electron passage and the hole passage.

15. The surface-emitting laser diode device as claimed in claim 3, wherein the semiconductor layer that forms the optical mode control structure through selective oxidation and contains Al as a constituent element is thicker than the semiconductor layer that forms the hole restricting structure through selective oxidation and contains Al as a constituent element.

16. The surface-emitting laser diode device as claimed in claim 3, wherein the Al content of the semiconductor layer that forms the optical mode control structure through selective oxidation and contains Al as a constituent element is greater than the Al content of the semiconductor layer that forms the hole restricting structure through selective oxidation and contains Al as a constituent element.

17. The surface-emitting laser diode device as claimed in claim 1, wherein the active layer is formed by a III–V semiconductor material that includes at least one III-group element selected from the group of Al, Ga, and In, and at least one V-group element selected from the group of As and P,
the active layer having an oscillation wavelength shorter than 1.1 $\mu$m.

18. The surface-emitting laser diode device as claimed in claim 1, wherein the active layer is formed by a III–V semiconductor material that includes at least one III-group element selected from the group of Ga and In, and at least one V-group element selected from the group of As, P, N, and Sb,
the active layer having an oscillation wavelength longer than 1.1 $\mu$m.

\* \* \* \* \*